(12) United States Patent
Shimamoto et al.

(10) Patent No.: US 9,349,586 B2
(45) Date of Patent: May 24, 2016

(54) METHOD OF MANUFACTURING SEMICONDUCTOR DEVICE, SUBSTRATE PROCESSING APPARATUS, SUBSTRATE PROCESSING SYSTEM AND NON-TRANSITORY COMPUTER-READABLE RECORDING MEDIUM

(71) Applicant: Hitachi Kokusai Electric Inc., Tokyo (JP)

(72) Inventors: Satoshi Shimamoto, Toyama (JP); Takaaki Noda, Toyama (JP); Takeo Hanashima, Toyama (JP); Yoshiro Hirose, Toyama (JP); Hiroshi Ashihara, Toyama (JP); Tsukasa Kamakura, Toyama (JP); Shingo Nohara, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 80 days.

(21) Appl. No.: 14/219,345

(22) Filed: Mar. 19, 2014

(65) Prior Publication Data

US 2014/0287595 A1    Sep. 25, 2014

(30) Foreign Application Priority Data

Mar. 19, 2013   (JP) .................. 2013-057173
Feb. 5, 2014    (JP) .................. 2014-020046
Feb. 13, 2014   (JP) .................. 2014-025790

(51) Int. Cl.
*H01L 21/02*       (2006.01)
*C23C 16/30*       (2006.01)
(Continued)

(52) U.S. Cl.
CPC .......... *H01L 21/02126* (2013.01); *C23C 16/30* (2013.01); *C23C 16/45527* (2013.01);
(Continued)

(58) Field of Classification Search
CPC .................. H01L 21/02126; H01L 2224/03; H01L 2224/11
See application file for complete search history.

(56) References Cited

U.S. PATENT DOCUMENTS 8,329,599 B2    12/2012   Fukazawa et al.
2004/0018694 A1  1/2004   Lee et al.
(Continued)

FOREIGN PATENT DOCUMENTS

JP    2004-40110 A      2/2004
JP    2007-158066 A     6/2007
(Continued)

OTHER PUBLICATIONS

Office Action in corresponding Japanese Patent Application No. 2014-025790, issued on Sep. 30, 2015, with English translation.

*Primary Examiner* — Bac Au
(74) *Attorney, Agent, or Firm* — Edell, Shapiro & Finnan LLC

(57) ABSTRACT

A thin film having excellent etching resistance and a low dielectric constant is described. A method of manufacturing a semiconductor device includes forming a thin film on a substrate, removing first impurities containing $H_2O$ and Cl from the thin film by heating the thin film at a first temperature higher than a temperature of the substrate in the forming of the thin film, and removing second impurities containing a hydrocarbon compound ($C_xH_y$-based impurities) from the thin film in which heat treatment is performed at the first temperature by heating the thin film at a second temperature equal to or higher than the first temperature.

18 Claims, 36 Drawing Sheets

(51) Int. Cl.
*C23C 16/455* (2006.01)
*C23C 16/56* (2006.01)
*H01L 21/67* (2006.01)

(52) U.S. Cl.
CPC .............. C23C16/56 (2013.01); H01L 21/022 (2013.01); H01L 21/0228 (2013.01); H01L 21/02164 (2013.01); H01L 21/02211 (2013.01); H01L 21/02219 (2013.01); H01L 21/02274 (2013.01); H01L 21/02318 (2013.01); H01L 21/67109 (2013.01)

(56) References Cited

U.S. PATENT DOCUMENTS

| | | | |
|---|---|---|---|
| 2006/0199384 A1* | 9/2006 | Ando | C23C 16/401 438/680 |
| 2009/0130829 A1* | 5/2009 | Noda | C23C 16/0227 438/503 |
| 2011/0156026 A1* | 6/2011 | Yamazaki | H01L 21/02422 257/43 |
| 2013/0082253 A1* | 4/2013 | Yamazaki | H01L 29/41733 257/43 |
| 2013/0140553 A1* | 6/2013 | Yamazaki | H01L 29/78693 257/43 |
| 2013/0252434 A1* | 9/2013 | Yuasa | H01L 21/02104 438/758 |

FOREIGN PATENT DOCUMENTS

| | | |
|---|---|---|
| JP | 200871894 A | 3/2008 |
| JP | P4494041 B2 | 4/2010 |
| JP | 2011108737 A | 6/2011 |
| WO | 2015045163 A1 | 4/2015 |

\* cited by examiner

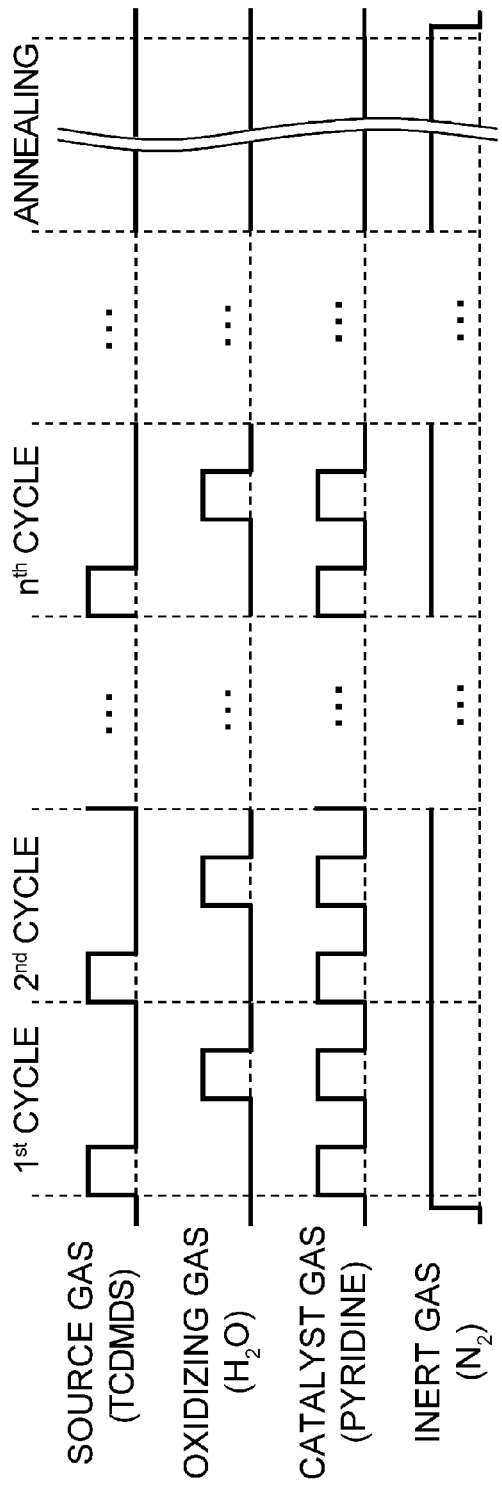

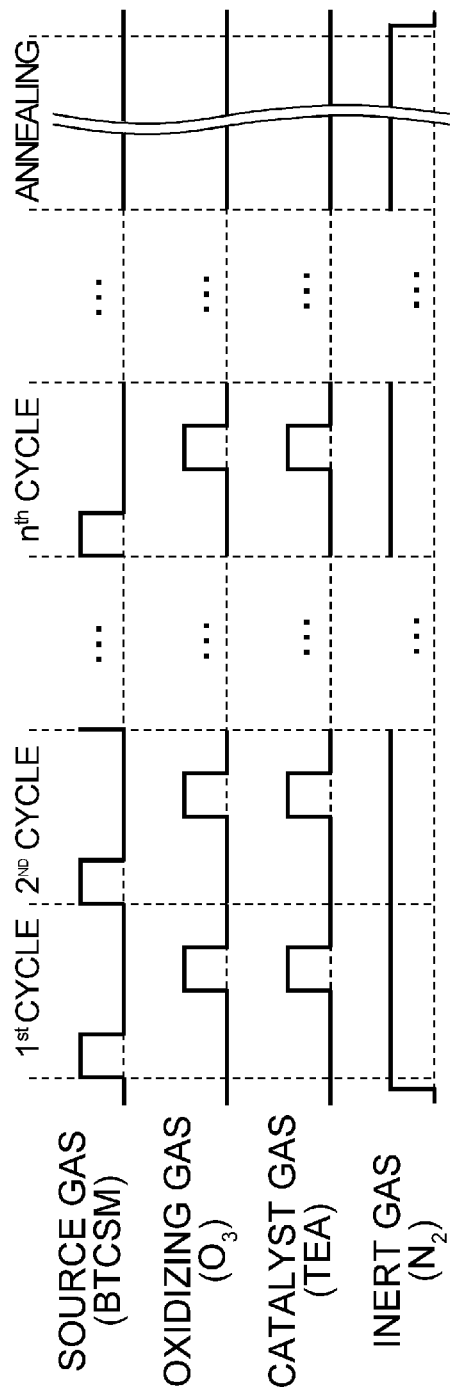

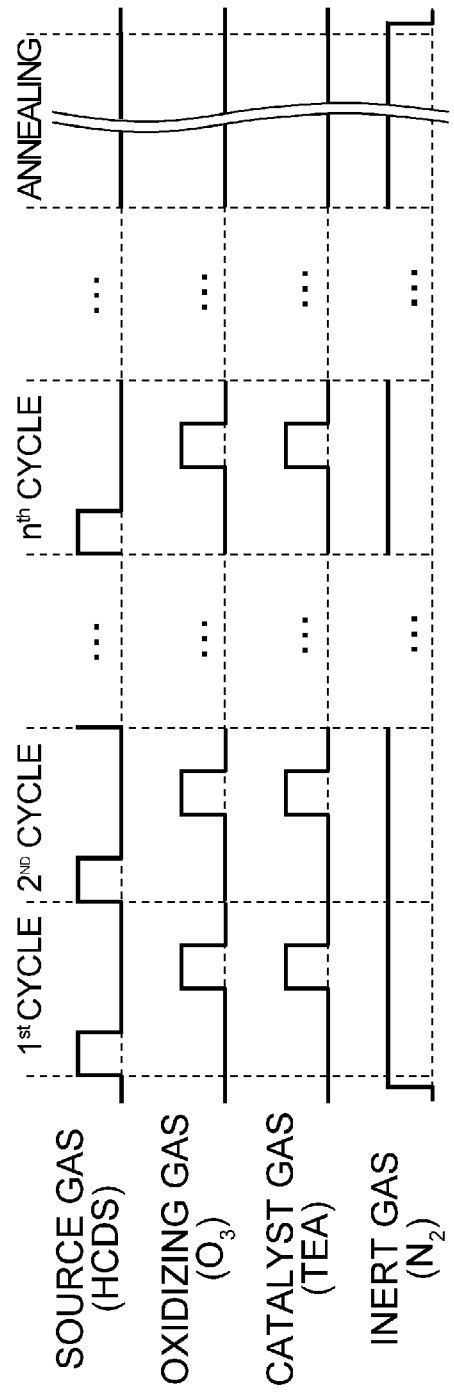

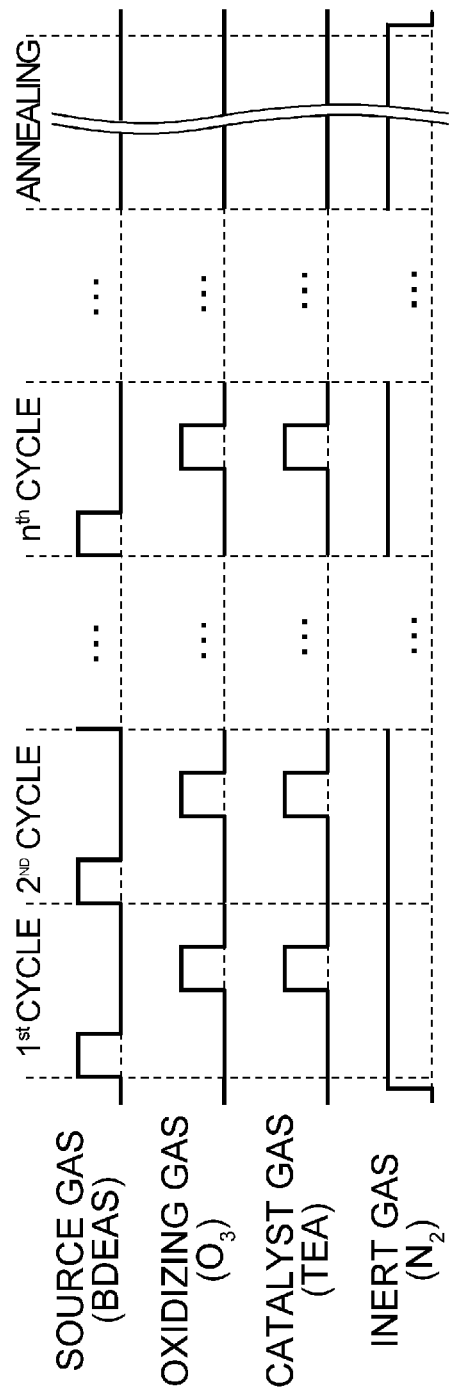

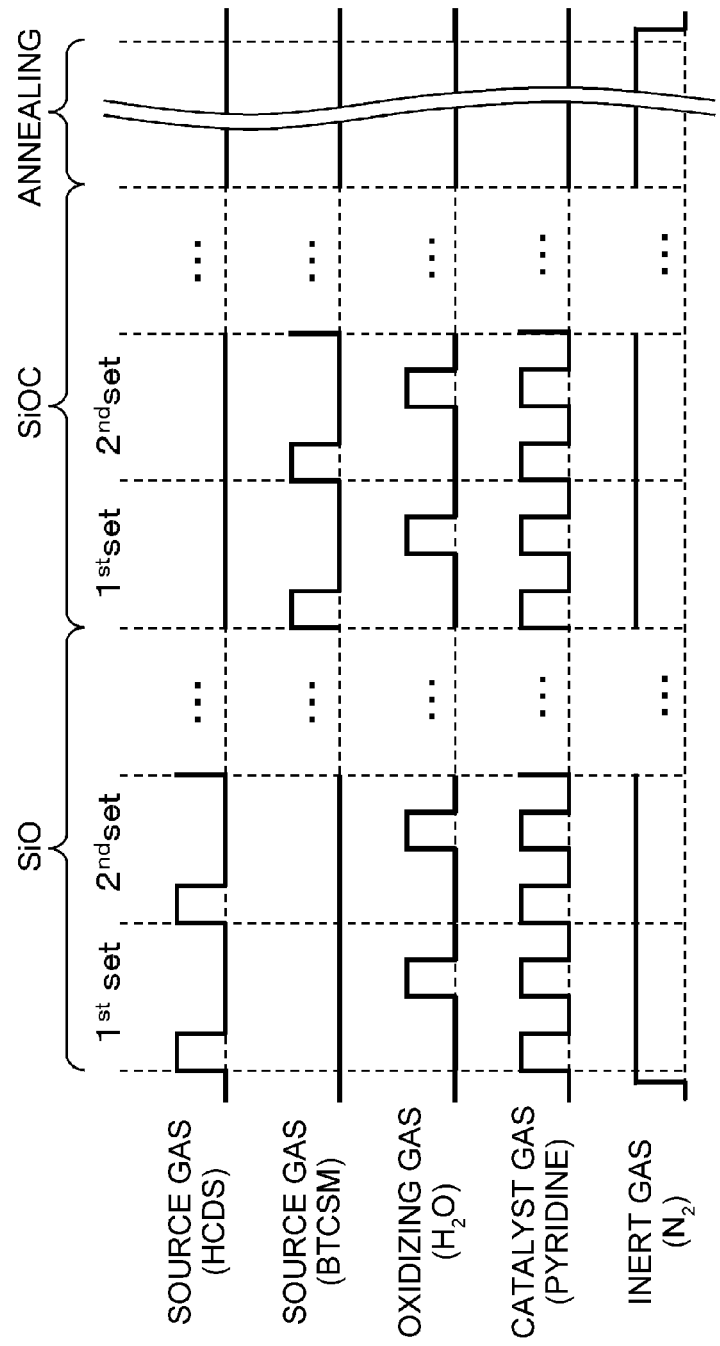

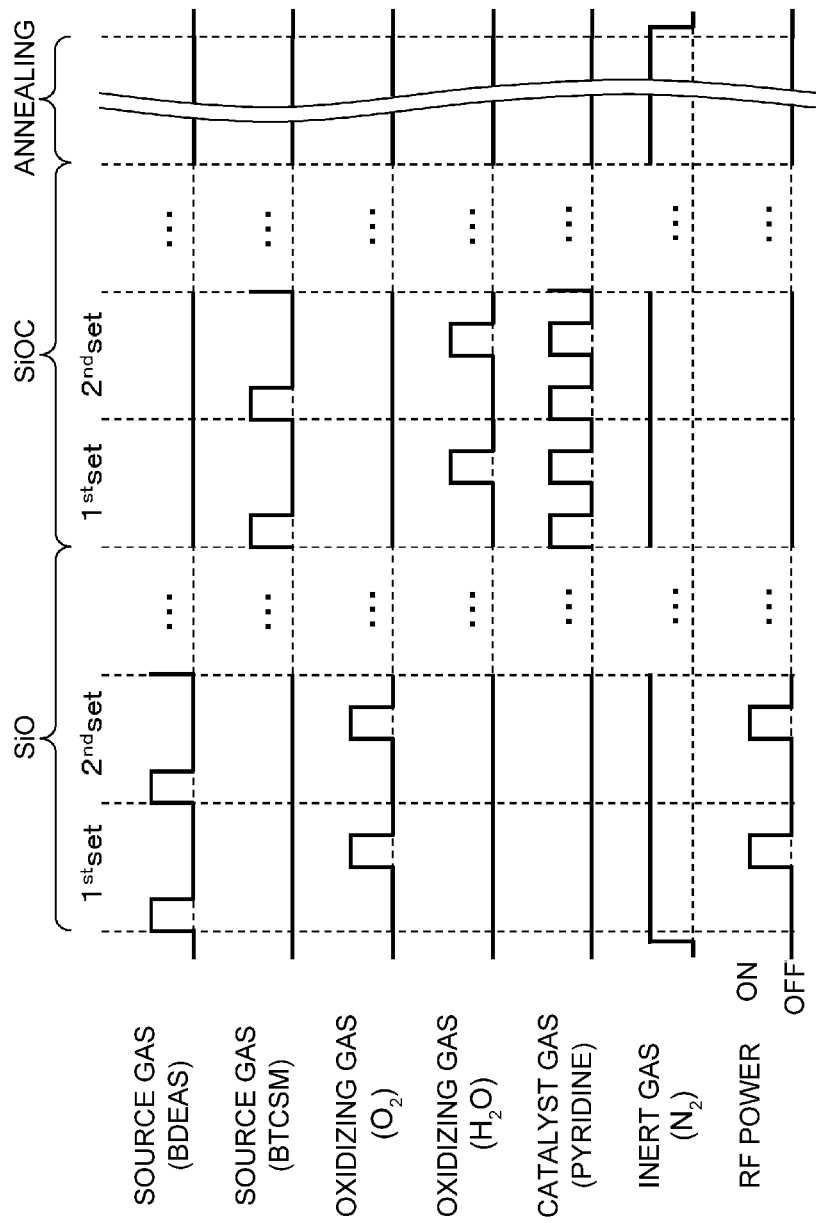

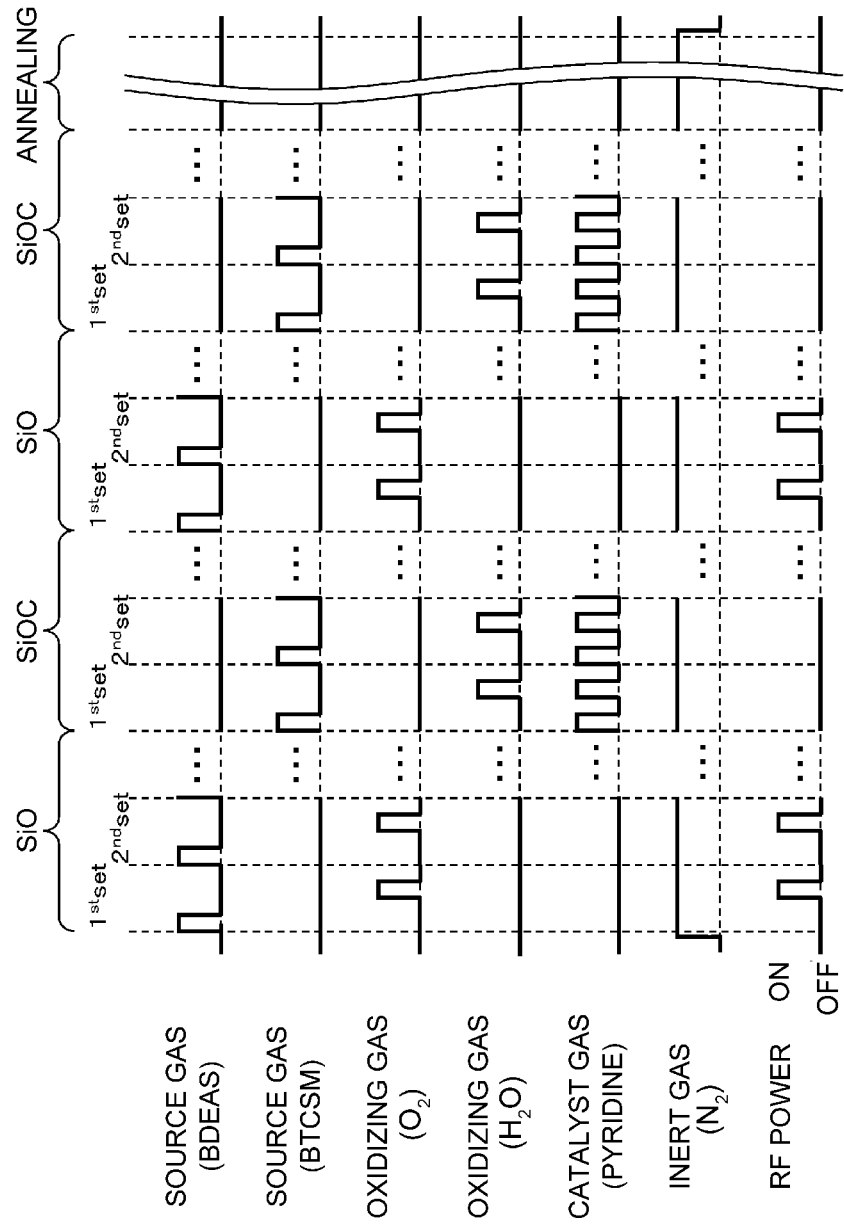

FIG. 10A
| NAME | PYRIDINE | AMINO PYRIDINE | PICOLINE | LUTIDINE | PIPERAZINE | PIPERIDINE |
|---|---|---|---|---|---|---|
| COMPOSITIONAL FORMULA | $C_5H_5N$ | $C_5H_6N_2$ | $C_6H_7N$ | $C_7H_9N$ | $C_4H_{10}N_2$ | $C_5H_{11}N$ |
| STRUCTURAL FORMULA |  | 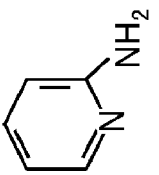 | 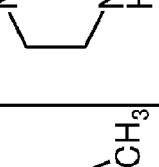 | 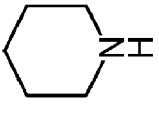 | 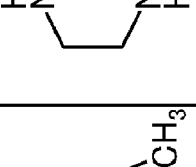 | 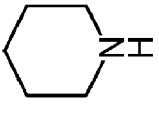 |
| ACID DISSOCIATION CONSTANT (pKa) | 5.67 | 6.89 | 6.07 | 6.96 | 9.80 | 11.12 |

TRIETHYLAMINE (TEA)
ACID DISSOCIATION CONSTANT (pKa) 10.7

DIETHYLAMINE (DEA)
ACID DISSOCIATION CONSTANT (pKa) 10.9

MONOETHYLAMINE (MEA)
ACID DISSOCIATION CONSTANT (pKa) 10.6

TRIMETHYLAMINE (TMA)
ACID DISSOCIATION CONSTANT (pKa) 9.8

MONOMETHYLAMINE (MMA)
ACID DISSOCIATION CONSTANT (pKa) 10.6

FIG. 13

|  | SAMPLE 1 | SAMPLE 2 |
|---|---|---|
| WER[A/min] @1%/DHF | 0.56 | 9.69 |
| SHRINK RATE [%] | 15.2 | 16.8 |
| K VALUE | 2.68 | 3.58 |

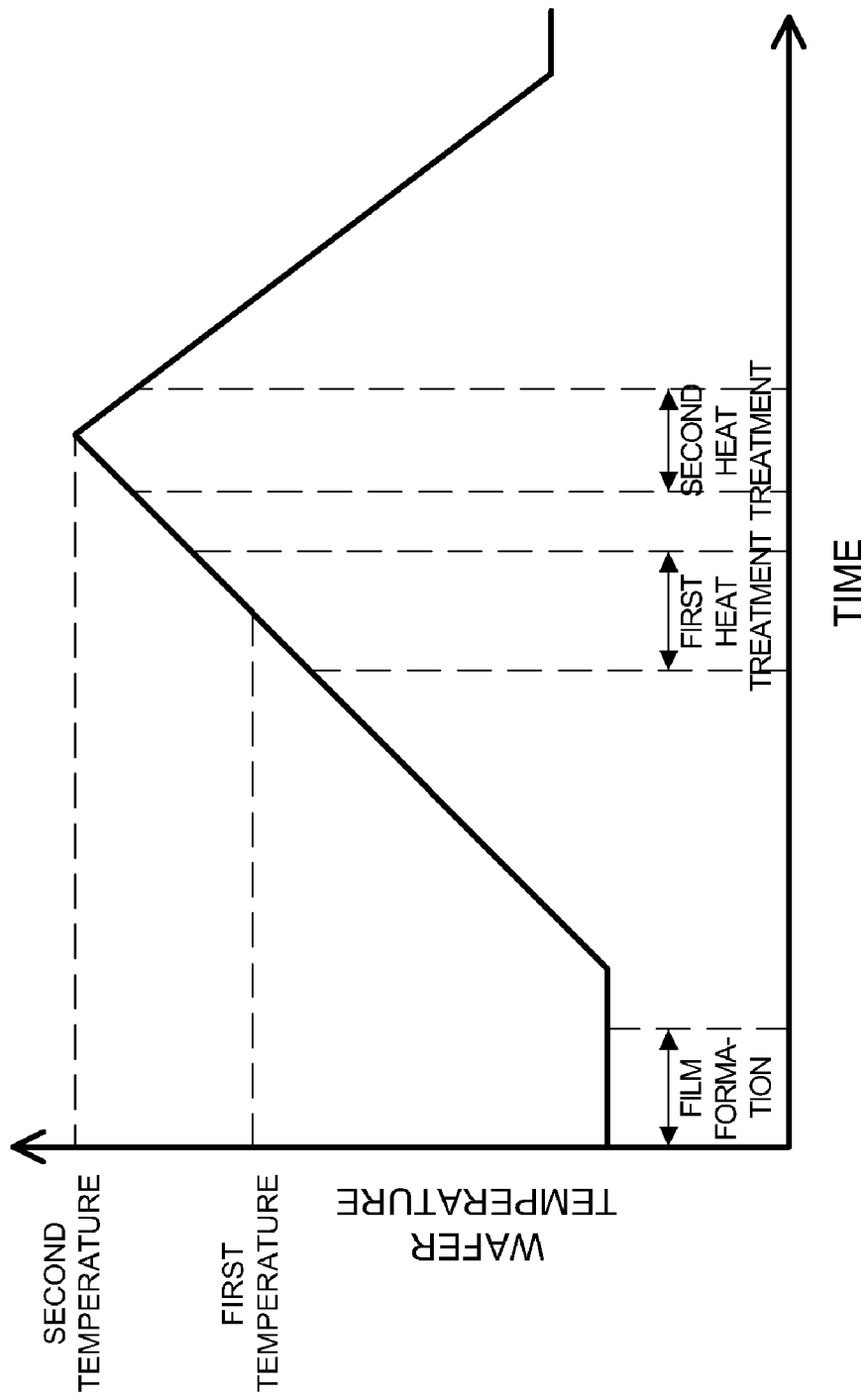

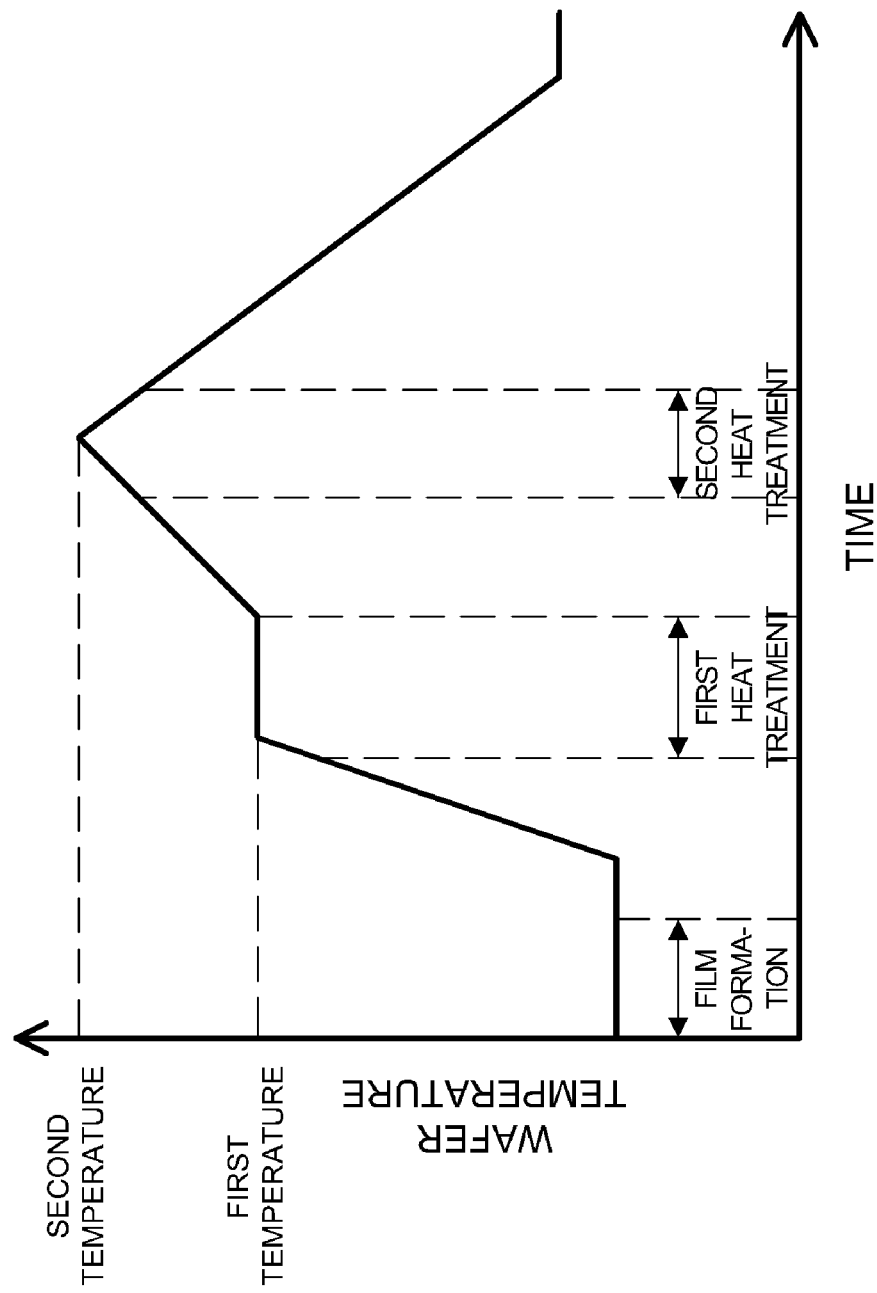

FIG. 16B

| SAMPLE | SAPLE 1 | SAPLE 2 | SAPLE 3 | SAPLE 4 | SAPLE 5 | SAPLE 6 |
|---|---|---|---|---|---|---|
| MAINTAIN FIRST TEMPERATURE | - | 60°C 2min | 300°C 7.5min | | 450°C 7.5min | |
| RAISE TEMPERATURE | 100°C 25min | 200°C 15min | 300°C 0.5min | 500°C 10min | 600°C 10min | 630°C 10min |
| MAINTAIN SECOND TEMPERATURE | - | 200°C 30min | 300°C 30min | 500°C 30min | 600°C 30min | 630°C 30min |
| DROP TEMPERATURE | - | 180°C 30min | 300°C 20min | 450°C 20min | | 450°C 24min |
| UNLOAD | 100°C 7min | 180°C 10min | 300°C 7.5min | | 450°C 7.5min | |
| TOTAL TIME | 32min | 87min | 65.5min | 75min | 75min | 79min |

… # METHOD OF MANUFACTURING SEMICONDUCTOR DEVICE, SUBSTRATE PROCESSING APPARATUS, SUBSTRATE PROCESSING SYSTEM AND NON-TRANSITORY COMPUTER-READABLE RECORDING MEDIUM

CROSS REFERENCE TO RELATED APPLICATIONS

This application claims foreign priority under 35 U.S.C. §119(a)-(d) to Application Nos. JP 2013-057173 filed on Mar. 19, 2013; JP2014-020046 filed on Feb. 5, 2014; and JP2014-025790 filed on Feb. 13, 2014, entitled "Method of Manufacturing Semiconductor Device, Substrate Processing Apparatus, Substrate Processing System and Non-Transitory Computer-Readable Recording Medium," the entire contents of each of which are hereby incorporated by reference.

FIELD OF THE INVENTION

The present invention relates to a method of manufacturing a semiconductor device, a substrate processing apparatus, a substrate processing system, and a non-transitory computer-readable recording medium.

BACKGROUND

There are cases in which a process of forming a thin film such as a silicon oxide film on a substrate by supplying a source gas containing a predetermined element such as silicon, an oxidizing gas, or the like to the substrate is performed as a process of manufacturing a semiconductor device. In such instances, film forming can be achieved at a relatively low temperature using, for example, a catalyst gas, thereby improving a heat history and the like received by the semiconductor device.

SUMMARY

When forming a thin film on a substrate, there is a case in which resistance against wet etching is improved by allowing, for example, carbon to be contained in the thin film, and film quality is improved by reducing a dielectric constant of the film.

However, there is a case in which a sufficient amount of carbon is difficult to be contained in the film or impurities such as water are mixed in the film under a relatively low temperature. Thus, there arises a problem that the thin film of a low dielectric constant having sufficient etching resistance cannot be formed.

It is an object of the present invention to provide technologies which form a thin film of a low dielectric constant having excellent etching resistance.

According to one aspect of the present invention, there is provided a method of manufacturing a semiconductor device, including: (a) forming a thin film on a substrate; (b) removing first impurities containing $H_2O$ and Cl from the thin film by heating the thin film at a first temperature higher than a temperature of the substrate in the step (a); and (c) removing second impurities containing a hydrocarbon compound from the thin film by heating the thin film at a second temperature equal to or higher than the first temperature after performing the step (b).

According to another aspect of the present invention, there is provided a substrate processing apparatus including: a processing chamber configured to accommodate a substrate; a processing gas supply system configured to supply a processing gas into the processing chamber to form a thin film on the substrate; a heater configured to heat the substrate in the processing chamber; and a control unit configured to control the processing gas supply system and the heater to perform (a) forming the thin film on the substrate by supplying the processing gas to the substrate in the processing chamber, (b) removing first impurities containing $H_2O$ and Cl from the thin film by heating the thin film at a first temperature higher than a temperature of the substrate in the step (a), and (c) removing second impurities containing a hydrocarbon compound from the thin film by heating the thin film at a second temperature equal to or higher than the first temperature after performing the step (b).

According to still another aspect of the present invention, there is provided a substrate processing system including: a first substrate processing unit configured to form a thin film on a substrate; and a second substrate processing unit configured to perform heat treatment on the thin film, wherein the first substrate processing unit includes: a first processing chamber configured to accommodate a substrate; a processing gas supply system configured to supply a processing gas into the first processing chamber; and a first control unit configured to control the processing gas supply system to form the thin film on the substrate by supplying the processing gas to the substrate in the first processing chamber; and wherein the second substrate processing unit includes: a second processing chamber configured to accommodate the substrate; a heater configured to heat the substrate in the second processing chamber; and a second control unit configured to control the heater to perform (a) removing first impurities containing $H_2O$ and Cl from the thin film by heating the thin film at a first temperature higher than a temperature of the substrate in a process of forming the thin film in a state in which the second processing chamber accommodates the substrate on which the thin film is formed, and (b) removing second impurities containing a hydrocarbon compound from the thin film by heating the thin film at a second temperature equal to or higher than the first temperature after performing the step (a).

According to yet another aspect of the present invention, there is provided a non-transitory computer-readable recording medium storing a program that causes a computer to execute: (a) forming a thin film on a substrate in a processing chamber; (b) removing first impurities containing $H_2O$ and Cl from the thin film by heating the thin film at a first temperature higher than a temperature of the substrate in the sequence (a); and (c) removing second impurities containing a hydrocarbon compound from the thin film by heating the thin film at a second temperature equal to or higher than the first temperature after performing the sequence (b).

BRIEF DESCRIPTION OF THE DRAWINGS

FIGS. 4A and 4B are diagrams illustrating gas supply timing in film forming sequences according to a first embodiment of the present invention and a modification example thereof, wherein FIG. 4A is a diagram illustrating a sequence example according to the first embodiment and FIG. 4B is a diagram illustrating a sequence example according to the modification example.

FIGS. 5A and 5B are diagrams illustrating catalysis of a thin film forming process according to a first embodiment of the present invention, wherein FIG. 5A is a diagram illustrating catalysis in Step 1a and FIG. 5B is a diagram illustrating catalysis in Step 2a.

FIGS. 6A through 6C are diagrams illustrating gas supply timing in film forming sequences according to a second embodiment of the present invention and modification examples thereof, wherein FIG. 6A is a diagram illustrating a sequence example according to the second embodiment of the present invention, FIG. 6B is a diagram illustrating a sequence example according to Modification Example 1, and FIG. 6C is a diagram illustrating a sequence example according to Modification Example 2.

FIGS. 7A and 7B are diagrams illustrating gas supply timing in film forming sequences according to a third embodiment of the present invention, wherein FIG. 7A is a diagram illustrating a sequence example of forming a stacked film and 7b shows a sequence example of forming a laminated film.

FIGS. 8A and 8B are diagrams illustrating timing for gas supply and RF power supply in film forming sequences according to modification examples of a third embodiment of the present invention, wherein FIG. 8A is a diagram illustrating a sequence example of forming a stacked film and FIG. 8B is a diagram illustrating a sequence example of forming a laminated film.

FIGS. 10A through 10F are diagrams illustrating names, chemical compositional formulas, chemical structural formulas, and acid dissociation constants of various kinds of amines used as a catalyst gas, and illustrate names, chemical compositional formulas, chemical structural formulas, and acid dissociation constants of each of annular amine, TEA, DEA, MEA, TMA, and MMA.

FIGS. 11A through 11C are graphs according to embodiments of the present invention, wherein FIG. 11A is a diagram illustrating a relative dielectric constant of a SiOC film before and after heat treatment, FIG. 11B is a diagram illustrating a wet etching rate of a SiOC film before and after heat treatment, and FIG. 11C is a diagram illustrating temperature dependence of heat treatment of the wet etching rate of the SiOC film.

FIGS. 12A through 12C are graphs illustrating a desorption spectrum by TDS of a SiOC film formed before heat treatment by film forming sequences according to a first embodiment of the present invention, wherein FIG. 12A is a graph illustrating a desorption spectrum of $H_2O$, FIG. 12B is a graph illustrating a desorption spectrum of Cl, and FIG. 12C is a graph illustrating a desorption spectrum of $C_2H_2$.

FIG. 13 is a diagram illustrating an evaluation result according to an embodiment of the present invention and a table illustrating various comparisons between a SiOC film of Sample 1 and a SiOC film of Sample 2.

FIGS. 14A through 14D are diagrams illustrating a temperature control sequence of a heat treatment process when a second temperature is higher than a first temperature, and FIGS. 14B to 14D are diagrams illustrating modification examples of themselves.

FIGS. 16A and 16B are diagrams illustrating an evaluation result according to an embodiment of the present invention, wherein FIG. 16A is a graph illustrating a wet etching rate of a SiOC film of Samples 1 to 6 and FIG. 16B is a table illustrating comparison between heat treatment conditions of the respective Samples.

DETAILED DESCRIPTION

First Embodiment

Hereinafter, a first embodiment of the present invention will be described with reference to the accompanying drawings.

(1) Entire Configuration of Substrate Processing Apparatus

Figure 1:
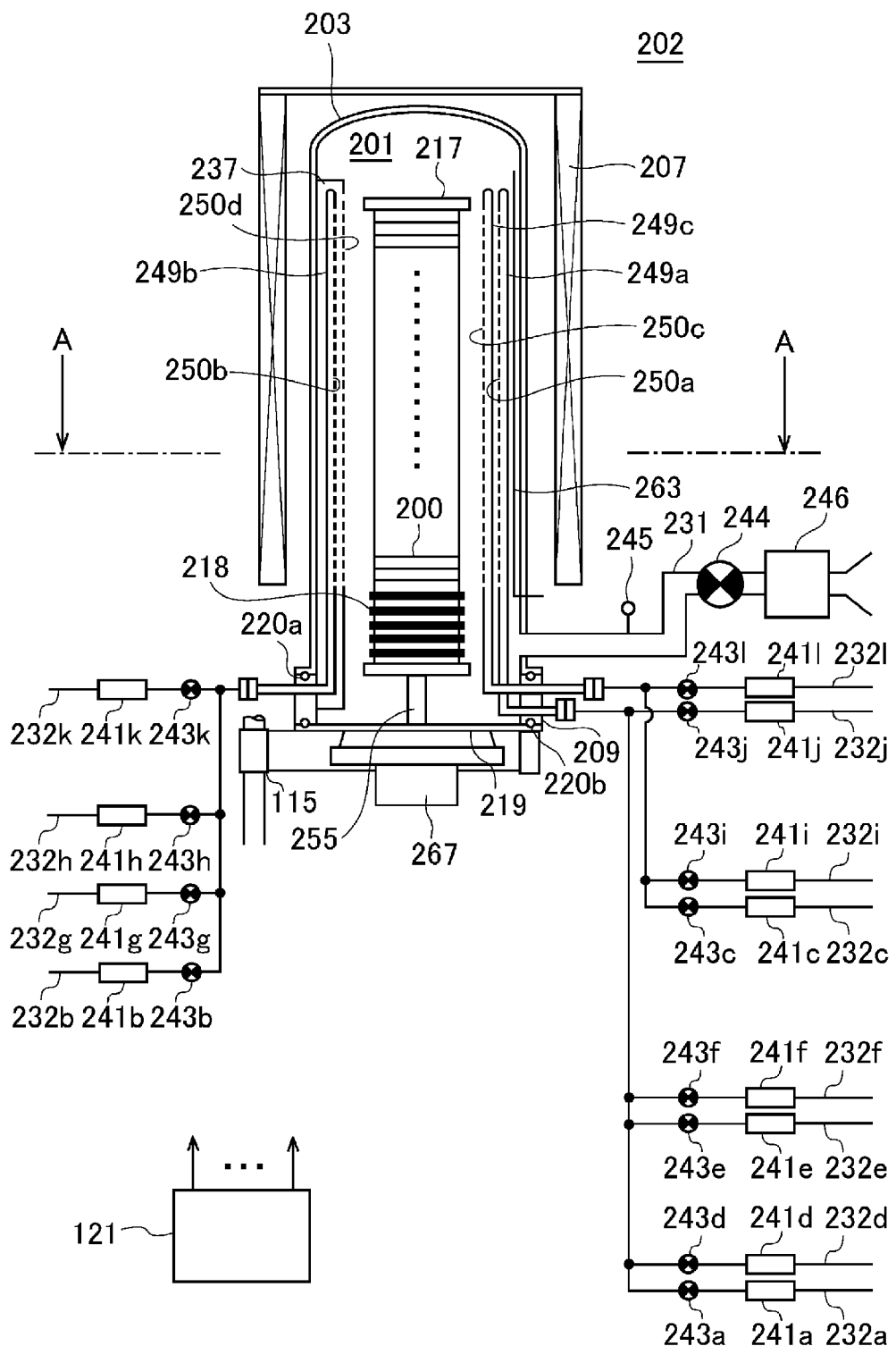
FIG. 1 is a schematic configuration diagram illustrating a vertical processing furnace of a substrate processing apparatus according to a first embodiment of the present invention, and a vertical cross-sectional diagram illustrating a portion of the processing furnace.

As shown in FIG. 1, a processing furnace 202 includes a heater 207 as a heating means (heating mechanism). The heater 207 has a cylindrical shape, and is vertically installed on a heater base (not shown) as a holding plate by being supported thereby. The heater 207 also functions as an activation mechanism (excitation unit) of activating (exciting) a gas by heat as will be described later.

A reaction tube 203 is disposed inside the heater 207 concentrically to the heater 207. The reaction tube 203 is made of a heat-resistant material such as quartz ($SiO_2$), silicon carbide (SiC), etc., for example, and is formed into a cylindrical shape, with an upper end closed and a lower end opened. A manifold 209 (inlet flange) is arranged at a lower side of the reaction tube 203 concentrically to the reaction tube 203. The manifold 209 is made of a metal such as stainless steel or the like, and formed in a cylindrical shape whose upper end and lower end are opened. The upper end of the manifold 209 is engaged with the lower end of the reaction tube 203 to support the reaction tube 203. An O ring 220a as a seal member is provided between the manifold 209 and the reaction tube 203. The reaction tube 203 is vertically provided in such a manner that the manifold 209 is supported by the heater base. A processing vessel (reaction vessel) is mainly constituted of the reaction tube 203 and the manifold 209. A processing chamber 201 is formed in a cylinder hollow part of the processing vessel, so that wafers 200 as substrates can be accommodated by a boat 217 to be described later in a state of being vertically arranged in multiple stages in a horizontal posture.

Nozzles 249a to 249c are provided so as to pass through a side wall of the manifold 209 in the processing chamber 201. Gas supply pipes 232a to 232c are respectively connected to the nozzles 249a to 249c. Gas supply pipes 232d to 232f are connected to the gas supply pipe 232a. Gas supply pipes 232g and 232h are connected to the gas supply pipe 232b. A gas supply pipe 232i is connected to the gas supply pipe 232c. In this manner, three nozzles 249a to 249c and a plurality of gas supply pipes 232a to 232i are provided in the processing vessel, and a plurality of kinds of gases may be supplied into the processing chamber 201.

Mass flow controllers (MFC) 241a to 241i as a flow rate controller (flow rate control unit) and valves 243a to 243i as an opening/closing valve are provided on the gas supply pipes 232a to 232i sequentially from an upstream direction. Further, gas supply pipes 232j to 232l for supplying an inert gas are connected to a downstream side of the valves 243a to 243c of the gas supply pipes 232a to 232c. MFCs 241j to 241l and valves 243j to 243l are provided on the gas supply pipes 232j to 232l sequentially from the upstream direction.

Figure 2:
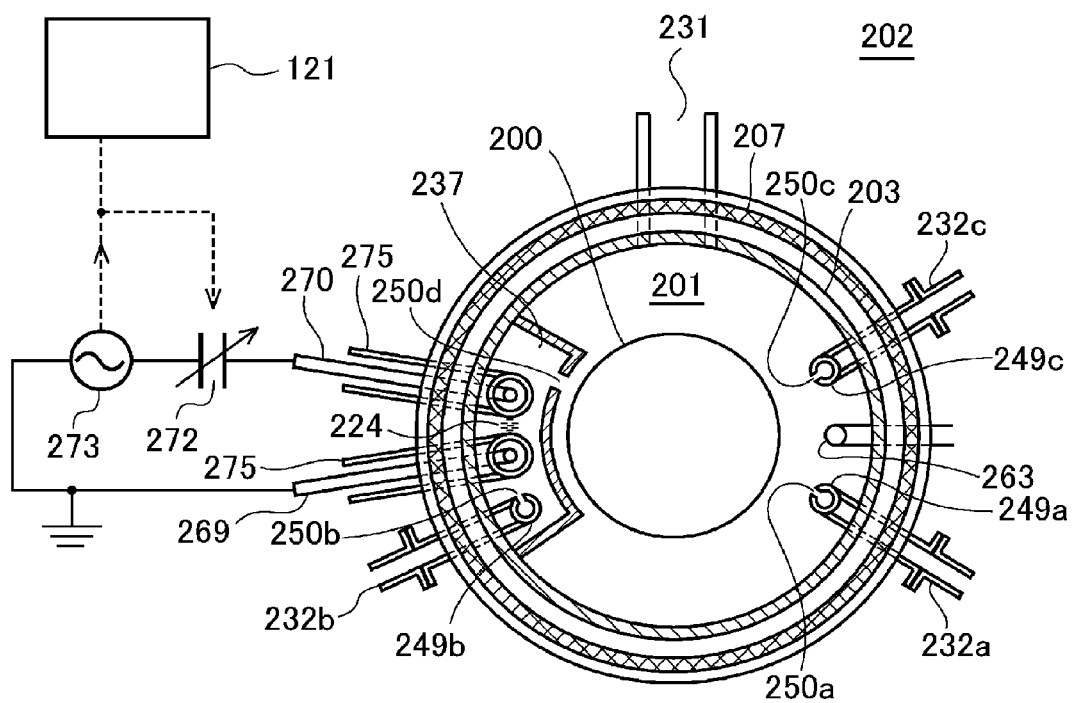
FIG. 2 is a schematic configuration diagram illustrating a vertical processing furnace of a substrate processing apparatus according to a first embodiment of the present invention, and a cross-sectional diagram taken along line A-A of FIG. 1 illustrating a portion of the processing furnace.

The nozzles 249a and 249c are respectively connected to front ends of the gas supply pipes 232a and 232c. As shown in FIG. 2, the nozzles 249a and 249c are provided in an arc-shaped space between an inner wall of the reaction tube 203 and the wafers 200, extending from a lower part to an upper part of the inner wall of the reaction tube 203, so as to rise toward an upper part of a stacking direction of the wafers 200. Namely, the nozzles 249a and 249c are respectively provided in a region horizontally surrounding a wafer arrangement region, at a side part of the wafer arrangement region in which the wafers 200 are arranged, along the wafer arrangement region. Each of the nozzles 249a and 249c is formed as an L-shaped long nozzle, with its horizontal part provided so as to pass through a side wall of the manifold 209, and with its vertical part provided so as to rise from at least one end side of the wafer arrangement region toward the other end side. Gas supply holes 250a and 250c for supplying a gas, are provided on a side face of the nozzles 249a and 249c. The gas supply holes 250a and 250c are opened to face a center of the reaction tube 203, so that the gas can be supplied toward the wafers 200. A plurality of gas supply holes 250a and 250c are provided extending from a lower part to an upper part of the reaction tube 203, each of them having the same opening area and provided at the same opening pitch.

The nozzle 249b is connected to a front end of the gas supply pipe 232b. The nozzle 249b is provided in a buffer chamber 237 which is a gas dispersion space. As shown in FIG. 2, the buffer chamber 237 is provided in the arc-shaped space between the inner wall of the reaction tube 203 and the wafers 200, extending from the lower part to the upper part of the inner wall of the reaction tube 203, along the stacking direction of the wafers 200. Namely, the buffer chamber 237 is provided in the region horizontally surrounding the wafer arrangement region, at the side part of the wafer arrangement region, along the wafer arrangement region. Gas supply holes 250d for supplying a gas, are provided on an end portion of a wall adjacent to the wafers 200 of the buffer chamber 237. Each gas supply hole 250d is opened to face the center of the reaction tube 203, so that the gas can be supplied toward the wafers 200. A plurality of gas supply holes 250d are provided extending from the lower part to the upper part of the reaction tube 203, each of them having the same opening area and provided at the same opening pitch.

The nozzle 249b is provided on the end portion at an opposite side to the end portion where the gas supply holes 250d of the buffer chamber 237 is provided, extending to the upper part from the lower part of the inner wall of the reaction tube 203, so as to rise toward the upper part of the stacking direction of the wafers 200. Namely, the nozzle 249b is provided in a region horizontally surrounding the wafer arrangement region, at the side part of the wafer arrangement region, along the wafer arrangement region. The nozzle 249b is formed as an L-shaped long nozzle, with its horizontal part provided so as to pass through the side wall of the manifold 209, and with its vertical part provided so as to rise from at least one end side of the wafer arrangement region toward the other end side. Gas supply holes 250b for supplying a gas, are provided on a side face of the nozzle 249b. Each gas supply hole 250b is opened to face a center of the buffer chamber 237. Similarly to the gas supply holes 250d, a plurality of gas supply holes 250b are provided, extending to the upper part from the lower part of the reaction tube 203. Each of the plurality of gas supply holes 250b may be opened in the same opening area at the same opening pitch from the upstream side (lower part) to the downstream side (upper part) when a differential pressure is small between inside of the buffer chamber 237 and inside of the processing chamber 201. On the other hand, when the differential pressure is large between inside of the buffer chamber 237 and inside of the processing chamber 201, each opening area of the gas supply holes 250b may become gradually large or each opening pitch thereof may become gradually small, toward the downstream side from the upstream side.

By adjusting the opening area and the opening pitch of each of the plurality of gas supply holes 250b as described above from the upstream side to the downstream side, a gas whose flow rate is adjusted to be approximately the same, although there is a difference in a flow velocity, is sprayed from each of the gas supply holes 250b. Then, since the gas sprayed from each of the gas supply holes 250b is introduced once into the buffer chamber 237, a difference in the flow velocity of the gas is made uniform in the buffer chamber 237. Namely, the gas sprayed into the buffer chamber 237 from each of the gas supply holes 250b is sprayed into the processing chamber 201 from the plurality of gas supply holes 250d, after a particle velocity of each gas is relaxed in the buffer chamber 237. Thus, the gas sprayed into the buffer chamber 237 from each of the gas supply holes 250b becomes the gas having a uniform flow rate and flow velocity, when being sprayed into the processing chamber 201 from each of the gas supply holes 250d.

As described above, in the present embodiment, the gas is transported through the nozzles 249a to 249c and the buffer chamber 237 which are disposed inside the arc-shaped and vertically long space which is defined by the inner wall of the reaction tube 203 and the end portion of the plurality of stacked wafers 200, namely, a cylindrical space. Then, the gas is initially sprayed into the reaction tube 203 in the vicinity of the wafers 200 from the gas supply holes 250a to 250d opened in the nozzles 249a to 249c and the buffer chamber 237. Then, a main flow of the gas inside the reaction tube 203 is made in a direction parallel with the surface of the wafers 200, namely, a horizontal direction. By the above-described configuration, gases may be uniformly supplied to each of the wafers 200, and uniformity of a film thickness of a film formed on each of the wafers 200 may be improved. The gas flowing onto the surface of the wafers 200, namely, a residual gas after reaction flows in a direction of an exhaust opening, namely, an exhaust pipe 231 to be described later. However, a direction in which the residual gas flows is appropriately specified by a position of the exhaust opening, and is not limited in a vertical direction.

As a source gas which contains a predetermined element, carbon (C), and a halogen element and has a chemical bond of the predetermined element and carbon (C), an alkylene halosilane source gas which contains Si as the predetermined element, an alkylene group, and a halogen group and has a chemical bond of Si and C (Si—C bond) is supplied into the processing chamber 201 from the gas supply pipe 232a through the MFC 241a, the valve 243a, and the nozzle 249a. The alkylene group is a functional group obtained by removing two hydrogens (H) from a chain saturated hydrocarbon (alkane) represented as a general formula $C_nH_{2n+2}$ and is an assembly of atoms represented as a general formula $C_nH_{2n}$. The alkylene group includes a methylene group, an ethylene group, a propylene group, a butylene group, and the like. The halogen group includes a chloro group, a fluoro group, a bromo group, and the like. Namely, halogen elements such as chlorine (Cl), fluorine (F), bromine (Br), and the like are included in the halogen group.

As the alkylene halosilane source gas, a source gas containing Si, a methylene group (—$CH_2$—) as the alkylene group, and a chloro group (Cl) as the halogen group, namely, a chlorosilane source gas containing the methylene group or a source gas containing Si, an ethylene group (—$C_2H_4$—) as the alkylene group, and the chloro group (Cl) as the halogen group, namely, a chlorosilane source gas containing the ethylene group may be used. As the chlorosilane source gas containing the methylene group, for example, a methylenebis(trichlorosilane) gas, namely, a bis(trichlorosilyl)methane (($SiCl_3)_2CH_2$, abbreviated as BTCSM) gas and the like may be used. As the chlorosilane source gas containing the ethylene group, for example, an ethylenebis(trichlorosilane) gas, namely, a 1,2-bis(trichlorosilyl)ethane (($SiCl_3)_2C_2H_4$, abbreviated as BTCSE) gas and the like may be used.

Figure 9A:
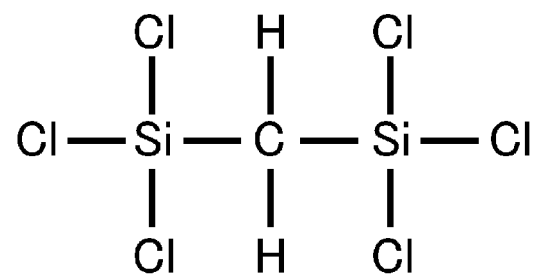
FIGS. 9A through 9F are diagrams illustrating chemical structural formulas of various kinds of silanes used as a source gas, and illustrate chemical structural formulas of each of BTCSM, BTCSE, TCDMDS, DCTMDS, HCDS, and BDEAS.

As shown in FIG. 9A, BTCSM includes one methylene group as the alkylene group from a chemical structural formula of BTCSM (from one molecule). Two bonds included in the methylene group are respectively bonded with Si to form a Si—C—Si bond.

Figure 9B:
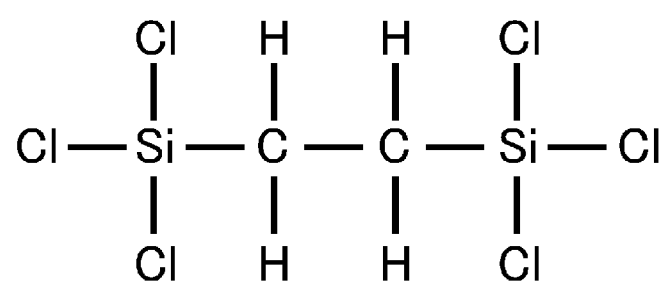

As shown in FIG. 9B, BTCSE includes one ethylene group as the alkylene group from one molecule. Two bonds included in the ethylene group are respectively bonded with Si to form a Si—C—C—Si bond.

As a source gas which contains a predetermined element, carbon (C), and halogen elements and has a chemical bond of the predetermined element and C, an alkyl halosilane source gas which contains Si as the predetermined element, an alkyl group, and a halogen group and has a chemical bond of Si—C is supplied into the processing chamber 201 from the gas supply pipe 232*d* through the MFC 241*d*, the valve 243*d*, and the nozzle 249*a*. The alkyl group is a functional group obtained by removing one hydrogen (H) from a chain saturated hydrocarbon represented as a general formula $C_nH_{2n+2}$, and is an assembly of atoms represented as a general formula $C_nH_{2n+1}$. The alkyl group includes a methyl group, an ethyl group, a propyl group, a butyl group, and the like. The halogen group includes a chloro group, a fluoro group, and a bromo group, and the like, namely, halogen elements such as Cl, F, Br, and the like.

As the alkyl halosilane source gas, a source gas containing, for example, Si, a methyl group (—$CH_3$—) as the alkyl group, and a chloro group (Cl) as the halogen group, namely, a chlorosilane source gas containing the methyl group may be used. As the chlorosilane source gas containing the methyl group, for example, a 1,1,2,2-tetrachloro-1,2-dimethyldisilane (($CH_3)_2Si_2Cl_4$, abbreviated as TCDMDS) gas, a 1,2-dichloro-1,1,2,2-tetramethyldisilane (($CH_3)_4Si_2Cl_2$, abbreviated as DCTMDS) gas, a 1-monochloro-1,1,2,2,2-pentamethyldisilane (($CH_3)_5Si_2Cl$, abbreviated as MCPMDS) gas, and the like may be used. The alkyl halosilane source gas such as the TCDMDS gas, the DCTMDS gas, or the like is different from the alkylene halosilane source gas such as the BTCSE gas, BTCSM gas, or the like, and is a gas including a Si—Si bond, namely, a source gas which contains a predetermined element and a halogen element and has a chemical bond between predetermined elements.

Figure 9C:
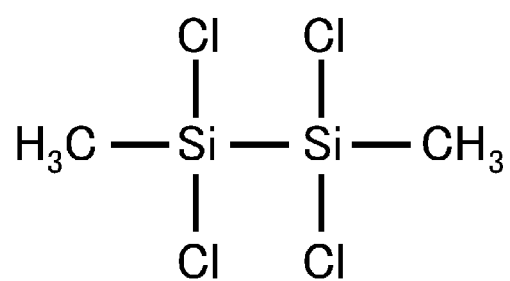

As shown in FIG. 9C, TCDMDS contains two methyl groups as an alkyl group from one molecule. Each bond included in two methyl groups is bonded with Si to form a Si—C bond. The TCDMDS is a deriviative of disilane, and includes a Si—Si bond. Namely, TCDMDS includes a Si—Si—C bond in which Sis are bonded and Si and C are bonded.

Figure 9D:
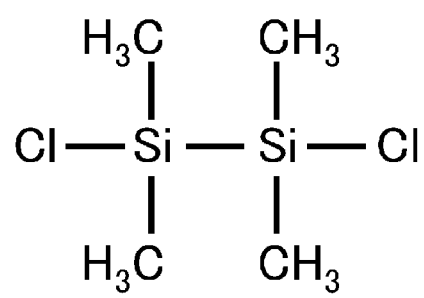

As shown in FIG. 9D, DCTMDS includes four methyl groups as an alkyl group from one molecule. Each bond included in four methyl groups is bonded with Si to form a Si—C bond. The DCTMDS is a derivative of disilane and includes a Si—Si bond. Namely, the DCTMDS includes a Si—Si—C bond in which Sis are bonded and Si and C are bonded.

As a source gas containing Si as a predetermined element and a halogen element, for example, a halosilane source gas which contains Si and a halogen element and has a chemical bond between Si and Si (Si—Si bond) is supplied into the processing chamber 201 through the MFC 241*e*, the valve 243*e*, and the nozzle 249*a* from the gas supply pipe 232*e*.

As the halosilane source gas, for example, a source gas which contains Si and a chloro group (Cl) as the halogen element and has a Si—Si bond, namely, a chlorosilane source gas may be used. The chlorosilane source gas is a silane source gas containing a chloro group, and a source gas containing at least Si and Cl as the halogen element. Namely, a chlorosilane source may be a kind of a halide. As the chlorosilane source gas supplied from the gas supply pipe 232*e*, for example, a hexachlorodisilane ($Si_2Cl_6$, abbreviated as HCDS) gas may be used.

Figure 9E:
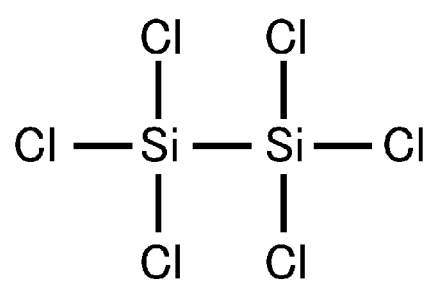

As shown in FIG. 9E, HCDS includes two Sis and six chloro groups from one molecule. As a source gas containing Si and a halogen element, an inorganic source gas such as tetrachlorosilane, namely, a silicon tetrachloride ($SiCl_4$, abbreviated as STC) gas, a trichlorosilane ($SiHCl_3$, abbreviated as TCS) gas, a dichlorosilane ($SiH_2Cl_2$, abbreviated as DCS) gas, a monochlorosilane ($SiH_3Cl$, abbreviated as MCS) gas, or the like other than the HCDS gas may be used.

As a source gas which contains Si as a predetermined element, C, and nitrogen (N) and has a chemical bond between Si and N (Si—N bond), an aminosilane source gas as a source gas containing Si and an amino group (amine group) is supplied into the processing chamber 201 from the gas supply pipe 232*f* through the MFC 241*f*, the valve 243*f*, and the nozzle 249*a*.

The aminosilane source gas is a silane source gas containing the amino group, and is a source gas which includes the amino group containing at least Si, C, and N. As the aminosilane source gas being supplied from the gas supply pipe 232*f*, for example, a bis(diethylamino)silane ($Si[N(C_2H_5)_2]_2H_2$, abbreviated as BDEAS) gas may be used.

Figure 9F:
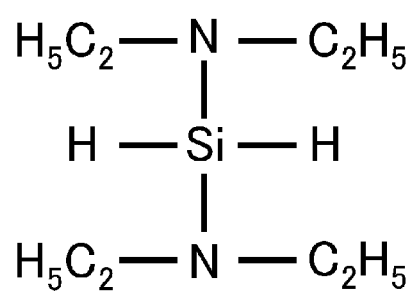
Figure 10B:
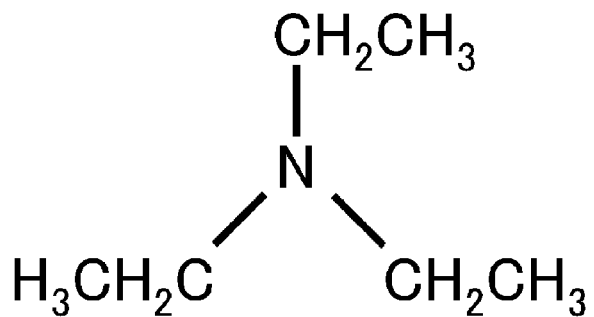
Figure 10C:
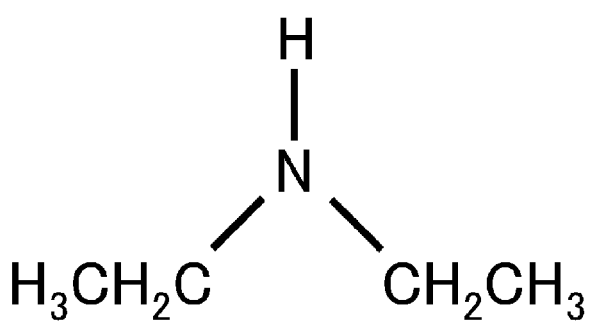
Figure 10D:
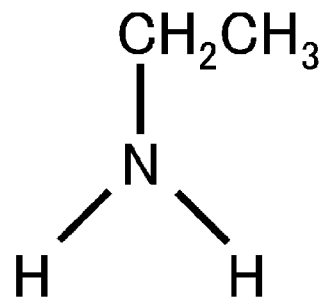
Figure 10E:
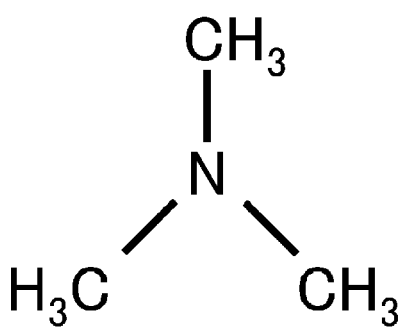
Figure 10F:
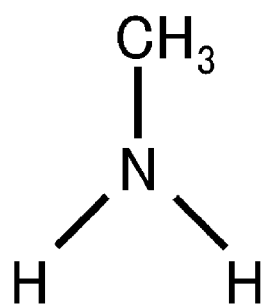

As shown in FIG. 9F, BDEAS includes one Si and two amino groups from one molecule. As a source gas which contains Si, C, and N and has a Si—N bond, an organic source gas such as a tris(diethylamino)silane ($SiH[N(C_2H_5)_2]_3$, abbreviated as 3DEAS) gas, a tetrakis(diethylamino)silane ($Si[N(C_2H_5)_2]_4$, abbreviated as 4DEAS) gas, a tris(dimethylamino)silane ($Si[N(CH_3)_2]_3H$, abbreviated as 3DMAS) gas, a tetrakis(dimethylamino)silane ($Si[N(CH_3)_2]_4$, abbreviated as 4DMAS) gas, or the like other than the BDEAS gas may be used.

Here, the source gas indicates a source in a gas state, for example, a gas obtained by vaporizing a source in a liquid state under ordinary temperature and normal pressure, or a source in a gas state under ordinary temperature and normal pressure. In the present invention, cases in which the term "source" is used include a case in which the source gas means a "liquid source in a liquid state," a case in which the source gas means a "source gas in a gas state," or a case in which the source gas means the both. When a liquid source in a liquid state under ordinary temperature and normal pressure such as BTCSM, BTCSE, TCDMDS, DCTMDS, HCDS, and BDEAS is used, the liquid source is vaporized by a vaporizer or a vaporizing system such as a bubbler, and is supplied as the source gas (BTCSM gas, BTCSE gas, TCDMDS gas, DCTMDS gas, HCDS gas, and BDEAS gas).

A gas containing oxygen (O) (oxygen-containing gas) as an oxidizing gas is supplied into the processing chamber 201 from the gas supply pipe 232b through the MFC 241b, the valve 243b, the nozzle 249b, and the buffer chamber 237. As the oxidizing gas being supplied from the gas supply pipe 232b, for example, vapor ($H_2O$ gas) may be used. In addition, with regard to supply of the $H_2O$ gas, an oxygen ($O_2$) gas and a hydrogen ($H_2$) gas may be supplied to an external combustion device, which is not shown, and combusted to generate and supply an $H_2O$ gas.

A gas containing oxygen (O) (oxygen-containing gas) as an oxidizing gas is supplied into the processing chamber 201 from the gas supply pipe 232g through the MFC 241g, the valve 243g, the nozzle 249b, and the buffer chamber 237. As the oxidizing gas being supplied from the gas supply pipe 232g, for example, an ozone ($O_3$) gas may be used.

A gas containing oxygen (O) (oxygen-containing gas) as an oxidizing gas is supplied into the processing chamber 201 from the gas supply pipe 232h through the MFC 241h, the valve 243h, the nozzle 249b, and the buffer chamber 237. As the gas being supplied from the gas supply pipe 232h, for example, an oxygen ($O_2$) gas may be used.

As a catalyst gas which promotes decomposition of a source gas and promotes an oxidation reaction by an oxidizing gas such as an $H_2O$ gas, or the like by weakening a bonding power of an O—H bond included in the surface of the wafers 200 or a bonding power of an O—H bond included in the $H_2O$ gas by catalytic action, for example, an amine-based gas containing, C, N, and H is supplied into the processing chamber 201 from the gas supply pipe 232c through the MFC 241c, the valve 243c, and the nozzle 249c.

The amine-based gas is a gas containing amine obtained by substituting at least one H of ammonia ($NH_3$) with a hydrocarbon group such as an alkyl group or the like. As shown in FIGS. 10A through 10F, various amines used as the catalyst gas contain N including a lone electron pair, and an acid dissociation constant (hereinafter, referred to as "pKa") thereof is about 5 to 11. The pKa is one of indexes quantitatively indicating the strength of acid, and means that an equilibrium constant Ka in a dissociation reaction in which an H ion is released from the acid is indicated by a negative common logarithm. As the amine-based gas, a cyclic amine-based gas in which a hydrocarbon group has a cyclic shape or a chain amine-based gas in which the hydrocarbon group has a chain shape may be used. As the amine-based gas being supplied from the gas supply pipe 232c, for example, a pyridine ($C_5H_5N$) gas as the cyclic amine-based gas may be used.

As shown in FIG. 10A, as the cyclic amine-based gas, a pyridine ($C_5H_5N$, pKa=5.67) gas, an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas, a piperidine ($C_5H_{11}N$, pKa=11.12) gas, and the like may be used. The cyclic amine-based gas may be referred to as a heterocyclic compound whose cyclic structure is constituted of multiple kinds of elements of C and N, namely, a nitrogen-containing heterocyclic compound.

As a catalyst gas having the same catalysis as in the cyclic amine-based gas, an amine-based gas containing C, N, and H is supplied into the processing chamber 201 from the gas supply pipe 232i through the MFC 241i, the valve 243i, and the nozzle 249c. As the amine-based gas being supplied from the gas supply pipe 232i, a chain triethylamine (($C_2H_5$)$_3$N, abbreviated as TEA) gas may be used.

As shown in FIGS. 10B to 10F, as the chain amine-based gas, a triethylamine (($C_2H_5$)$_3$N, abbreviated as TEA, pKa=10.7) gas, a diethylamine (($C_2H_5$)$_2$NH, abbreviated as DEA, pKa=10.9) gas, a monoethylamine (($C_2H_5$)$NH_2$, abbreviated as MEA, pKa=10.6) gas, a trimethylamine (($CH_3$)$_3$N, abbreviated as TMA, pKa=9.8) gas, a monomethylamine (($CH_3$)$NH_2$, abbreviated as MMA, pKa=10.6) gas, and the like may be used.

The amine-based gas acting as a catalyst gas may be referred to as an amine-based catalyst gas. As the catalyst gas, a non-amine-based gas, namely, an ammonia ($NH_3$, pKa=9.2) gas or the like may be used other than the above-described amine-based gas.

There is a case in which a part of a molecular structure of the exemplified catalyst gas is decomposed in a thin film forming process which will be described later. Strictly speaking, the gas whose part is changed before and after such a chemical reaction is not a "catalyst." However, in the present invention, a material substantially acting as the catalyst in such a manner that most of the material is not decomposed even though a part of the material is decomposed in a process of the chemical reaction and a speed of the reaction is changed is referred to as the "catalyst."

A nitrogen ($N_2$) gas as an inert gas is supplied into the processing chamber 201 from the gas supply pipes 232j to 232l through the MFC 241j to 241l, the valves 243j to 243l, the gas supply pipes 232a to 232c, the nozzles 249a to 249c, and the buffer chamber 237, respectively.

The $N_2$ gas acts as a purge gas, and also acts as an oxygen-free gas without containing oxygen (O) that generates an oxygen-free atmosphere which will be described later. When the $N_2$ gas is used as the oxygen-free gas, there is a case in which the $N_2$ gas acts as a heat treatment gas or an annealing gas. As the inert gas, the purge gas, and the oxygen-free gas, rare gases such as an argon (Ar) gas, a helium (He) gas, a neon (Ne) gas, a xenon (Xe) gas, and the like other than the $N_2$ gas may be used.

When the above-described gases flow from each of the gas supply pipes, a source gas supply system for supplying a source gas is mainly constituted of gas supply pipes 232a, 232d, 232e, and 232f, MFCs 241a, 241d, 241e, and 241f, and valves 243a, 243d, 243e, and 243f. The nozzle 249a may be included in the source gas supply system. The source gas supply system may be referred to as a source supply system. The source gas supply system may be considered to be an assembly of a plurality of supply lines (supply systems) which supply a plurality of kinds of source gases as element sources of mutually different elements or a plurality of kinds of source gases whose molecular structures are different from each other. Namely, the source gas supply system may be an assembly of a BTCSM gas supply line mainly constituted of the gas supply pipe 232a, the MFC 241a, and the valve 243a, a TCDMDS gas supply line mainly constituted of the gas supply pipe 232d, the MFC 241d, and the valve 243d, an HCDS gas supply line mainly constituted of the gas supply pipe 232e, the MFC 241e, and the valve 243e, and a BDEAS gas supply line mainly constituted of the gas supply pipe 232f, the MFC 241f, and the valve 243f. The nozzle 249a may be included in each of the supply lines.

As described above, the plurality of supply lines constituting the source gas supply system are configured to supply the plurality of kinds of source gases as the element sources of the mutually different elements or the plurality of kinds of source gases whose molecular structures are different from each other. In addition, each of the source gases has a different molecular structure, namely, a different chemical structural formula. Composition or component of each source gas may be different. The source gases having mutually different molecular structures have different chemical properties. Therefore, by appropriately selecting kinds of source gases in accordance with a desired film formation process as will be described later, various composition ratios and a thin film having excellent reproducible film quality may be formed for a general purpose using a single substrate processing apparatus.

In addition, an oxidizing gas supply system is mainly constituted of the gas supply pipes 232b, 232g, and 232h, the MFCs 241b, 241g, and 241h, and the valves 243b, 243g, and 243h. The nozzle 249b and the buffer chamber 237 may be included in the oxidizing gas supply system. The oxidizing gas supply system may be referred to as an oxidizer supply system. The oxidizing gas supply system may be considered to be an assembly of a plurality of supply lines (supply systems) which supply a plurality of kinds of oxidizing gases whose molecular structures are different from each other. Namely, the oxidizing gas supply system may be an assembly of an $H_2O$ gas supply line mainly constituted of the gas supply pipe 232b, the MFC 241b, and the valve 243b, an $O_3$ gas supply line mainly constituted of the gas supply pipe 232g, the MFC 241g, and the valve 243g, and an $O_2$ gas supply line mainly constituted of the gas supply pipe 232h, the MFC 241h, and the valve 243h. The nozzle 249b or the buffer chamber 237 may be included in each of the supply lines.

As described above, the plurality of supply lines constituting the oxidizing gas supply system are configured to supply the plurality of kinds of oxidizing gases whose molecular structures are different from each other. In addition, each of the oxidizing gases has a different molecular structure, namely, a different chemical structural formula. Composition or component of each oxidizing gas may be different. The oxidizing gases having mutually different molecular structures have different chemical properties. Therefore, by appropriately selecting kinds of oxidizing gases in accordance with a desired film formation process, various composition ratios and a thin film having excellent reproducible film quality may be formed for a general purpose using a single substrate processing apparatus.

In addition, a catalyst gas supply system is mainly constituted of the gas supply pipes 232c and 232i, the MFCs 241c and 241i, and the valves 243c and 243i. The nozzle 249c may be included in the catalyst gas supply system. The catalyst gas supply system may be considered to be an assembly of a plurality of supply lines (supply systems) which supply a plurality of kinds of catalyst gases whose molecular structures are different from each other. Namely, the catalyst gas supply system may be an assembly of a pyridine gas supply line mainly constituted of the gas supply pipe 232c, the MFC 241c, and the valve 243c, and a TEA gas supply line mainly constituted of the gas supply pipe 232i, the MFC 241i, and the valve 243i. The nozzle 249c may be included in each of the supply lines. The pyridine gas or the TEA gas may be considered to be an amine-based gas as a catalyst, namely, an amine-based catalyst gas as will be described later. Hereinafter, the catalyst gas supply system which supplies various amine-based catalyst gases is referred to as an amine-based catalyst gas supply system.

As described above, the plurality of supply lines constituting the catalyst gas supply system are configured to supply the plurality of kinds of catalyst gases whose molecular structures are different from each other. In addition, each of the catalyst gases has a different molecular structure, namely, a different chemical structural formula. Composition or component of each of the catalyst gases may be different. The catalyst gases having mutually different molecular structures have different chemical properties. Therefore, by appropriately selecting kinds of catalyst gases in accordance with a desired film formation process as will be described later, various composition ratios and a thin film having excellent reproducible film quality may be formed for a general purpose using a single substrate processing apparatus.

In addition, an inert gas supply system is mainly constituted of the gas supply pipes 232j to 232l, the MFCs 241j to 241l, and the valves 243j to 243l. The nozzles 249a to 249c and the buffer chamber 237 on a downstream side of a connection portion with the gas supply pipes 232j to 232l in the gas supply pipes 232a to 232c may be included in the inert gas supply system. The inert gas supply system may be considered to be an assembly of a plurality of supply lines. Namely, the inert gas supply system may be an assembly of an inert gas supply line mainly constituted of the gas supply pipe 232j, the MFC 241j, and the valve 243j, an inert gas supply line mainly constituted of the gas supply pipe 232k, the MFC 241k, and the valve 243k, and an inert gas supply line mainly constituted of the gas supply pipe 232l, the MFC 241l, and the valve 243l. The inert gas supply system also functions as a purge gas supply system and an oxygen-free gas supply system. In addition, the oxygen-free gas supply system constitutes a part of an atmosphere generating unit that generates an oxygen-free atmosphere which will be described later.

Any one or all of the above-described source gas supply system, oxidizing gas supply system, catalyst gas supply system, and inert gas supply system may be referred to as a processing gas supply system.

As shown in FIG. 2, two rod electrodes 269 and 270 which are constituted of electric conductors and have a slim and long structure are arranged in the stacking direction of the wafers 200 extending from the lower part to the upper part of the reaction tube 203. Each of the rod electrodes 269 and 270 is provided in parallel to the nozzle 249d. Each of the rod electrodes 269 and 270 is protected by being covered by an electrode protective tube 275 from the upper part to the lower part. One of the rod electrodes 269 and 270 is connected to a high frequency power source 273 via a matcher 272, and other one is connected to earth as a reference electric potential. As a result, plasma is generated in a plasma generation region 224 between the rod electrodes 269 and 270 by applying high frequency (RF) power between the rod electrodes 269 and 270 from the high frequency power source 273 via the matcher 272. A plasma source as a plasma generator (plasma generation unit) is mainly constituted of the rod electrodes 269 and 270 by the electrode protective tube 275. The matcher 272 and the high frequency power source 273 may be included in the plasma source. The plasma source functions as an activation mechanism (excitation unit) of activating a gas in a plasma state.

The electrode protective tube 275 is configured to insert each of the rod electrodes 269 and 270 into the buffer chamber 237 in a state of being isolated from an atmosphere of the buffer chamber 237. Here, if an oxygen concentration of the inside of the electrode protective tube 275 is set in the same level as an oxygen concentration of the outside air (atmosphere), the rod electrodes 269 and 270 inserted into the electrode protective tube 275 respectively, are oxidized by heat of the heater 207. Therefore, by charging or purging the inside of the electrode protective tube 275 with the inert gas such as an $N_2$ gas using an inert gas purge mechanism, the oxygen concentration of the inside of the electrode protective tube 275 can be lowered, thereby suppressing an oxidation of the rod electrodes 269 and 270.

The exhaust pipe 231 for exhausting the atmosphere in the processing chamber 201 is provided in the reaction tube 203. A vacuum pump 246 as a vacuum exhaust device is connected to the exhaust pipe 231, via a pressure sensor 245 as a pressure detector (pressure detection unit) for detecting a pressure in the processing chamber 201, and an auto pressure controller (APC) valve 244 as a pressure adjuster (pressure adjustment unit). The APC valve 244 is configured to perform vacuum exhaust/stop of vacuum exhaust in the processing chamber 201 by opening and closing the valve in a state of operating the vacuum pump 246, and is further configured to adjust the pressure in the processing chamber 201 by adjusting an opening degree of the valve based on pressure information detected by the pressure sensor 245 in a state of operating the vacuum pump 246. An exhaust system is mainly constituted of the exhaust pipe 231, the APC valve 244, and the pressure sensor 245. The vacuum pump 246 may be included in the exhaust system. The exhaust pipe 231 is not limited to a case of being installed in the reaction tube 203, and may be installed in the manifold 209 similarly to the nozzles 249a to 249c.

The atmosphere generating unit that generates an oxygen-free atmosphere in the processing chamber 201 is mainly constituted of the above-described exhaust system and oxygen-free gas supply system. The exhaust system is configured to set the atmosphere in the processing chamber 201 as the oxygen-free atmosphere with the exhaust system alone by performing vacuum exhaust on the inside of the processing chamber 201, or in conjunction with the oxygen-free gas supply system that supplies an oxygen-free gas to the wafers 200 in the processing chamber 201.

A seal cap 219 is provided in a lower portion of the manifold 209, as a furnace port lid member capable of air-tightly closing a lower end opening of the manifold 209. The seal cap 219 is configured to abut on the lower end of the manifold 209 from a vertical lower side. The seal cap 219 is made of a metal such as SUS, and formed into a disc shape. An O-ring 220b as a seal member abutted on the lower end of the manifold 209 is provided on an upper surface of the seal cap 219. A rotation mechanism 267 for rotating a boat 217 to be described later is installed on an opposite side of the processing chamber 201 across the seal cap 219. A rotary shaft 255 of the rotation mechanism 267 passes through the seal cap 219 and is connected to the boat 217. The rotation mechanism 267 is configured to rotate the wafers 200 by rotating the boat 217. The seal cap 219 is configured to be vertically elevated by a boat elevator 115 as an elevation mechanism vertically installed outside the reaction tube 203. The boat elevator 115 is configured to load and unload the boat 217 into/from the processing chamber 201 by elevating the seal cap 219. Namely, the boat elevator 115 is configured as a transporting device (transporting mechanism) for transporting the boat 217 and the wafers 200 supported by the boat 217 to the inside/outside of the processing chamber 201.

The boat 217 as a substrate supporting tool is configured to support a plurality of, for example, 25 or 200 sheets of wafers 200 in a horizontal posture, with centers thereof aligned, vertically arranged in multiple stages, namely, arranged spaced apart. The boat 217 is made of a heat-resistant material such as quartz, SiC, or the like. In a lower portion of the boat 217, a heat insulating plate 218 made of the heat-resistant material such as quartz, SiC, or the like is supported in a horizontal posture in multiple stages. Thus, heat from the heater 207 is hardly transmitted to the seal cap 219 side. However, the present embodiment is not limited to the embodiments described above. For example, without providing the heat insulating plate 218 in the lower portion of the boat 217, a heat insulating cylinder configured as a cylindrical member made of a heat-resistant material such as quartz or SiC may be provided.

A temperature sensor 263 as a temperature detector is installed in the reaction tube 203. By adjusting a power supply state to the heater 207 based on the temperature information detected by the temperature sensor 263, the temperature in the processing chamber 201 is set to have a desired temperature distribution. Similarly to the nozzles 249a to 249c, the temperature sensor 263 is formed into the L-shape, and is provided along the inner wall of the reaction tube 203.

Figure 3:
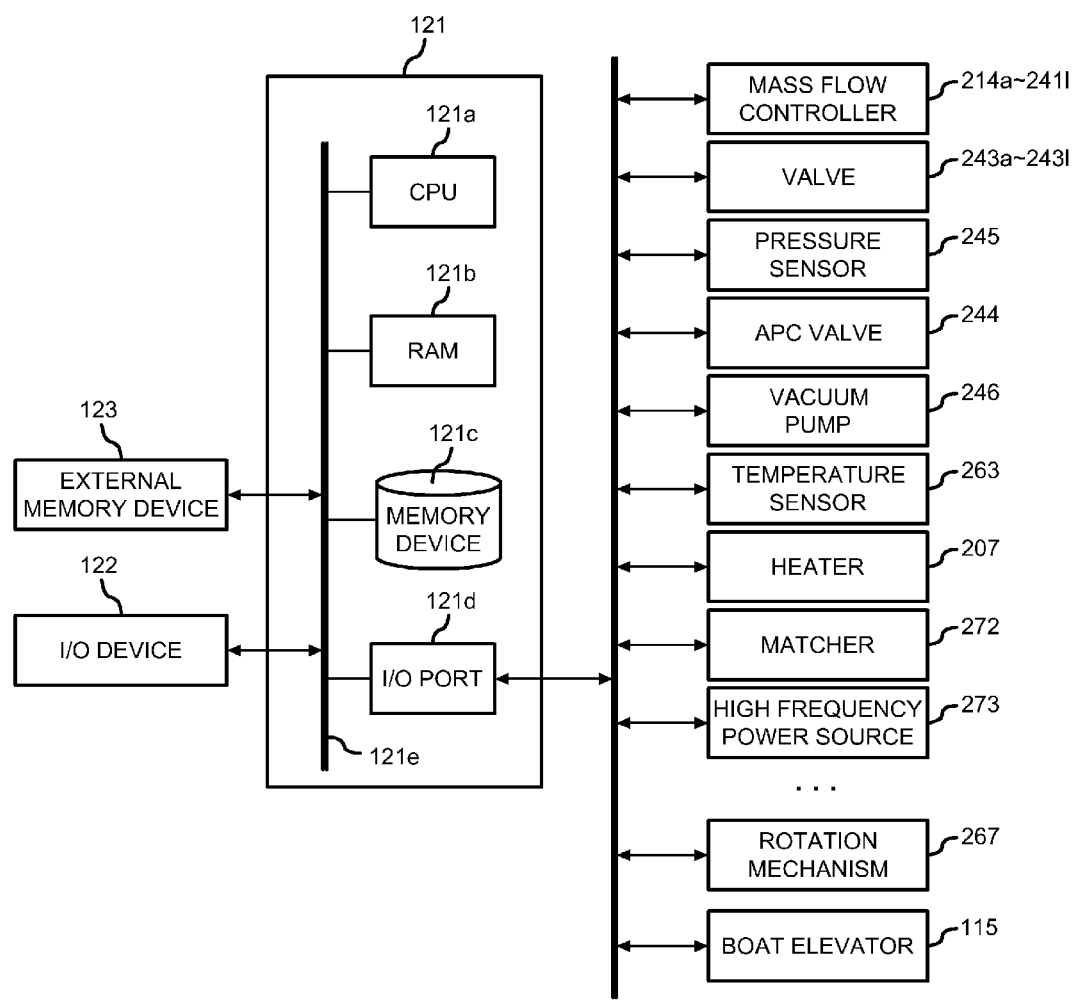
FIG. 3 is a schematic configuration diagram illustrating a controller of a substrate processing apparatus according to a first embodiment of the present invention, and a block diagram illustrating a control system of the controller.

As shown in FIG. 3, a controller 121 as a control unit (control means) is configured as a computer including a central processing unit (CPU) 121a, an random access memory (RAM) 121b, a memory device 121c, and an I/O port 121d. The RAM 121b, the memory device 121c, and the I/O port 121d are configured to perform data exchange with the CPU 121a via an internal bus 121e. An input/output device 122 configured as a touch panel, etc., is connected to the controller 121.

The memory device 121c includes, for example, a flash memory, a hard disk drive (HDD), and the like. A control program for controlling an operation of the substrate processing apparatus, and a process recipe, etc., indicating a procedure and a condition, etc., of substrate processing to be descried later are readably stored in the memory device 121c. The process recipe is a combination of recipes, so that each procedure in a substrate processing process such as a thin film forming process to be described later is executed by the controller 121 to obtain a specific result, and functions as a program. Hereinafter, the process recipe and the control program, etc., are generally simply called a program. In the present specification, cases in which the term "program" is used include a case of including only a single process recipe, a case of including only a control program, or a case of including both of them. The RAM 121b is configured as a memory area (work area) in which the program and data, etc., read by the CPU 121a are temporarily stored.

The I/O port 121d is connected to the MFCs 241a to 241l, the valves 243a to 243l, the pressure sensor 245, the APC valve 244, the vacuum pump 246, the temperature sensor 263, the heater 207, the matcher 272, the high frequency power source 273, the rotation mechanism 267, the boat elevator 115, and the like.

The CPU 121a is configured to read and execute the control program from the memory device 121c, and is configured to read the process recipe from the memory device 121c according to an input, etc., of an operation command from the input/output device 122. Then, the CPU 121a is configured to control a flow rate adjustment operation of each kind of gas by the MFCs 241a to 241l, an opening/closing operation of the valves 243a to 243l, an opening/closing operation of the APC valve 244, a pressure adjustment operation based on the pressure sensor 245 by the APC valve 244, start/stop of the vacuum pump 246, a temperature adjustment operation of the heater 207 based on the temperature sensor 263, a rotation and rotation speed adjustment operation of the boat 217 by the rotation mechanism 267, an elevating operation of the boat 217 by the boat elevator 115, an impedance adjustment operation by the matcher 272, power supply by the high frequency power source 273, and the like, so as to follow the read process recipe.

The controller 121 may be configured not only as a dedicated computer, but also as a general-purpose computer. For example, an external memory device 123 (for example, a magnetic tape, a magnetic disc such as a flexible disc and a hard disc, etc., an optical disc such as CD and DVD, etc., an optical magnetic disc such as MO, etc., and a semiconductor memory such as a USB memory and a memory card, etc.) storing the above-mentioned program is prepared, and by using the external memory device 123, the program is installed in the general-purpose computer, to thereby constitute the controller 121 according to this embodiment. However, a means for supplying the program to the computer is not limited to a case of supplying it through the external memory device 123. For example, communication means such as Internet and a dedicated line, etc., may be used to thereby supply the program not through the external memory device 123. The memory device 121c or the external memory device 123 is configured as a computer-readable recording medium. Hereinafter, these are generally simply called a recording medium. In the present specification, cases in which the term "recording medium" is used include a case of including only a single memory device 121c, a case of including only a single external memory device 123, or a case of including both of them.

(2) Thin Film Forming Process

A sequence example of forming a thin film on the substrate as one step of a manufacturing process of a semiconductor device using the above-described substrate processing apparatus will be described with reference to FIG. 4A. In the following description, operations of respective units constituting the substrate processing apparatus are controlled by the controller 121.

In the film forming sequence shown in FIG. 4A, a process of forming a silicon oxide carbon film (hereinafter, referred to as "SiOC film") as a thin film containing Si, O, and C on the wafers 200 by performing a predetermined number of times (n times) a cycle including a process of supplying a BTCSM gas as a source gas containing Si, C, and Cl and having a Si—C bond to the wafers 200 as the substrate, a process of supplying an H$_2$O gas as an oxidizing gas to the wafers 200, and a process of supplying a pyridine gas as a catalyst gas to the wafers 200 is performed. The SiOC film may be referred to a SiO film containing C or a SiO film in which C is doped (added).

At this time, the process of supplying the BTCSM gas is performed in a state in which the process of supplying the pyridine gas has been performed, and the process of supplying the H$_2$O gas is performed in a state in which the process of supplying the pyridine gas has been performed.

In addition, after forming the SiOC film, a process of removing first impurities from the SiOC film by heating the SiOC film at a first temperature higher than a temperature of the wafers 200 in the process of forming the SiOC film, and a process of removing second impurities different from the first impurities from the SiOC film on which heat treatment has been performed at the first temperature by heating the SiOC film at a second temperature equal to or higher than the first temperature are further performed. The heat treatment is performed under an oxygen-free atmosphere, namely, under the oxygen-free atmosphere generated by supplying the N$_2$ gas as an oxygen-free gas to the wafers 200.

In addition, in the present embodiment, each process is performed under a non-plasma atmosphere.

Cases in which the term "wafer" is used in the present specification include a case of meaning the "wafer itself," a case of meaning the "wafer or a laminated body (assembly) of predetermined layers or films formed on a surface thereof," namely, a case of denoting the wafer including the predetermined layers or films formed on the surface thereof. In addition, in the present specification, cases in which the term "the surface of the wafer" is used include a case of meaning a "surface (exposed surface) of the wafer itself" or a case of meaning the "surface of the predetermined layers or films formed on the wafer, namely, the outermost surface of the wafer as a laminated body."

In the present specification, cases in which "a predetermined gas is supplied to the wafer" is described include a case of meaning that the "predetermined gas is directly supplied to a surface (exposed surface) of the wafer itself" or a case of meaning that the "predetermined gas is supplied to the layers or films formed on the wafer, namely, to the outermost surface of the wafer as the laminated body." In addition, in the present specification, cases in which "predetermined layers (or films) are formed on the wafer" is described include a case of meaning that the "predetermined layers (or films) are directly formed on the surface (exposed surface) of the wafer itself" or a case of meaning that the "predetermined layers (or films) are formed on the layers or films formed on the wafer, namely, on the outermost surface of the wafer as the laminated body."

In the present specification, a case in which the term "substrate" is used is the same as the case in which the term "wafer" is used, and in this case, the "wafer" may be substituted with the "substrate" in the above description.

Wafer Charge and Boat Load

When a plurality of wafers 200 are loaded (wafer charged) in the boat 217, the boat 217 that supports the plurality of wafers 200 is elevated by the boat elevator 115 to be loaded into (boat load) the processing chamber 201 as shown in FIG. 1. In this state, the seal cap 219 seals the lower end of the manifold 209 through the O-ring 220b.

Pressure Adjustment and Temperature Adjustment

The inside of the processing chamber 201, namely, a space in which the wafers 200 are present is vacuum-exhausted by the vacuum pump 246 so as to be set in a desired pressure (vacuum degree). At this time, the pressure in the processing chamber 201 is measured by the pressure sensor 245, and the APC valve 244 is feedback-controlled based on the measured pressure information. The vacuum pump 246 maintains a state of being operated at all times until at least processing on the wafers 200 is completed. In addition, the inside of the processing chamber 201 is heated by the heater 207 so as to be set at a desired temperature. At this time, the power supply state to the heater 207 is feedback-controlled based on the temperature information detected by the temperature sensor 263 so as to have a desired temperature distribution. Heating of the inside of the processing chamber 201 by the heater 207 is continuously performed until at least the processing on the wafers 200 is completed. However, in a case of performing the processing on the wafers 200 at room temperature as will be described later, the heating of the inside of the processing chamber 201 by the heater 207 may not be performed. Subsequently, rotation of the boat 217 and the wafers 200 by the rotation mechanism 267 is started. The rotation of the boat 217 and the wafers 200 by the rotation mechanism 267 is continuously performed until at least the processing on the wafers 200 is completed.

SiOC Film Formation Process

Next, the following two steps, namely, Step 1a and Step 2a are sequentially performed.

Step 1a (BTCSM Gas+Pyridine Gas Supply)

The valve 243a is opened to flow the BTCSM gas into the gas supply pipe 232a. The flow rate of the BTCSM gas is adjusted by the MFC 241a so that the BTCSM gas is supplied into the processing chamber 201 from the gas supply hole 250a and exhausted from the exhaust pipe 231. At this time, the BTCSM gas is supplied to the wafers 200. Simultaneously at this time, the valve 243j is opened to flow the N$_2$ gas into the gas supply pipe 232j. The flow rate of the N$_2$ gas is adjusted by the MFC 241j, so that the N$_2$ gas is supplied into the processing chamber 201 together with the BTCSM gas and exhausted from the exhaust pipe 231.

In addition, the valve 243c is opened to flow the pyridine gas into the gas supply pipe 232c. The flow rate of the pyridine gas is adjusted by the MFC 241c so that the pyridine gas is supplied into the processing chamber 201 from the gas supply hole 250c and exhausted from the exhaust pipe 231. At this time, the pyridine gas is supplied to the wafer 200. Simultaneously at this time, the valve 243l is opened to flow the N$_2$ gas into the gas supply pipe 232l. The flow rate of the N$_2$ gas is adjusted by the MCF 241l so that the N$_2$ gas is supplied into the processing chamber 201 together with the pyridine gas and exhausted from the exhaust pipe 231.

In addition, in order to prevent an invasion of the BTCSM gas and the pyridine gas into the buffer chamber 237 or the nozzle 249b, the valve 243k is opened to flow the N$_2$ gas into the gas supply pipe 232k. The N$_2$ gas is supplied into the processing chamber 201 through the gas supply pipe 232b, the nozzle 249b, and the buffer chamber 237, and exhausted from the exhaust pipe 231.

At this time, the APC valve 244 is properly adjusted to thereby maintain the pressure in the processing chamber 201 to be a pressure, for example in a range of 1 to 13,330 Pa, preferably, 133 to 2, 666 Pa. The supply flow rate of the BTCSM gas controlled by the MFC 241a is set, for example in a range of 1 to 2,000 sccm, preferably, 10 to 1,000 sccm. The supply flow rate of the pyridine gas controlled by the MFC 241c is set, for example, in a range of 1 to 2,000 sccm, preferably, 10 to 1,000 sccm. The supply flow rate of the N$_2$ gas controlled by the MFCs 241j to 241l is set, for example, in a range of 100 to 10,000 sccm. The time required for supplying the BTCSM gas and the pyridine gas to the wafers 200, namely, the gas supply time (irradiation time) is set, for example, in a range of 1 to 100 seconds, preferably, 5 to 60 seconds.

At this time, the temperature of the heater 207 is set so that the temperature of the wafers 200 is set, for example, in a range of equal to or higher than room temperature and equal to or less than 150° C., preferably, equal to or higher than the room temperature and equal to or less than 100° C., and more preferably, equal to or higher than 50° C. and equal to or less than 100° C. In a case in which the catalyst gas is not supplied while the BTCSM gas is supplied, the BTCSM is difficult to be chemically adsorbed on the wafers 200 when the temperature of the wafers 200 is less than 250° C., and therefore a practical film forming rate cannot be obtained. As in the present embodiment, by supplying the pyridine gas as the catalyst gas, it is possible to solve this problem even when the temperature of the wafers 200 is less than 250° C. In the presence of the pyridine gas, by setting the temperature of the wafers 200 to be 150° C. or less or 100° C. or less, the amount of heat applied to the wafers 200 may be reduced, thereby satisfactorily performing control of thermal history which the wafers 200 receive. In the presence of the pyridine gas, when the temperature of the wafers 200 is the room temperature or higher, the BTCSM may be sufficiently adsorbed on the wafers 200, thereby obtaining a sufficient film forming rate. Therefore, the temperature of the wafers 200 is set, for example, in a range of the room temperature or higher and 150° C. or less, preferably, the room temperature or higher and 100° C. or less, and more preferably, 50° C. higher and 100° C. or less.

By supplying the BTCSM gas to the wafers 200 under the above-described condition, a silicon-containing layer containing C and Cl with a thickness about less than one atomic layer to several atomic layers as a first layer is formed on the wafers 200 (an under layer of its surface). The silicon-containing layer containing C and Cl may be a Si layer containing C and Cl, or may be an adsorption layer of the BTCSM gas, or may include both of them.

The Si layer containing C and Cl is a general term including a continuous layer made of silicon (Si) and containing C and Cl, a discontinuous layer, and a Si thin film formed by overlap of these layers and containing C and Cl. The continuous layer made of Si and containing C and Cl is also called the Si thin film containing C and Cl in some cases. Si forming the Si layer containing C and Cl includes a case that a bond between C and Cl is not completely separated and also includes a case that the bond between C and Cl is completely separated.

The adsorption layer of the BTCSM gas includes an adsorption layer in which gas molecules of the BTCSM gas are continuous, and a discontinuous adsorption layer. Namely, the adsorption layer of the BTCSM gas includes an adsorption layer with a thickness of one molecular layer or less than one molecular layer composed of BTCSM molecules. A chemical structural formula of the BTCSM molecules forming the adsorption layer of the BTCSM gas is shown in FIG. 9A, and the BTCSM molecules include a case in which a bond of Si and C is partially separated or a case in which a bond of Si and Cl is partially separated. Namely, the adsorption layer of the BTCSM gas may be a physical adsorption layer of the BTCSM molecules, may be a chemical adsorption layer of the BTCSM molecules, or may include both of them.

Here, a layer with the thickness less than one atomic layer denotes an atomic layer discontinuously formed, and a layer with the thickness of one atomic layer denotes an atomic layer continuously formed. A layer with the thickness less than one molecular layer denotes a molecular layer discontinuously formed and a layer with the thickness of one molecular layer denotes a molecular layer continuously formed. The silicon-containing layer having C and Cl may include both of the Si layer containing C and Cl and the adsorption layer of the BTCSM gas. However, as described above, with regard to the silicon-containing layer having C and Cl, expressions such as "one atomic layer," "several atomic layers," and the like may be used.

When the thickness of the silicon-containing layer having C and Cl as the first layer formed on the wafers 200 exceeds several atomic layers, an oxidizing action in Step 2a to be described later does not reach the whole body of the first layer.

Further, a minimum value of the thickness of the first layer that can be formed on the wafer 200 is less than one atomic layer. Therefore, the thickness of the first layer is preferably set in a range of about less than one atomic layer to several atomic layers. By setting the thickness of the first layer to one atomic layer or less, namely, to one atomic layer or less than one atomic layer, an action of an oxidation reaction in Step 2a to be described later can be relatively increased, and the time required for the oxidation reaction in Step 2a can be shortened. The time required for forming the first layer in Step 1a can be shortened, too. As a result, a processing time per one cycle can be shortened, and the processing time in total can be shortened. Namely, the film forming rate can also be increased. Further, by setting the thickness of the first layer to one atomic layer or less, controllability of the uniformity of film thickness can also be improved.

The Si layer containing C and Cl is formed by deposition of Si on the wafer 200 under a condition that the BTCSM gas is self-decomposed, namely, a condition that a thermal decomposition reaction of the BTCSM occurs. The adsorption layer of the BTCSM gas is formed by adsorption of the BTCSM gas on the wafer 200 under a condition that the BTCSM gas is not self-decomposed, namely, a condition that the thermal decomposition reaction of the BTCSM does not occur. The film forming rate can be higher preferably in a case of forming the Si layer containing C and Cl on the wafer 200, than in a case of forming the adsorption layer of the BTCSM gas on the wafer 200. However, in the present embodiment, the temperature of the wafer 200 is set as a low temperature of, for example, 150° C. or less, and therefore there is a possibility that a case of forming the adsorption layer of the BTCSM gas on the wafer 200 is more advantageous than a case of forming the Si layer containing C and Cl on the wafer 200. In addition, when the catalyst gas is not supplied, there is a possibility that a bond for an under layer such as the surface of the wafer 200 and the like in the adsorption layer of the BTCSM gas or a bond between the BTCSM molecules is more advantageous in a state of physical adsorption, which is weaker than chemical adsorption, than in a state of the chemical adsorption. That is, when the catalyst gas is not supplied, there is a possibility that a most part of the adsorption layer of the BTCSM gas may be constituted of the physical adsorption layer of the BTCSM gas.

Figure 5A:
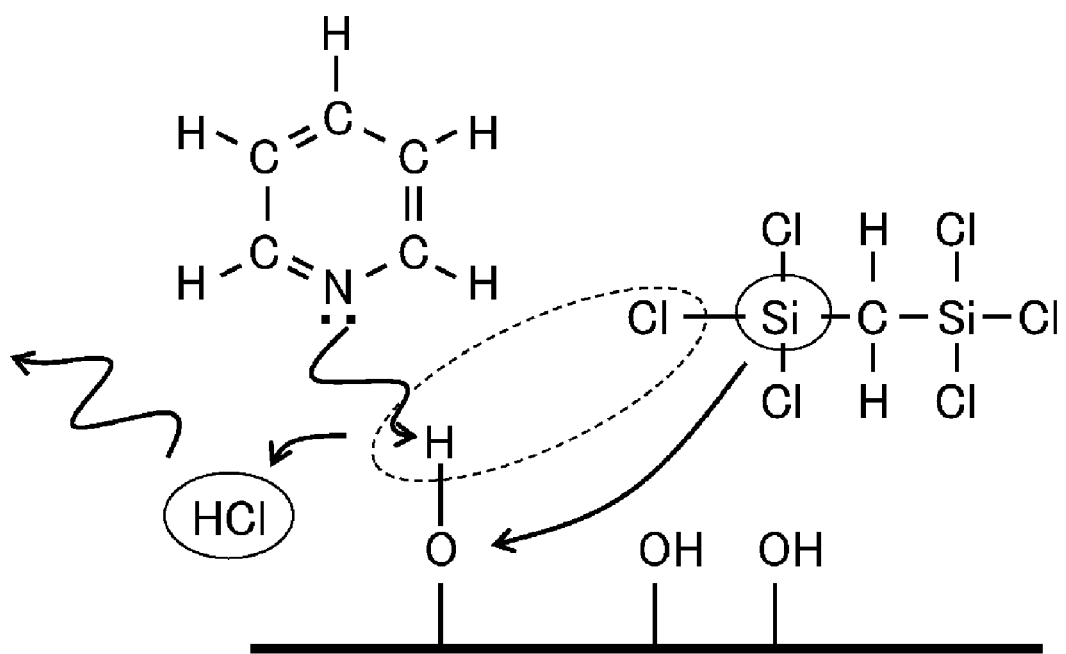

The pyridine gas functions as a catalyst gas which weakens a bonding power of an O—H bond existing on the surface of the wafer 200 to promote decomposition of the BTCSM gas and promote formation of the first layer by chemical absorption of the BTCSM molecules. For example, as shown in FIG. 5A, the pyridine gas acts on the O—H bond existing on the surface of the wafer 200 to weaken the bonding power between O—H. By reaction between H with the weakened bonding power and Cl of the BTCSM gas, gaseous substances containing Cl and H such as HCl are generated, and Cl is removed from the BTCSM molecules while H is removed from the surface of the wafer 200. The BTCSM molecules (halide) from which Cl is removed are chemically adsorbed on the surface of the wafer 200 or the like. Thus, a chemical adsorption layer of the BTCSM gas is formed on the surface of the wafer 200 or the like.

The pyridine gas weakens the bonding power between O—H due to an action in which N including a lone electron pair from the pyridine molecules pulls H. The magnitude of the action in which a predetermined compound containing N or the like pulls H uses the above-described acid dissociation constant (pKa) as one of indexes. As described above, the pKa is a constant obtained by indicating the equilibrium constant Ka by a negative common logarithm in a dissociation reaction in which an H ion is released from acid, and a compound having a large pKa has a large strength of pulling H. For example, by using a compound having at least 5 pKa as the catalyst gas, decomposition of the BTCSM gas is promoted to promote formation of the first layer. Meanwhile, when the pKa of the catalyst gas is excessively large, Cl withdrawn from the BTCSM molecule and the catalyst gas are bonded with each other, whereby salt (ion compound) such as ammonium chloride ($NH_4Cl$) and the like may be generated to be a particle source. In order to suppress this, the pKa of the catalyst gas is adjusted in a range of about 11 or less, preferably, 7 or less. The pyridine gas has a relatively large pKa of approximately 5.67, and has a strong force to pull H. In addition, since the pKa is 7 or less, particles are hardly generated.

Residual Gas Removal

After the first layer is formed, the valve 243a is closed and the supply of the BTCSM gas is stopped. In addition, the valve 243c is closed and the supply of the pyridine gas is stopped. In this instance, the inside of the processing chamber 201 is vacuum-exhausted by the vacuum pump 246 in a state in which the APC valve 244 is opened, and therefore the non-reacted BTCSM gas and pyridine gas remaining in the processing chamber 201 or the BTCSM gas and pyridine gas obtained after contributing to formation of the first layer are eliminated from the inside of the processing chamber 201. In addition, the supply of the $N_2$ gas into the processing chamber 201 is maintained in a state in which the valves 243j to 243l are opened. The $N_2$ gas acts as the purge gas, whereby an effect to eliminate the non-reacted BTCSM gas and pyridine gas remaining in the processing chamber 201 or the BTCSM gas and pyridine gas obtained after contributing to formation of the first layer may be increased.

In this instance, the gas remaining in the processing chamber 201 may not be completely eliminated, and the inside of the processing chamber 201 may not be completely purged. When the gas remaining in the processing chamber 201 is in a small amount, an adverse effect does not occur in Step 2a which is subsequently performed. It is not required to adjust the flow rate of the $N_2$ gas supplied into the processing chamber 201 to be a large flow rate, and for example, purge in the same level as when the adverse effect in Step 2a does not occur may be performed by supplying the same amount as a volume of the reaction tube 203 (processing chamber 201). In this manner, the inside of the processing chamber 201 is not completely purged, whereby the purge time is shortened to improve the throughput. It is also possible to suppress consumption of the $N_2$ gas to a minimum level.

As the source gas, for example, the BTCSE gas, the TCDMDS gas, the DCTMDS gas, and the like may be used other than the BTCSM gas. As the catalyst gas, for example, cyclic amine-based gases such as an aminopyridine gas, a picoline gas, a lutidine gas, a piperazine gas, a piperidine gas, and the like, chain amine-based gases such as a TEA gas, a DEA gas, an MEA gas, a TMA gas, an MMA gas, and the like, or non-amine-based gases such as an $NH_3$ gas and the like may be used other than the pyridine gas. As the inert gas, for example, rare gases such as an Ar gas, a He gas, an Ne gas, an Xe gas, and the like may be used.

Step 2a ($H_2O$ Gas+Pyridine Gas Supply)

After Step 1a is completed, the valve 243b is opened to flow the $H_2O$ gas into the gas supply pipe 232b. The flow rate of the $H_2O$ gas is adjusted by the MFC 241b, so that the $H_2O$ gas is supplied into the buffer chamber 237 from the gas supply holes 250b and exhausted from the exhaust pipe 231. At this time, the $H_2O$ gas is supplied to the wafer 200 under a non-plasma atmosphere. Simultaneously at this time, the valve 243k is opened to flow the $N_2$ gas into the gas supply pipe 232k. The flow rate of the $N_2$ gas is adjusted by the MFC 241k so that the $N_2$ gas is supplied into the processing chamber 201 together with the $H_2O$ gas and exhausted from the exhaust pipe 231.

In addition, like the supply of the pyridine gas in Step 1a, the pyridine gas is supplied to the wafer 200.

In addition, in order to prevent invasion of the $H_2O$ gas and the pyridine gas into the nozzle 249a, the valve 243j is opened to flow the $N_2$ gas into the gas supply pipe 232j. The $N_2$ gas is supplied into the processing chamber 201 via the gas supply pipe 232a and the nozzle 249a, and exhausted from the exhaust pipe 231.

At this time, the APC valve 244 is properly adjusted to thereby maintain the pressure in the processing chamber 201 to be the pressure, for example in a range of 1 to 13,330 Pa, preferably, 133 to 2,666 Pa. The supply flow rate of the $H_2O$ gas controlled by the MFC 241b is set, for example in a range of 1,000 to 10,000 sccm, preferably, 10 to 1,000 sccm. The supply flow rate of the pyridine gas controlled by the MFC 241c is set, for example, in a range of 1 to 2,000 sccm, preferably, 10 to 1,000 sccm. The supply flow rate of the $N_2$ gas controlled by the MFCs 241j to 241l is set, for example, in a range of 100 to 10,000 sccm. The time required for supplying the $H_2O$ gas and the pyridine gas to the wafers 200, namely, the gas supply time (irradiation time) is set, for example, in a range of 1 to 100 seconds, preferably, 5 to 60 seconds. The temperature of the heater 207 is set such that the temperature of the wafer 200 is in a similar temperature zone to the temperature of the wafer 200 in Step 1a, for example, in a range of equal to or higher than room temperature and equal to or less than 150° C., preferably, equal to or higher than the room temperature and equal to or less than 100° C., and more preferably, equal to or higher than 50° C. and equal to or less than 100° C.

The $H_2O$ gas supplied into the processing chamber 201 is activated by heat and exhausted from the exhaust pipe 231. At this time, the $H_2O$ gas activated by heat is supplied to the wafer 200. The gas flowing into the processing chamber 201 is the $H_2O$ gas which is thermally activated, and the BTCSM gas does not flow into the processing chamber 201. Thus, the $H_2O$ gas does not cause a gas phase reaction, is supplied to the wafer 200 in a state of being activated, and reacts with at least a part of the first layer (silicon-containing layer including C and Cl) formed on the wafer 200 in Step 1a. Thus, the first layer is thermally oxidized into the non-plasma to be converted into a second layer including Si, O, and C, namely, a SiOC layer.

Figure 5B:
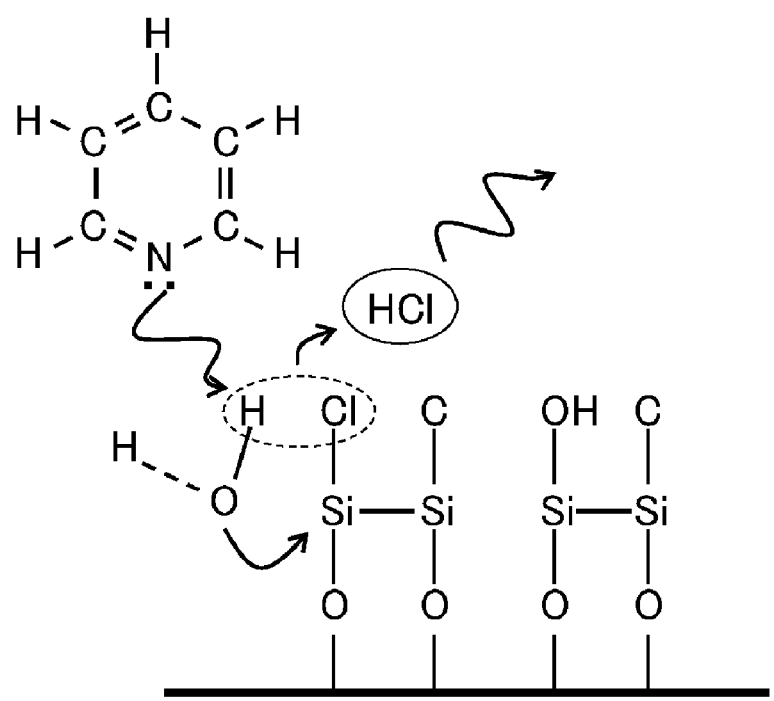

The pyridine gas acts as the catalyst gas which weakens the bonding power of O—H bond included in the $H_2O$ gas to promote decomposition of the $H_2O$ gas and promote a reaction between the $H_2O$ gas and the first layer. For example, as shown in FIG. 5B, the pyridine gas acts on the O—H bond included in the $H_2O$ gas to weaken the bonding power between O—H. By reaction between H with the weakened bonding power and Cl included in the first layer formed on the wafer 200, gaseous substances containing Cl and H such as HCl are generated, and Cl is desorbed from the first layer while H is desorbed from the $H_2O$ molecules. O of the $H_2O$ gas from which H is desorbed is bonded with Si of the first layer in which Cl is desorbed and at least a part of C remains.

In a process of supplying the $H_2O$ gas (process of supplying the $H_2O$ gas and the pyridine gas) in a state in which the supply of the pyridine gas is performed, an supply amount of the pyridine gas to be supplied may be appropriately adjusted in accordance with a desired film composition and the like. When the supply amount of the pyridine gas is increased, action of the pyridine gas is increased to improve oxidation power of the $H_2O$ gas, and a Si—C bond is cut so that C is easily desorbed, and consequently, a C concentration in the SiOC layer is decreased. When the supply amount of the pyridine gas is reduced, action of the pyridine gas is weakened to degrade oxidation power of the $H_2O$ gas, and the Si—C bond is easily maintained, and consequently, the C concentration in the SiOC layer is increased. Therefore, by appropriately adjusting the supply amount of the pyridine gas, the C concentration, a Si concentration, or an O concentration in the SiOC layer, namely, a SiOC film formed by laminating the SiOC layers may be relatively changed.

The supply amount of the pyridine gas to be supplied in the process of supplying the $H_2O$ gas (process of supplying the $H_2O$ gas and the pyridine gas) in a state in which the supply of the pyridine gas has been performed, and the supply amount of the pyridine gas to be supplied in the process of supplying the BTCSM gas (process of supplying the BTCSM gas and the pyridine gas) in the state in which the above-described supply of the pyridine gas has been performed may be adjusted separately from each other. For example, the supply amounts of the pyridine gas in both processes may be adjusted equally or unequally.

By preparing a plurality of process recipes (programs in which process sequences or process conditions are described) in which the supply amount or the flow rate of the pyridine gas is set as different numeral values in advance, adjustment of the supply amount of the pyridine gas becomes easy. An operator (operation source) may perform a film forming process by appropriately selecting an appropriate process recipe in accordance with a desired film composition and the like.

As in the present embodiment, when forming the SiOC layer under a low temperature condition, for example, of 150° C. or less, impurities (first impurities) such as water ($H_2O$) or Cl, or hydrocarbon ($C_xH_y$)-based impurities (second impurities) such as a hydrocarbon compound are easily mixed in the SiOC layer. Namely, the impurities such as wafer or Cl, or $C_xH_y$-based impurities may be largely included in the SiOC film obtained in such a manner that the SiOC layers are laminated. The impurities such as water is derived from the $H_2O$ gas used as the oxidizing gas or water invading from the outside when loading the wafers 200 into the processing chamber 201. The impurities such as Cl are derived from Cl in the BTCSM molecules. The $C_xH_y$-based impurities are derived from C and H from the BTCSM molecules or C and H from the pyridine molecules.

Residual Gas Removal

Next, the valve 243b is closed and the supply of the $H_2O$ gas is stopped. In addition, the valve 243c is closed and the supply of the pyridine gas is stopped. At this time, the inside of the processing chamber 201 is vacuum-exhausted by the vacuum pump 246 in a state in which the APC valve 244 is opened, and thus the non-reacted $H_2O$ gas or pyridine gas remaining in the processing chamber 201, or the $H_2O$ gas, the pyridine gas, or reaction byproducts obtained after contributing to the reaction are eliminated from the processing chamber 201. In addition, the supply of the $N_2$ gas into the processing chamber 201 is maintained in the state in which the valves 243j to 243l are opened. The $N_2$ gas acts as the purge gas, whereby an effect to eliminate, from the inside of the processing chamber 201, the non-reacted $H_2O$ gas or pyridine gas remaining in the processing chamber 201, or the $H_2O$ gas, the pyridine gas, or the reaction byproducts obtained after contributing to formation of the second layer may be increased.

At this time, the gas remaining in the processing chamber 201 may not be completely eliminated, and the inside of the processing chamber 201 may not be completely purged. When the gas remaining in the processing chamber 201 is in a small amount, an adverse effect does not occur in Step 1a which is subsequently performed. It is not required to adjust the flow rate of the $N_2$ gas supplied into the processing chamber 201 to be a large flow rate, and for example, purge in the same level as when the adverse effect in Step 1a does not occur may be performed by supplying the same amount as the volume of the reaction tube 203 (processing chamber 201). In this manner, the inside of the processing chamber 201 is not completely purged, whereby the purge time is shortened to improve the throughput. It is possible to suppress consumption of the $N_2$ gas to a minimum level.

As the oxidizing gas, a hydrogen peroxide ($H_2O_2$) gas, a hydrogen ($H_2$) gas, a hydrogen ($H_2$) gas+an oxygen ($O_2$) gas, a hydrogen ($H_2$) gas+an ozone ($O_3$) gas, and the like may be used other than the $H_2O$ gas. In addition, a gas without containing H, for example, an $O_2$ gas and the like may be used alone. As the catalyst gas, the above-described various amine-based gases or non-amine-based gases may be used other than the pyridine gas. As the inert gas, the above-described various rare gases may be used other than the $N_2$ gas.

According to the present inventor and the like, based on overall judgment within the gas system and the condition range in the present embodiment, the pyridine gas is more preferably considered to be the catalyst gas through each process. Subsequently, the TEA gas is preferably considered to be the catalyst gas, and subsequently, the piperidine gas is preferably considered to be the catalyst gas.

Execution of Predetermined Number of Times

The above-described Steps 1a and 2a are set as one cycle, and by executing this cycle at least once, namely, a predetermined number of times (n times), a predetermined composition and a SiOC film with a predetermined film thickness may be formed on the wafer 200. The above-described cycle is preferably repeated a plurality of times. Namely, by making a thickness of the SiOC layer formed per one cycle smaller than a desired film thickness, the above-described cycle is preferably repeated the plurality of times until obtaining the desired film thickness.

At this time, by controlling processing conditions such as the pressure in the processing chamber 201, a gas supply time, and the like in each step, each element component of the SiOC layer, namely, a ratio of a Si component, an O component, and a C component, namely, a Si concentration, an O concentration, and a C concentration can be finely adjusted, and a composition ratio of the SiOC film can be more precisely controlled.

When the cycle is executed the plurality of times, a part described as "a predetermined gas is supplied to the wafer 200" in each step after at least two cycles means that "the predetermined gas is supplied to a layer formed on the wafer 200, namely, the outermost surface of the wafer 200 as a laminated body," and a part described as "a predetermined layer is formed on the wafer 200" means that "the predetermined layer is formed on the layer formed on the wafer 200, namely, on the outermost surface of the wafer 200 as the laminated body." This point is the same as the above. This point is also the same as in other embodiments to be described later.

SiOC Film Modification Process

As described above, impurities such as water or $C_1$ or $C_xH_y$-based impurities may be mixed in the SiOC film formed under the low temperature condition of 150° C. or less. When these impurities are mixed in the SiOC film, etching resistance of the SiOC film is degraded, and a dielectric constant thereof is increased. Namely, there is a case in which an effect in which C in the film is added cannot be obtained.

Therefore, in the present embodiment, a process (first heat treatment process) of removing the first impurities (impurities such as water, Cl, or the like) from the SiOC film by heating the SiOC film at a first temperature higher than the temperature of the wafer 200 in the process of forming the SiOC film; and a process (second heat treatment process) of removing the second impurities ($C_xH_y$-based impurities) different from the first impurities from the SiOC film on which heat treatment has been performed by heating the SiOC film at a second temperature equal to or higher than the first temperature are performed, and a modification process of removing a plurality of kinds of impurities from the SiOC film in at least two stages. Namely, the process of modifying the SiOC film so-called an annealing process is performed in two stages. Hereinafter, a sequence example of the SiOC film modification process will be described.

Pressure Adjustment and Temperature Adjustment

The inside of the processing chamber 201, namely, a space in which the wafers 200 exist is vacuum-exhausted by the vacuum pump 246 while the APC valve 244 is feedback-controlled so as to be set in a desired pressure (vacuum degree). In addition, the wafer 200 in the processing chamber 201 is heated by the heater 207 so as to obtain a desired temperature, namely, the first temperature. At this time, the power supply state to the heater 207 is feedback-controlled based on the temperature information detected by the temperature sensor 263 so that the inside of the processing chamber 201 has a desired temperature distribution. Even in this process, the boat 217 and the wafers 200 continue to be rotated by the rotation mechanism 267.

In addition, the inside of the processing chamber 201 is adjusted to an oxygen-free atmosphere by supplying the $N_2$ gas as the oxygen-free gas into the processing chamber 201. At this time, the $N_2$ gas may be supplied using at least one or all of the gas supply pipes 232j to 232l. Here, the $N_2$ gas is supplied using, for example, all of the gas supply pipes 232j to 232l. Namely, the valves 243j to 243l are opened to flow the $N_2$ gas into the gas supply pipes 232j to 232l. The flow rate of the $N_2$ gas is adjusted by the MFCs 241j to 241l so that the $N_2$ gas is supplied into the processing chamber 201 from the gas supply holes 250a, 250c, and 250d, and exhausted from the exhaust pipe 231. Thus, the inside of the processing chamber 201 becomes an $N_2$ gas atmosphere, namely, an oxygen-free atmosphere. The $N_2$ gas also acts as a heat treatment gas later.

First Heat Treatment

When the inside of the processing chamber 201 becomes the $N_2$ gas atmosphere having a desired pressure and the temperature of the wafer 200 becomes a desirable temperature, namely, the first temperature, this state is maintained for a predetermined time, and first heat treatment is performed on the SiOC film formed on the wafer 200.

At this time, the APC valve 244 is properly adjusted to thereby maintain the pressure in the processing chamber 201 to be a pressure, for example in a range of 133 to 101,325 Pa (1 to 760 Torr), preferably, 10,132 to 101,325 Pa (76 to 760 Torr). The supply flow of the $N_2$ gas controlled by the MFCs 241j to 241l is set in a range of, for example, to 100 to 10,000 sccm. The time required for heat treatment on the SiOC film on the wafer 200 is set as a time in a range, for example, 1 to 60 minutes, preferably, 1 to 30 minutes, and more preferably, 1 to 10 minutes.

At this time, the temperature of the heater 207 is set such that the temperature of the wafer 200 is a first temperature higher than the temperature of the wafer 200 in the process of forming the above-described SiOC film. Specifically, the temperature of the wafer 200 is room temperature or a temperature of 150° C. or higher, and for example, the temperature of the wafer 200 is set to be a temperature in a range of 300° C. or higher and 450° C. or less, preferably 300° C. or higher and 400° C. or less, and more preferably 300° C. or higher and 350° C. or less. In this manner, a temperature range is determined after considering that the impurities such as water or Cl as the first impurities are efficiently or sufficiently desorbed and removed from the SiOC film without causing occurrence of an undesirable reaction (oxidization or the like of SiOC film).

Figure 12A:
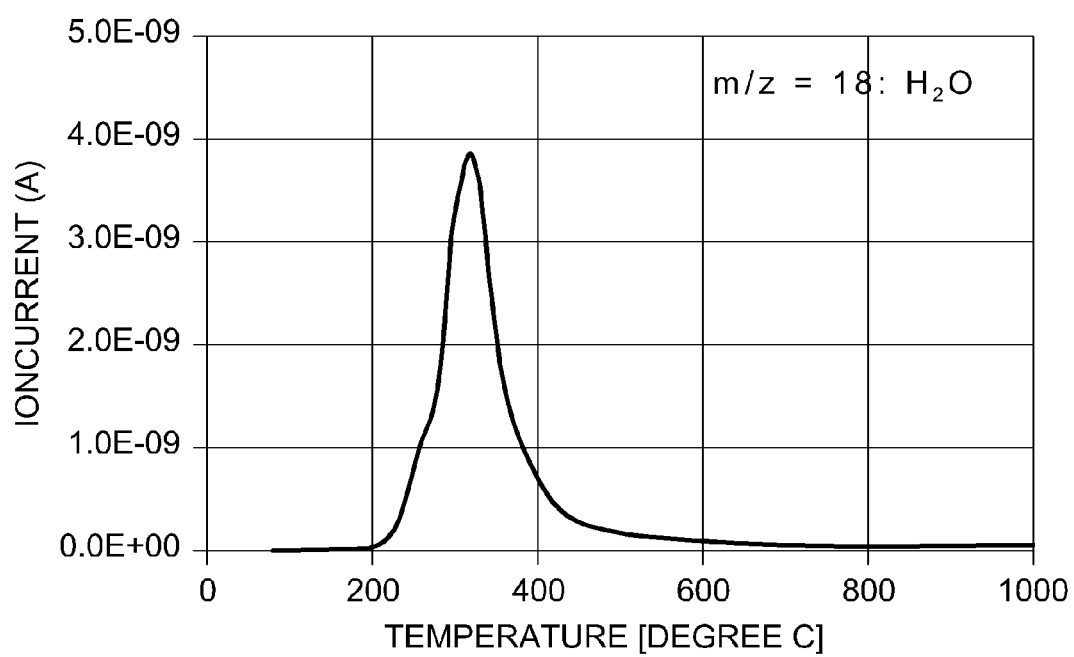
Figure 12B:
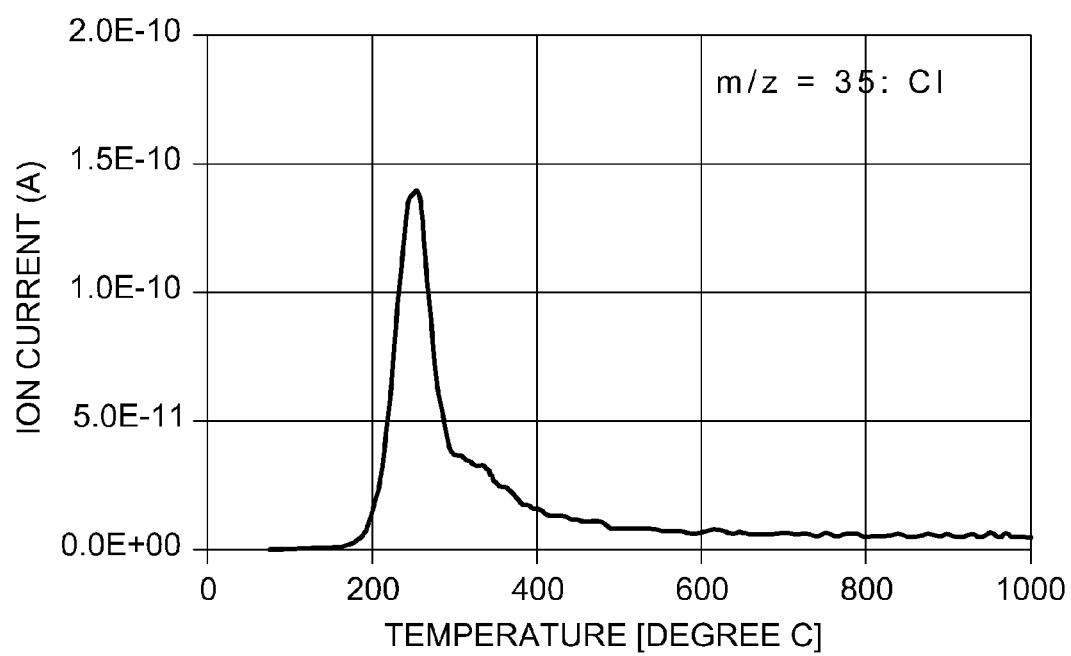
Figure 12C:
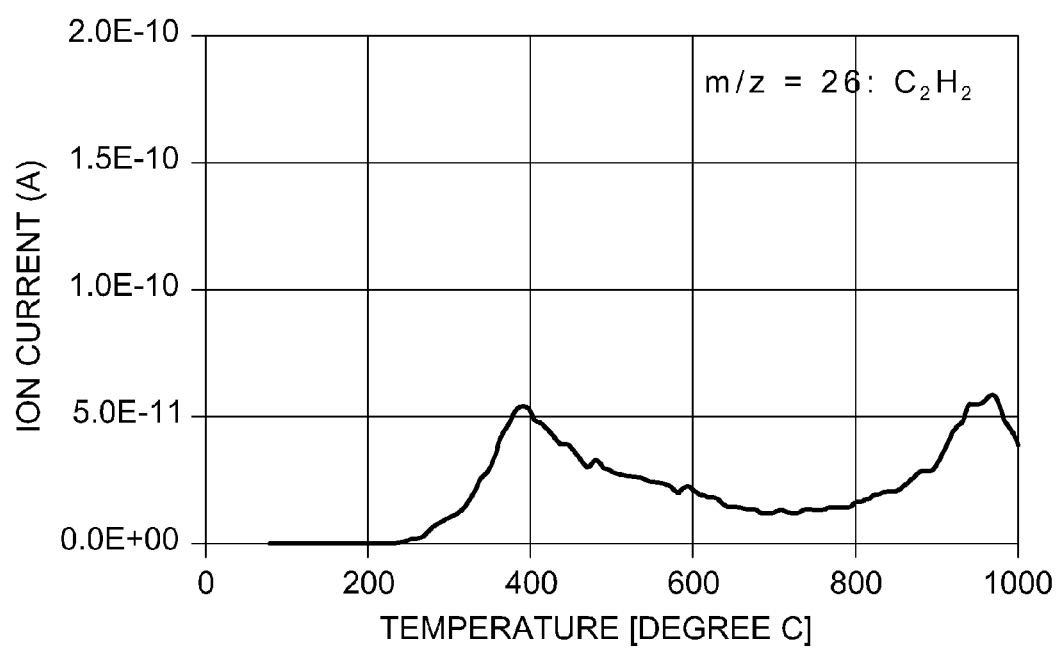

FIGS. 12A through 12C are diagrams illustrating a desorption spectrum using thermal desorption gas spectroscopy (TDS) of the SiOC film before heat treatment which is formed by the film forming sequence of the present embodiment, wherein FIG. 12A illustrates a desorption spectrum of water ($H_2O$), FIG. 12B illustrates a desorption spectrum of Cl, and FIG. 12C illustrates a desorption spectrum of $C_2H_2$. A horizontal axis of the FIGS. 12A through 12C indicates a temperature (° C.) of the wafer 200 when performing heat treatment, and a vertical axis thereof indicates an ion current value (A).

As shown in FIGS. 12A and 12B, when the temperature of the wafer 200 is below 300° C., it is difficult to desorb and remove the impurities such as water, Cl, or the like, particularly, water from the SiOC film, whereby a modification effect of the SiOC film may be degraded. For example, when the temperature of the wafer 200 is 150° C. or less, the impurities such as water or Cl are hardly desorbed from the SiOC film. The impurities such as water or Cl may be sufficiently desorbed from the SiOC film to be removed by setting the temperature of the wafer 200 to be 300° C. or higher.

However, when the temperature of the wafer 200 exceeds 450° C., the SiOC film may be oxidized by a reaction of water and Cl when water or Cl is desorbed from the SiOC film. A film shrinking rate of the SiOC film is increased by the oxidization of the SiOC film.

In addition, when water reacts with Cl in this temperature zone, namely, in the temperature zone exceeding 450° C., HCl is generated, and a Si—Cl bond, a Si—H bond, or the like included in the SiOC film may be separated by the generated HCl. When these bonds are separated, an unnecessary adsorption site is generated in the SiOC film, and therefore re-adsorption of substances (desorbed substances) desorbed from the SiOC film onto the adsorption site may be caused. Namely, the desorbed substances from the SiOC film are adsorbed onto Si including a dangling bond (non-bond) in such a manner that a bond with Cl or H is separated. The bond of the Si formed in this manner and the desorbed substances is unstable and weak. Thus, the desorbed substances do not become components constituting the SiOC film but remain in the SiOC film as impurities. As the desorbed substances, water, Cl, $C_xH_y$-based impurities, substances decomposed by these, and the like may be given.

In addition, in this temperature zone, namely, in the temperature zone exceeding 450° C., even the $C_xH_y$-based impurities are desorbed from the SiOC film as shown in FIG. 12C. In addition, when the desorbed $C_xH_y$-based impurities pass through the SiOC film, re-adsorption of C onto an adsorption site of the SiOC film may be caused by a reaction of the desorbed $C_xH_y$-based impurities with Cl. Namely, C derived from the $C_xH_y$-based impurities is adsorbed onto any one element (atom) constituting the SiOC film, namely, the dangling bond of Si by the reaction between the $C_xH_y$-impurities and Cl. The bond of C and Si formed in this manner is unstable and weak. Thus, C derived from the $C_xH_y$-impurities do not become a component constituting the SiOC film but remains in the SiOC film as impurities. When C is re-adsorbed onto the adsorption site of the SiOC film, there are cases in which C alone is re-absorbed onto the adsorption site, or in which C in the form of $C_xH_y$ is re-adsorbed onto the adsorption site.

Namely, in this temperature zone, namely, in the temperature zone exceeding 450° C., the film shrinking rate of the SiOC film is increased by the above-described undesirable reaction, and the impurities cannot be sufficiently desorbed and removed from the SiOC film. Consequently, a dielectric constant (k value) of the SiOC film cannot be sufficiently reduced.

By setting the temperature of the wafer 200 to be 300° C. or higher and 450° C. or less, the impurities such as water or Cl may be sufficiently desorbed and removed from the SiOC film while suppressing the above-described undesirable reaction. Namely, when water, Cl, or the like is desorbed from the SiOC film, oxidization of the SiOC film by the reaction of water and Cl may be suppressed, and an increase in the film shrinking rate of the SiOC film may be suppressed. In addition, generation of HCl by the reaction of water and Cl may be suppressed and separation of the Si—Cl bond or the Si—H bond of the SiOC film by HCl may be suppressed. Consequently, generation of the unnecessary adsorption site of the SiOC film may be suppressed, thereby suppressing re-adsorption of desorbed substances onto the adsorption site. In addition, the reaction of $C_xH_y$-based impurities with Cl may be suppressed when the $C_xH_y$-based impurities are desorbed from the SiOC film, thereby suppressing re-adsorption of C onto the adsorption site of the SiOC film. In addition, as shown in FIG. 12C, when the temperature of the wafer 200 is approximately 400° C., a desorption amount of $C_xH_y$-based impurities becomes a peak. Therefore, by setting the temperature of the wafer 200 to be 400° C. or less, preferably to be 350° C. or less, desorption of the $C_xH_y$-based impurities may be suppressed. Namely, a desorption amount of the $C_xH_y$-based impurities may be reduced. Thus, an absolute amount of the $C_xH_y$-based impurities desorbed from the SiOC film may be reduced, thereby further suppressing re-adsorption of C by the reaction of the $C_xH_y$-based impurities with Cl.

Namely, by adjusting the temperature of the wafer 200 to be the above-described temperature zone, namely, 300° C. or higher and 450° C. or less, the film shrinking rate of the SiOC film may be reduced, re-absorption of desorbed substances including C or $C_xH_y$ desorbed from the SiOC film onto the adsorption site of the SiOC film may be suppressed, and the impurities, particularly, impurities such as water or Cl may be sufficiently desorbed and removed from the SiOC film.

In addition, by adjusting the temperature of the wafer 200 to be the above-described temperature zone, namely, 300° C. or higher and 450° C. or less, the above-described impurities such as water or Cl may be desorbed and removed from the SiOC film, and at least a part of the $C_xH_y$-based impurities may be desorbed and removed. In addition, at this time, in such a temperature zone, reaction between the $C_xH_y$-based impurities desorbed from the SiOC film and Cl may be suppressed, thereby suppressing re-absorption of C onto the adsorption site of the SiOC film. Namely, by adjusting the temperature of the wafer 200 to be such a temperature zone, C in the $C_xH_y$-based impurities desorbed from the SiOC film once may be suppressed from being re-absorbed onto the adsorption site of the SiOC film.

As described above, the temperature of the wafer 200 may be set to be a temperature in a range of 300° C. or higher and 450° C. or less, preferably, 300° C. or higher and 400° C. or less, more preferably, 300° C. or higher and 350° C. or less.

By performing the first heat treatment on the SiOC film under the above-described condition, the above-described undesirable reaction may be suppressed, and the impurities such as water or Cl of the SiOC film may be sufficiently desorbed and removed from the SiOC film. At least a part of the $C_xH_y$-based impurities may be desorbed and removed from the SiOC film while suppressing the above-described undesirable reaction. These impurities of the SiOC film are removed from the SiOC film, and therefore the SiOC film may be modified. Thus, etching resistance of the SiOC film may be increased compared to the SiOC film before performing the first heat treatment, and a dielectric constant thereof may be reduced to thereby improve a film quality (film properties) of the SiOC film.

However, in the step in which the first heat treatment is completed, namely, in the step in which the impurities such as water or Cl are sufficiently removed from the SiOC film, the $C_xH_y$-based impurities may remain in the SiOC film. Namely, in such a temperature zone, the impurities such as water or Cl or the $C_xH_y$-based impurities are desorbed and removed from the SiOC film, but the impurities such as water or Cl are previously removed prior to the $C_xH_y$-based impurities, and therefore in the step in which the most of the impurities such as water or Cl is removed, the $C_xH_y$-based impurities may still remain in the SiOC film. Also, in this step, the k value of the SiOC film may not be sufficiently reduced due to the $C_xH_y$-based impurities remaining in the SiOC film. Thus, in the second heat treatment process to be described later, by heating the SiOC film at the second temperature equal to or higher than the first temperature, the $C_xH_y$-based impurities remaining in the SiOC film may be removed from the SiOC film on which heat treatment has been performed at the first temperature. Consequently, the k value of the SiOC film may be sufficiently reduced.

Second Heat Treatment

After the first heat treatment is completed, namely, after the impurities such as water or Cl are sufficiently desorbed and removed from the SiOC film, the temperature of the wafer 200 is changed from the first temperature to the second temperature. The second temperature is set to be equal to or higher than the first temperature. Namely, the second temperature is set to be equal to or higher than the first temperature. An atmosphere in the processing chamber 201 is maintained as the $N_2$ gas atmosphere having a desired pressure like the first heat treatment process.

When the temperature of the wafer 200 becomes the desirable temperature namely, the second temperature, this state is maintained for a predetermined time, and the second heat treatment is performed on the SiOC film on which the first heat treatment has been performed. Namely, the second heat treatment is performed at the second temperature on the SiOC film to which the first heat treatment has been performed at the first temperature.

At this time, the pressure inside the processing chamber 201 is set in a range of 133 to 101,325 Pa (1 to 760 Torr), preferably, 10,132 to 101,325 Pa (76 to 760 Torr) by appropriately adjusting the APC valve 244. A supply flow of the $N_2$ gas controlled by the MFCs 241j to 241l is set to be a flow rate in a range of 100 and 10,000 sccm. A time required for performing heat treatment with respect to the SiOC film on the wafer 200 is set to be a time in a range of 1 and 120 minutes, preferably, 1 and 60 minutes, and more preferably, 1 to 30 minutes.

At this time, the temperature of the heater 207 is set such that the temperature of the wafer 200 is the second temperature equal to or higher than the first temperature in the above-described first heat treatment process. Specifically, the temperature of the wafer 200 is set to be a temperature equal to or higher than the first temperature, and a temperature in a range of 300° C. or higher and 900° C. or less, preferably, 350° C. or higher and 700° C. or less, more preferably, 400° C. or higher and 700° C. or less, and also preferably 450° C. or higher and 600° C. or less. Such a temperature range is determined after considering that the $C_xH_y$-based impurities as the second impurities are efficiently and sufficiently desorbed and removed from the SiOC film, or considering a heat load or a thermal history which the wafer 200 receives.

As shown in FIG. 12C, when the temperature of the wafer 200 is below 300° C., it is difficult to desorb and remove the $C_xH_y$-based impurities such as $C_2H_2$ from the SiOC film, whereby a modification effect of the SiOC film may be degraded. For example, when the temperature of the wafer 200 is 200° C. or less, the $C_xH_y$-based impurities are hardly desorbed from the SiOC film. The $C_xH_y$-based impurities may be sufficiently desorbed from the SiOC film to be removed by setting the temperature of the wafer 200 to be 300° C. or higher. However, when the temperature of the wafer 200 is set to be 300° C., it may take time for sufficiently desorb the $C_xH_y$-based impurities from the SiOC film. By setting the temperature of the wafer 200 to be 350° C. or higher, a time during which the $C_xH_y$-based impurities are sufficiently desorbed from the SiOC film may be shortened. In addition, when the temperature of the wafer 200 is approximately 400° C., a desorption amount of the $C_xH_y$-based impurities becomes a peak. Thus, by setting the temperature of the wafer 200 to be 400° C. or higher, desorption of the $C_xH_y$-based impurities may be promoted. Namely, the $C_xH_y$-based impurities may be efficiently desorbed from the SiOC film. In addition, a time until the $C_xH_y$-based impurities are sufficiently desorbed from the SiOC film may be further shortened.

Since the impurities such as water or Cl have been already removed from the SiOC film in the process of performing the second heat treatment, the above-described undesirable reaction may not occur. Namely, the undesirable reactions such as the oxidization of the SiOC film by the reaction between water and Cl, an increase in the film shrinking rate of the SiOC film caused by the oxidization, generation of HCl due to the reaction between water and Cl, separation of the Si—Cl bond or the Si—H bond in the SiOC film due to HCl, generation of the unnecessary adsorption site due to the separation, re-adsorption of the desorbed substances onto the adsorption site, re-adsorption of C onto the adsorption site due to the reaction between the $C_xH_y$-based impurities and Cl, and the like do not occur. This is because the second temperature includes the temperature zone (exceeding 450° C.) in which the undesirable reaction may occur, but substances for causing occurrence of the undesirable reaction (water, Cl, or the like) are not generated when performing the second heat treatment. In addition, it is also desirable to promote desorption of the $C_xH_y$-based impurities from the SiOC film by setting the temperature of the wafer 200 to be a temperature equal to higher than 450° C. The desorption of the $C_xH_y$-based impurities from the SiOC film may be promoted by setting the temperature of the wafer 200 to be the temperature equal to or higher than 450° C. compared to when setting the temperature of the wafer 200 to be the temperature in a range of 300° C. and 350° C.

When the temperature of the wafer 200 exceeds 900° C., the heat load may become excessively large to affect electrical characteristics and the like of a semiconductor device formed on the wafer 200. The effect on the electrical characteristics and the like due to the heat load may be suppressed by setting the temperature of the wafer 200 to be a temperature equal to or less than 900° C. When the wafer 200 in which the SiOC film on which heat treatment is to be performed is formed is suitable for a memory device, the wafer may withstand heat at approximately 900° C. In addition, even when the wafer 200 is suitable for a logic device, the wafer may withstand heat at approximately 700° C. When setting the temperature of the wafer 200 to be a temperature of 600° C. or less, thermal damages in a device structure and the like can be more reliably avoided.

As described above, the temperature of the wafer 200 should be set to be a temperature in a range of 300° C. or higher and 900° C. or less, preferably 350° C. or higher and 700° C. or less, more preferably 400° C. or higher and 700° C. or less, and still more preferably 450° C. or higher and 600° C. or less. Namely, the second temperature may be equal to or higher than the first temperature.

For example, when the first temperature is 300° C. or higher and 400° C. or less, and the second temperature is 450° C. or higher and 600° C. or less, the above-described undesirable reaction in each of the first heat treatment process and the second heat treatment process may be surely prevented. Particularly, the undesirable reaction in the first heat treatment may be surely prevented by setting the first temperature to be a temperature in a range of 300° C. and 400° C. In addition, the substances (water, Cl, or the like) that cause occurrence of the undesirable reaction are not generated when performing the second heat treatment process by setting the second temperature to be a temperature of 450° C. and 600° C., namely, even in the temperature zone in which the undesirable reaction may occur, thereby reliably preventing occurrence of the undesirable reaction. In addition, the desorption of the $C_xH_y$-based impurities from the SiOC film may be more rapidly performed by setting the second temperature to be a temperature in a range of 450° C. and 600° C., namely, a temperature exceeding the first temperature.

In addition, the first temperature and the second temperature may be set to be the same temperature in a range of 400° C. and 450° C. When the first temperature and the second temperature are the same temperature in a range of 400° C. and 450° C., the undesirable reaction described in the first heat treatment process and the second heat treatment process may be surely prevented. In addition, when the first temperature and the second temperature are the same temperature, the temperature of the wafer 200 between the first heat treatment process and the second heat treatment process, namely, the temperature inside the processing chamber 201 [temperature of the heater 207] may not need to be changed (adjusted). Namely, there is no need to wait till the temperature inside the processing chamber 201 between the first heat treatment process and the second heat treatment process becomes stable. Therefore, these processes may be consecutively performed, and the temperature control of the heat treatment may be simplified.

By performing the second heat treatment on the SiOC film under the above-described condition, the $C_xH_y$-based impurities in the SiOC film may be sufficiently desorbed and removed from the SiOC film while suppressing the undesirable reaction. As the impurities in the SiOC film are removed from the SiOC film, the SiOC film is further modified, and therefore etching resistance of the SiOC film may be further increased than the SiOC film on which the first heat treatment has been performed and the second heat treatment is not yet performed, and a dielectric constant thereof may be further decreased. That is, the film quality (film property) of the SiOC film may be further improved. According to techniques of the present embodiment, the dielectric constant (k value) of the SiOC film may be decreased, for example up to about 2.7.

As described above, in the present embodiment of the present invention, the heat treatment is performed with respect to the SiOC film in the temperature zone (first temperature zone) in which the undesirable reaction does not occur. Thus, the undesirable reaction does not occur, and the impurities (first impurities) such as water or Cl as substances for causing occurrence of the undesirable reaction are removed from the SiOC film. In addition, after the impurities (first impurities) such as water or Cl as the substances for causing occurrence of the undesirable reaction are removed from the SiOC film, the heat treatment is performed with respect to the SiOC film under the atmosphere in which the impurities (first impurities) such as water or Cl as the substances for causing occurrence of the undesirable reaction do not exist (generated) in the temperature zone (second temperature zone) including the temperature zone in which the undesirable reaction may occur. Thus, the undesirable reaction does not occur, and the $C_xH_y$-based impurities (second impurities) are removed from the SiOC film on which the heat treatment has been performed in the first temperature zone (first temperature zone) in which the undesirable reaction does not occur.

The heat treatment in the present embodiment may referred to as two step heat treatment (multi-step heat treatment). Also, the heat treatment may be referred to as two step annealing (multi-step annealing), two step modification process (multi-step modification process), two step impurity removal process (multi-step impurity removal process), and the like.

In the first heat treatment process and the second heat treatment process, the inside of the processing chamber 201 is adjusted to be an oxygen-free atmosphere by the $N_2$ gas as the oxygen-free gas. Here, the oxygen-free atmosphere includes not only a state in which the oxidizing gas (O component) does not exist in the atmosphere inside the processing chamber 201 but also a state in which a concentration of the oxidizing gas (O concentration) in the atmosphere inside the processing chamber 201 is decreased so as not to affect the SiOC film to be subjected to treatment. Thus, even when performing heat treatment at a temperature higher than the film formation temperature as above-described, the O concentration of the SiOC film may be prevented from being increased exceeding the desirable concentration, namely, the SiOC film may be prevented from being excessively oxidized. In addition, since the inside of the processing chamber 201 is in the oxygen-free atmosphere, the C concentration of the SiOC film may be prevented from being decreased below the desirable concentration in accordance with a progress of oxidization and the like, namely, the desorption of C from the SiOC film may be suppressed. In this instance, the oxygen-free gas such as the $N_2$ gas may act as the heat treatment gas. Also, the $N_2$ gas and the like may act as a carrier gas for transporting the impurities desorbed from the SiOC film. Namely, the oxygen-free gas may act as an annealing gas for promoting emission of these impurities from the SiOC film or from the inside of the processing chamber 201 to thereby promote modification of the SiOC film.

In order to set the inside of the processing chamber 201 as the oxygen-free atmosphere, the inside of the processing chamber 201 may be vacuum-exhausted using the exhaust system as the atmosphere generating unit that generates the oxygen-free atmosphere, without supplying the oxygen-free gas such as the $N_2$ gas to the wafer 200.

Accordingly, most components including the O component may be exhausted and removed from the atmosphere inside the processing chamber 201. However, exhaust of the O component remaining in the processing chamber 201 is promoted by supplying the oxygen-free gas such as the $N_2$ gas to the wafer 200 while exhausting the inside of the processing chamber 201, and therefore the inside of the processing chamber 201 may be easily set as the oxygen-free atmosphere. Also, by doing this, the oxygen-free atmosphere inside the processing chamber 201 may be easily maintained by a dilution effect of the $N_2$ gas even when an out gas including the O component is generated from the inner wall of the processing vessel constituting the processing chamber 201 or from the wafer 200 that is loaded from the outside.

The modification process of the SiOC film (annealing treatment) is mainly performed during the heat treatment in which the temperature of the wafer 200 is maintained stable at the desirable temperature. However, the modification process of the SiOC film may be performed while the temperature of the wafer 200 is maintained at the temperature at which removal of the impurities in the SiOC film may be performed even when raising the temperature of the wafer 200 in the above-described process of adjusting the temperature of the wafer 200 (the process of changing the temperature to the first temperature from the film formation temperature, the process of changing the temperature to the second temperature from the first temperature, and the like) or when lowering the temperature of the wafer 200 in a purge process, which will be described later, of the inside of the processing chamber 201. Therefore, the process of modifying the SiOC film may be mainly referred to as a process of heating the SiOC film, but at least a partial period of the process of adjusting the temperature of the wafer 200 and the process of purging the inside of the processing chamber 201 may be included in the process of modifying the SiOC film. In other words, the process of modifying the SiOC film may indicate a period from which the temperature of the wafer 200 reaches a temperature required for the modification process up to immediately before the temperature of the wafer 200 reaches less than a temperature required for the modification process. In addition, the process of modifying the SiOC film may indicate a period ranging from which the temperature of the wafer 200 reaches the temperature required for the modification process, namely, up to which the modification of the SiOC film is started and then completed.

As the oxygen-free gases, rare gases such as an Ar gas, a He gas, an Ne gas, an Xe gas, and the like may be used other than the $N_2$ gas.

Purge and Return to Atmospheric Pressure

When the process of modifying the SiOC film is completed, the $N_2$ gas is supplied into the processing chamber 201 from each of the gas supply pipes 232j to 232l in a state in which the valves 243j to 243l are opened, and exhausted from the exhaust pipe 231. The $N_2$ gas acts as the purge gas, and thereby the inside of the processing chamber 201 is purged so that gases remaining in the processing chamber 201, or gases including substances such as the impurities desorbed from the SiOC film are removed from the inside of the processing chamber 201. Next, the atmosphere inside the processing chamber 201 is substituted with the inert gas so that the pressure inside the processing chamber 201 is returned to a normal pressure.

In addition, the power supply state to the heater 207 is adjusted or the power supply to the heater 207 is stopped, and the temperature of the wafer 200 is lowered to a temperature less than 200° C., preferably, room temperature. The temperature of the wafer 200 may be lowered to a predetermined temperature in a short time using a cooling effect of the purge gas by lowering the temperature of the wafer 200 in parallel with the above-described purge and return to the atmospheric pressure.

Boat Unload and Wafer Discharge

After that, the seal cap 219 is lowered by the boat elevator 115 so that the lower end of the manifold 209 is opened, and the processed wafer 200 is unloaded (boat unload) to the outside of the reaction tube 203 from the lower end of the manifold 209 in a state in which the processed wafer 200 is supported by the boat 217. The processed wafer 200 is taken out from the boat 217 (wafer discharge).

(3) Effect According to the Present Embodiment

According to the present embodiment, one or a plurality of effects shown as below may be obtained.

(a) Decomposition of the source such as the BTCSM gas may be promoted by supplying the catalyst such as the pyridine gas together with a source containing Si, C, and a halogen element and having a Si—C bond such as the BTCSM gas. Thus, the first layer may be formed even under the low temperature condition of 150° C. or less. In addition, when forming the first layer, formation of a chemical adsorption layer rather than a physical adsorption layer of the source such as the BTCSM gas may be advantageously performed and the formation rate of the first layer may be increased.

In addition, decomposition of an oxidization agent such as the $H_2O$ gas is promoted by supplying the catalyst such as the pyridine gas together with the oxidization agent such as the $H_2O$ gas, and therefore oxidizing power of the oxidization agent such as the $H_2O$ gas may be improved. Thereby, by an efficient reaction between the first layer and the oxidization agent such as the $H_2O$ gas even under the low temperature of 150° C. or less, the first layer may be modified to the second layer. In addition, a modification rate of the first layer may be increased.

That is, a film formation temperature of the SiOC film may be lowered by catalysis of a catalyst such as the pyridine gas, and a film formation rate of the SiOC film may be increased.

(b) By using the gas acting as the source gas containing Si, C, and a halogen element and having a Si—C bond such as the BTCSM gas, that is, the Si source and also acting as a C source, C may be added to the first layer. Consequently, a film to which C is added at a high concentration, that is, the SiOC film including a high C concentration may be formed.

The C concentration in the SiOC film may be increased by using the source gas such as, particularly, the BTCSM gas including a Si—C—Si bond in which C is interposed between Si—Si without including a Si—Si bond. That is, C included in the source gas is bonded with Si at every two C bonds. Thereby, when forming the first layer, bonds of C and Si included in the BTCSM gas are all separated so that C may be suppressed from not being taken in the first layer. In addition, when modifying the first layer to the second layer, bonds of C and Si included in the first layer are all separated so that C may be suppressed from being desorbed from the first layer. That is, by using the source gas containing the Si—C—Si bond such as the BTCSM gas, the C concentration of the film can be more increased compared to when using the source gas without containing a bond in which C is interposed between Si—Si such as the TCDMDS gas.

In addition, resistance (etching resistance) with respect to hydrofluoric acid (HF) of the SiOC film may be improved by adding C in the film.

For reference, a wet etching rate (hereinafter, referred to as "WER") with respect to HF of a 1% concentration (1% HF water solution) is about 600 Å/min in the SiO film obtained using the catalyst gas under the low temperature condition, 200 Å/min in the SiO film obtained using the plasma under the low temperature condition, and 60 Å/min in a thermal oxidation film obtained by thermally oxidizing the silicon wafer within an oxidation furnace. That is, the SiO film formed using the catalyst gas or the plasma under the low temperature is likely to have etching resistance lower than that of the thermal oxidation film. In order to improve the etching resistance, adding of C to the film, that is, forming of the SiOC film is effective. When the film formation temperature is 600° C. to 800° C., the SiOC film is formed by simultaneously or alternately supplying the source gas (Si source) such as the HCDS gas, the oxidizing gas such as the $O_2$ gas (O source), the carbon-containing gas (C source) such as the propylene $C_3H_6$ gas, and the like to the wafer 200. However, when the film formation is set at 150° C. or less, the SiOC film may be hardly formed using the above-described gases or the above-described film formation techniques.

To solve this problem, for example, the SiOC film to which C is added at a high concentration, that is, the film having high etching resistance may be formed even under the low temperature condition of 150° C. or less in the present embodiment. For example, the film having higher etching resistance compared to the thermal oxidation film may be formed in the present embodiment. In addition, the C concentration in the SiOC film, that is, the etching resistance may be highly accurately controlled by properly adjusting the supply amount of the pyridine gas and the like.

(c) The film formation rate is improved and a robust film may be formed using an alkylene halosilane source gas such as the BTCSM gas in which the molecular weight (molecular size) of an alkylene group included in one molecule is small. That is, when using the alkylene halosilane source gas including the alkylene group such as a hexylene group, a heptylene group, or the like whose molecular weight is large in one molecule, the alkylene group whose molecular weight is large causes steric hindrance that hinders the Si reaction in which the alkylene group whose molecular weight is large is included in the source gas, and therefore the first layer formation may be hindered. In addition, when the above-described alkylene group remains in a state of not being decomposed or partially decomposed in the first layer, the alkylene group whose molecular weight is large causes steric hindrance that hinders the reaction between Si and $H_2O$ gas in which the alkylene group whose molecular weight is large is included in the source gas, and therefore the second layer formation may be hindered. To solve this problem, the above-described steric hindrance may not occur by using the alkylene halosilane source gas such as the BTCSM gas in which a molecular weight of the alkylene group included in one molecule is small, and therefore the formation of each of the first layer and the second layer may be promoted. Consequently, the film formation rate may be increased and the robust film may be formed. In addition, the same effect may be obtained even when using the alkyl halosilane source gas such as the TCDMDS gas in which a molecular weight of the alkyl group included in one molecule is small.

(d) The SiOC film may be adjusted to be a film in which the parts of Si included in the film are close each other by using the source gas such as the BTCSM gas in which two parts of Si are included in one molecule. That is, when forming the first layer under a condition in which the BTCSM gas does not perform self-decomposition, the two parts of Si included in the BTCSM gas molecule are adsorbed onto the wafer 200 (underlying film of the surface) while being mutually close. In addition, when forming the first layer under a condition in which the BTCSM gas performs self decomposition, the two parts of Si included in the BTCSM gas molecule strongly tend to be accumulated onto the wafer 200 while being close each other. That is, parts of Si included in the first layer may be adjusted to be close each other in comparison with a case using a gas in which only one Si is included within one molecule such as the tris(dimethylamino)silane ($Si[N(CH_3)_2]_3H$, abbreviated as 3DMAS) gas by using the gas such as the BTCSM gas in which two parts of Si are included in one molecule. Consequently, the SiOC film may be adjusted to the film in which the parts of Si included in the film are mutually close. Thereby, the etching resistance of the film may be improved.

(e) As the supply of the source such as the BTCSM gas and the catalyst such as the pyridine gas and the supply of the oxidation agent such as the $H_2O$ gas and the catalyst such as the pyridine gas are alternately performed, these gases may be properly reacted under a condition in which the surface reaction is predominant. Consequently, step coverage of the SiOC film and controllability of the film thickness may be respectively improved. In addition, an excessive atmospheric reaction within the processing chamber 201 may be avoided, and therefore generation of the particles may be restricted.

(f) The first impurities (impurities such as water, Cl, or the like) may be removed from the SiOC film by heating the SiOC film at the first temperature higher than the film formation temperature of the SiOC film. After that, The second impurities ($C_xH_y$-based impurities) different from the first impurities may be removed from the SiOC film on which the first heat treatment has been performed by heating the SiOC film at the second temperature higher than or equal to the first temperature. In result, the SiOC film may be adjusted to a film having the impurities less than that within the SiOC film in a state of deposition (as depo) before performing the process of modifying the SiOC film. Thereby, the etching resistance of the SiOC film is improved, and therefore the dielectric constant may be lowered. That is, the film quality of the SiOC film may be improved.

(g) A porous film may be formed by performing a series of treatments of the SiOC film formation process and the SiOC modification process. That is, the SiOC film may be adjusted to be a porous.

That is, at a least one Si—C bond and one Si—O bond exist within the film formed by the SiOC film formation process. A bond distance between Si and C is large than a bond distance between Si and O. Therefore, a distance between atoms becomes large in the SiOC film by introducing the Si—C bond to the film and the film density becomes sparse compared with a $SiO_2$ film. In addition, the Si—C—Si bond may exist in the SiOC film, and in this case, the film density becomes further sparse. Particularly when using the gas including the Si—C—Si bond such as the BTCSM gas as the source gas, the Si—C—Si bond may be easily included in the SiOC film, and therefore the film density strongly tends to be sparse. That is, a micro hole (pore), that is, a micro space may be generated in a portion in which the film density becomes sparse. That is, the SiOC film formed in the process of forming the SiOC film becomes a film of the porous shape in the deposition state, that is, in which atom density within the film is low.

In addition, when the impurities such as water, Cl, or the like or the $C_xH_y$-based impurities are desorbed out of the SiOC film in the process of modifying the SiOC film, a micro hole (pore), that is, a micro space is generated in the portions from which the impurities are removed. That is, the SiOC film modified by the process of modifying the SiOC film becomes the porus-shaped film in which the becoming of the porus is further progressed than the SiOC film in the deposition state, that is, a film in which the atom density within the film is further low. However, when the above-described undesirable reaction occurs in the process of modifying the SiOC film, the film contraction ratio of the SiOC film becomes large, and therefore the porous state of the SiOC film may be hardly maintained. Also, the modification (change) of the SiOC film may be performed in the state in which the becoming of the porous is progressed while maintaining the porous state in the deposition state by performing the process of modifying the SiOC film in the above-described treatment condition. That is, the film quality of the SiOC film may be improved.

(h) The dielectric constant (k value) of the SiOC film may be lower than a dielectric constant of the $SiO_2$ film by performing the series of treatments of the process of forming the SiOC film and the process of modifying the SiOC film. That is, the SiOC film may enable to be the porus as described above by performing the series of treatments of the process of forming the SiOC film and the process of modifying the SiOC film. In addition, the impurities such as water, Cl, or the like or the $C_xH_y$-based impurities may be removed from the SiOC film by performing the process of modifying the SiOC film. Since the impurities such as water and the like have a permanent dipole moment, these are materials that increase the dielectric constant by changing directions along an electric field. The dielectric constant of the SiOC film may be lowered than the $SiO_2$ film by becoming the porous of the SiOC film and removing the materials that increase the dielectric constant. According to the film formation sequence in the first embodiment of the present invention, it is confirmed that the dielectric constant of the SiOC film may be lowered to, for example, 3.0 or less, particularly up to 2.68.

(i) In addition, the thin film such as, for example, a silicon carbon nitride (SiCN) film in which C is added to the silicon nitride (SiN) film or a silicon oxycarbon nitride (SiOCN) film in which O is added to a SiCN film, or the like may be used as the thin film satisfying the film formation at the low temperature, the low WER (high etching resistance), the low dielectric constant, and the like in a transistor, a resistance memory (ReRAM), or a magnetic random access memory (MRAM) being developed as a next generation memory. Meanwhile, in order to further lower the dielectric constant by further improving the etching resistance of these thin films, the C concentration or the O concentration within the film should be increased so as to lower the N concentration. However, it is hard to increase the C concentration and the like while restricting the N concentration to a level of the concentration, for example, less than the level of impurities in the above-described method in which various gases are alternately supplied so as to form the film and also in a low temperature region.

To solve this problem, in the first embodiment of the present invention, the C concentration within the thin film may be increased or controlled in an excellent accuracy by using the source gas including Si, C, and Cl so as to include the Si—C bond even under the low temperature condition of 150° C. or less.

(4) Modification Example of the First Embodiment of the Present Invention

Figure 4A:
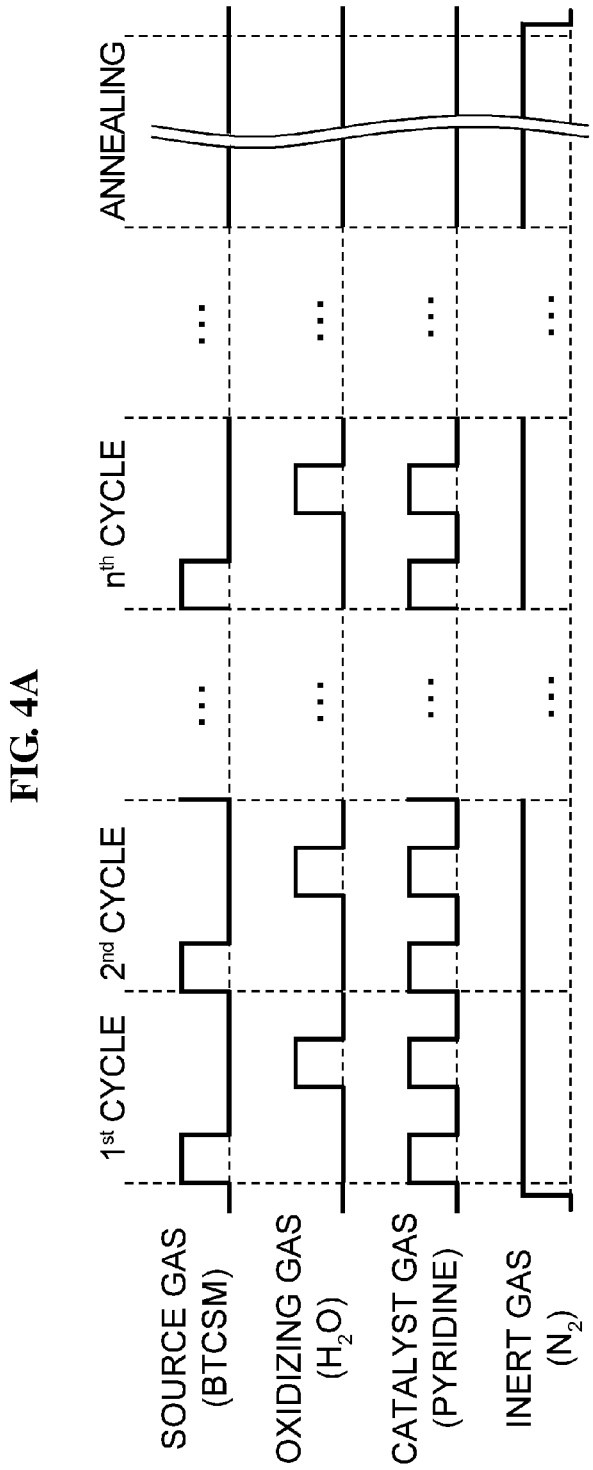

The sequence of the first embodiment of the present invention is not limited to the embodiment shown in FIG. 4A, but may be changed as the modification examples shown bellow.

Modification Example 1

In the Step 1a supplying the source gas, the alkylene halosilane source gas of a kind different from the BTCSM gas such as, for example, the BTCSE gas may be supplied as the source gas. Also, the alkyl halosilane source gas such as the TCDMDS gas may be supplied. FIG. 4B shows an example using the TCDMDS gas instead of the BTCSM gas as the source gas. In this instance, the opening/closing control of the valve 243d in Step 1a is performed in the same sequence as the opening/closing control of the valve 243a in Step 1a of the film formation sequence as shown in FIG. 4A. The other processing conditions or sequences are performed as the same as the film formation sequence shown in, for example, FIG. 4A.

According to this modification example, the film formation sequence has the same effect as the film formation sequence shown in FIG. 4A.

In addition, the C concentration and the like may be controlled within the SiOC film by appropriately selecting kinds of the source gases like the modification example 1. In addition, a Si concentration and an O concentration relative with respect to the C concentration may be changed by controlling the C concentration within the SiOC film.

As this single factor, for example, disposition difference of the C within the molecular structures of the respective source gases may be given. That is, the BTCSM gas, the BTCSE gas, and the like are source gases including the Si—C—Si bond or the Si—C—C—Si bond, and have molecular structures in which C is interposed between parts of Si. A plurality of Cl parts bond with the remaining bonds without boding with C of four bonds of Si included in the BTCSM gas or the BTCSE gas. For example, Cl bonds with three bonds among the four bonds of Si in both of the BTCSM gas and the BTCSE gas. As such, the BTCSM gas, the BTCSE gas, or the like is considered to have high reactivity than the source gas in which the number of Cl included in the one molecule is small (for example, four or less), because a plurality of Cl (for example, six) are included within one molecule in the BTCSM gas, the BTCSE gas, or the like. The reaction occurring when forming the first layer may be efficiently performed by using the BTCSM gas, the BTCSE gas, or the like that has high reactivity as the source gas, and therefore the film formation rate of the SiOC film may be increased. In addition, a range of the treatment condition enabling the film formation to progress, that is, a process window may be extended by using the source gas with the high reactivity. Since the film formation condition enabling a desirable C concentration to be obtained from within the broad process window may be selected, as a result, it is easy to increase the C concentration within the SiOC film. In addition, the controllability of the C concentration within the SiOC film may be improved. Here, the number of C included in the BTCSM gas is smaller than, for example, those of the TCDMDS gas and the like. However, it is considered that the smaller number of C may not act disadvantageously to improve the C concentration in the SiOC film. According to the inventors of the present invention, it is confirmed that the C concentration is easily improved when using the BTCSM gas than when using the TCDMDS gas.

In addition, the TCDMDS gas, the DCTMDS gas, or the like is the source gas not including the Si—C—Si bond or the Si—C—C—Si bond, and has a molecular structure in which the alkyl group such as the methyl group and the like bonds with Si, that is, a molecular structure in which a partial chloro group of the chlorosilane source gas is substituted with the methyl group. The TCDMDS gas, the DCTMDS gas, or the like has the small number of Cl included in the one molecule (for example, four or less), it is considered that the reactivity thereof may be degraded than the source gas such as the BTCSM gas, the BTCSE gas, or the like. Thereby, the reaction is enabled to progress relatively slow when forming the first layer by using the TCDMDS gas, the DCTMDS gas, or the like as the source gas, and therefore, the SiOC film may be formed to a denser film. As a result, a high etching resistance may be maintained even when appropriately suppressing the C concentration in the SiOC film. In the comparison between the case in which the TCDMDS gas is used as the source gas and the case in which the DCTMDS gas is used as the source gas, it is confirmed that the DCTMDS gas including the methyl group, that is, including a plurality of C within one molecule acts advantageously to the blow-in amount of C into the film.

As such, the C concentration within the SiOC film may be easily increased by selecting to supply, for example, the BTCSM gas, the BTCSE gas, or the like as the source gas. In addition, the C concentration within the SiOC film may be appropriately suppressed while maintaining the etching resistance by selecting to supply, for example, the TCDMDS gas, the DCTMDS gas, or the like as the source gas as the source gas. In this manner, the C concentration within the SiOC film may be controlled in an excellent accuracy by selecting to supply a specific source gas from the plurality of source gases.

Modification Example 2

In Step 2a supplying the $O_2$ gas, the amine-based catalyst gas whose molecular structure is different from that of the pyridine gas, that is, the amine-based catalyst gas of a kind different from the pyridine gas may be supplied as the catalyst gas. That is, the kind of the catalyst gas supplied together with the source gas may be different from the kind of the catalyst gas supplied together with the oxidizing gas. In this instance, the amine-based catalyst gas of the kind different from the pyridine gas may be supplied from the gas supply pipe 232c in Step 2A. The other treatment conditions or sequences are performed as the same as the film formation sequence shown in, for example, FIG. 4A.

According to the modification example 2, the film formation sequence has the same effect as the film formation sequence shown in FIG. 4A.

In addition, the C concentration and the like may be controlled in the SiOC film by appropriately selecting kinds of the catalyst gases in the same way as the modification example 2. In addition, a Si concentration and an O concentration may be relatively changed by controlling the C concentration within the SiOC film.

As this single factor, for example, strength difference of the catalysis in accordance with the molecular structures of the catalyst gases may be given. The decomposition of the oxidizing gas is promoted by selecting a catalyst gas with a large value of pKa, and therefore oxidizing properties thereof may be increased. As a result, the Si—C bond included in the first layer is cut in the Step 2a, and the C concentration within the SiOC film being finally formed may be lowered. In addition, the decomposition of the oxidizing gas is properly restricted by selecting the catalyst gas with a small value of Pka, and therefore the oxidizing properties thereof may be lowered. As a result, the Si—C bond included in the first layer becomes easy to be maintained in the Step 2a, and therefore the C concentration within the SiOC film being finally formed may be increased. In addition, as the other factors, vapor pressure difference between various substances involved in the catalysis of the catalyst gas, salt being generated, or the like may be given.

Modification Example 3

During performance of a cycle of the above-described Step 1a and Step 2a a plurality of times, kinds of the source gas or kinds of the catalyst gas may be changed. Also, during performance of a cycle of the above-described Step 1a and Step 2a a plurality of times, an amount of the catalyst gas may be changed.

In this instance, the change of the kinds of the source gas may be performed only once or may be performed a plurality of times. Also, the kinds of the source gas being used may be two or three or more. A combination of the source gases may be arbitrarily selected from the source gases including Si, C, and the halogen element so as to include the Si—C bond. The sequence using the source gases may be arbitrarily selected. In addition, the change of the kinds of the catalyst gas may be performed only once or a plurality of times. Also, the kinds of the catalyst gas being used may be two or three or more. The combination or the sequence of the catalyst gases may be arbitrarily selected. In addition, when changing a supply amount of the gas, the supply amount may be changed to a large flow amount from a small flow amount or to a small flow amount from a large flow amount. Also, the change of the supply amount of the catalyst gas may be performed only once or a plurality of times. In this instance, the supply amount of the catalyst gas may be changed increasingly or decreasingly in stage to a large flow amount from a small flow amount or to a small flow amount from a large flow amount or may be properly changed up and down in an arbitrary combination.

According to the modification example 3, the same effect as the film formation sequence shown in FIG. 4A is obtained. In addition, according to the modification example 3, the concentration of C within the SiOC film may be changed in a film thickness direction. Also, the relative concentrations of Si and C within the film may be changed even in the film thickness direction by changing the concentration of C within the SiOC film in the film thickness direction. As a result, the etching resistance, the dielectric constant, or the like of, for example, the SiOC film may be changed in the film thickness direction.

Modification Example 4

The present invention is not limited to the case using the substrate processing apparatus including each of the plurality of source gas supply lines and the plurality of catalyst gas supply lines as shown in FIG. 1, but a substrate processing apparatus including only a specific gas supply line of the plurality of gas supply lines shown in FIG. 1 may be even used. However, when using the substrate processing apparatus including the plurality of gas supply lines, a specific gas may be easily selected to be supplied from a plurality of kinds of gases in accordance with a desirable film composition and the like by appropriately selecting the gas supply line being used. In addition, a film having various composition ratios and film qualities may be formed to have a general purpose and also to have excellent reproducibility on one substrate processing apparatus. In addition, when adding or replacing kinds of gases, the degree of freedom operating the apparatus may be secured.

Modification Example 5

The process of forming the SiOC film and the process of modifying the SiOC film may be performed in different processing chambers.

For example, the process of forming the SiOC film is performed within a processing chamber 201 (hereinafter, referred to as a first processing chamber) included in the substrate processing apparatus (hereinafter referred to as a first substrate processing unit) shown in FIG. 1. Operations of each unit composing the first substrate processing unit are controlled by a first control unit. A cycle including Step 1b and Step 2b likewise with the above-described Step 1a and Step 2a is performed a predetermined number of times using the first substrate processing unit. Then purge, return to the atmospheric pressure, boat unload, and the wafer discharge in the processing chamber 201 are sequentially executed. In succession, the process of heating the SiOC film formed on the wafer 200 taken out of the boat 217, that is, the process of modifying the SiOC film is performed in a processing chamber different from the processing chamber 201. In this instance, for example, a processing chamber (hereinafter, referred to as a second processing chamber) included in a substrate processing apparatus (hereinafter referred to a second substrate processing unit) configured likewise with the substrate processing apparatus shown in FIG. 1 and different from the apparatus performing the process of forming the SiOC film may be used. Operations of each unit composing the second substrate processing unit are controlled by a second control unit. The wafer charge and the boat load are sequentially executed using the second substrate processing unit likewise with the performance of the process of forming the SiOC film in the first substrate processing unit. Also, the pressure adjustment and the temperature adjustment are performed likewise with the above-described performance of the process of modifying the SiOC film. After that, the above-described first heat treatment, second heat treatment, purge, atmospheric pressure return, boat unload, and wafer discharge are sequentially executed likewise with the above-described embodiment of the present invention. The treatment condition or the treatment sequence in the modification example 5 is set to the same as the film formation sequence shown in FIG. 4A.

As described above, the process of forming the SiOC film and the process of modifying the SiOC film may be performed even in different processing chambers (in Ex-Situ) (a first processing chamber and a second processing chamber) as well as performed in the same processing chamber 201 (in In-Situ). When performing both processes in in situ, the treatment may be consistently performed in a state in which the wafer 200 exists under the vacuum while not exposing the wafer 200 to the atmosphere during the performance, and therefore a stable film formation process may be performed. When performing the both processes in ex situ, the temperatures within respective processing chambers may be set to temperatures, for example, in each of the processes or close thereto in advance, and the time for required for the temperature adjustment is shortened, and therefore production efficiency may be increased.

The substrate processing system is configured mainly with the first substrate processing unit forming the SiOC film and the second substrate processing unit heating the SiOC film. However, the substrate processing system is not limited to the case in which the first substrate processing unit and the second substrate processing unit are configured respectively independent apparatus (stand alone type apparatus) groups as described above, but may be configured as one apparatus in which the first substrate processing unit and the second substrate processing unit are mounted on the same platform. In addition, the apparatus performing the process of modifying the SiOC film may be configured as an apparatus with a configuration different from the substrate processing apparatus shown in FIG. 1, that is, as an annealing-dedicated processing system (heat treatment furnace) and the like.

Second Embodiment

Next, the second embodiment of the present invention will be described with reference to FIG. 6A. The substrate treatment apparatus shown in FIG. 1 and FIG. 2 is used in the second embodiment of the present invention as in the above-described first embodiment of the present invention. Operations of each of the units configuring the substrate treatment apparatus are controlled by the controller 121 in the description that follows.

In the film formation sequence according to the present embodiment, by executing, a specific number of times (n times), a cycle including a process of supplying the BTCSM gas as the source gas containing Si, C, and Cl and having the Si—C bond to the wafer 200; a process of supplying the $O_3$ gas as the oxidizing gas to the wafer 200; and a process of supplying the TEA gas as the catalyst gas to the wafer 200, the SiOC film as a thin film containing Si, O, and C may be formed on the wafer 200.

At this time, the process of supplying the BTCSM gas is performed in a state in which the process of supplying the TEA gas is not performed, and the process of supplying the $O_3$ gas is performed in a state in which the process for supplying the TEA gas is performed.

In addition, after the SiOC film forming process is performed, the process of modifying the SiOC film may be performed in the same manner as in the above-described embodiment.

Hereinafter, differences between the SiOC film formation process of the present embodiment and the SiOC film forming process of the above-described embodiment will be described in detail.

SiOC Film Forming Process

After wafer charging, boat loading, pressure adjustment, and temperature adjustment, the following two Steps 1c and 2c are subsequently performed.

Step 1c (BTCSM Gas Supply)

In the same sequence as in Step 1a of the film formation sequence shown in FIG. 4A, the BTCSM gas is supplied to the wafer 200. At this time, the valves 243c and 243i are closed, and supply of the BTCSM gas to the wafer 200 is performed in a state in which supply of the amine-based catalyst gas such as the pyridine gas or the TEA gas is stopped. That is, when supply of the BTCSM gas to the wafer 200 is performed, supply of the catalyst gas is not performed.

In addition, in order to prevent invasion of the BTCSM gas into the buffer chamber 237 and the nozzles 249b and 249c, the valves 243k and 243l are opened to flow the $N_2$ gas into the gas supply pipes 232k and 232l. The $N_2$ gas is supplied into the processing chamber 201 through the gas supply pipes 232b and 232c, the nozzles 249b and 249c, and the buffer chamber 237, and exhausted from the exhaust pipe 231.

At this time, by appropriately adjusting the APC valve 244, the pressure inside the processing chamber 201 is in a range of 1 to 13,330 Pa, preferably, 133 to 2,666 Pa. The supply flow rate of the BTCSM gas controlled by the MFC 241a is in a range of 1 to 2,000 sccm. The supply flow rate of the $N_2$ gas controlled by each of the MFCs 241j to 241l is in a range of 100 to 10,000 sccm. The time required for supplying the BTCSM gas to the wafer 200, that is, a gas supply time (irradiation time), is in a range of 1 to 100 seconds, preferably 5 to 60 seconds.

At this time, the temperature of the heater 207 is set to be a temperature in a range of room temperature or higher and 150° C. or less, preferably, room temperature or higher and 100° C. or less, and more preferably, 50° C. or higher and 100° C. or less. In the case in which the catalyst gas is not supplied in the supply of the BTCSM gas, when the temperature of the wafer 200 is less than 250° C., the BTCSM is not easily adsorbed onto the wafer 200, whereby a practical film formation rate may not be obtained. In the present embodiment, in Step 2a which is subsequently performed, this problem may be solved by combining the $O_3$ gas and the TEA gas even when the temperature of the wafer 200 is less than 250° C. When the temperature of the wafer 200 is 150° C. or less or 100° C. or less based on the assumption that Step 2a is subsequently performed, an amount of heat applied to the wafer 200 may be reduced, thereby satisfactorily performing control of a thermal history which the wafer 200 receives. In this instance, when the temperature of the wafer 200 is room temperature or higher, a sufficient film formation rate may be obtained. Thus, the temperature of the wafer 200 is set in a range of room temperature or higher and 150° C. or less, preferably, room temperature or higher and 100° C. or less, and more preferably, 50° C. or higher and 100° C. or less.

By supplying the BTCSM gas to the wafer 200 under the above-described condition, the silicon-containing layer containing C and Cl with a thickness of less than one atomic layer to several atomic layers as the first layer is formed on the wafers 200 (under layer of its surface). Under the low temperature condition of 150° C. or less as described above, an adsorption layer of the BTCSM gas, that is, a physical adsorption layer of the BTCSM gas, may be mainly formed as the first layer by physical adsorption with insufficient thermal decomposition.

In this manner, when the first layer is mainly constituted of the physical adsorption layer of the BTCSM gas, the first layer is not easily mounted on the wafer 200. In addition, even when the oxidization process is performed after that, the first layer is not easily changed to the SiOC layer including a strong bond. Namely, when the catalyst gas is not supplied in the supply of the BTCSM gas, the oxidizing reaction of the first layer is difficult to perform even when the catalyst gas is supplied in the following oxidization process. As a result, a film formation rate of the SiOC film may be reduced, or formation of the SiOC film may be impossible.

In the above-described embodiment with respect to this problem, by supplying the catalyst gas in both of the process of supplying the source gas and the process of supplying the oxidizing gas, the mounting of the first layer on the wafer 200 may be promoted. As described above, the catalyst gas weakens the bonding power of the O—H bond on the surface of the wafer 200 to promote a thermal decomposition reaction of the BTCSM gas, and therefore the formation of the first layer by the adsorption of the BTCSM gas molecules may be promoted, thereby securely mounting the first layer on the wafer 200.

In this regard, in the present embodiment, the catalyst gas may be used only in Step 2c which is subsequently performed. However, in the present embodiment, by combining the oxidizing gas (for example, $O_3$ gas) having strong oxidizing power and the catalyst gas (for example, amine-based catalyst gas such as TEA gas) having strong catalysis in Step 2c, the above-described problem may be solved. By using the combination of these gases, the oxidization power of the oxidizing gas in Step 2c may be significantly increased. Consequently, even when the first layer is mainly constituted of the physical adsorption layer of the BTCSM gas, the oxidizing reaction of the first layer is reliably performed to form the SiOC layer including strong bonds. Namely, a bond with an under layer or bonds between adjacent molecules or atoms of the layer may form a strong SiOC layer.

In addition, in the present embodiment, there is no need to pass through a complex reaction system using the catalyst gas at the time of supply of at least the BTCSM gas, and therefore construction of the film formation process may be facilitated. In addition, since the catalyst gas is not supplied in the supply of the BTCSM gas, salts generated by the catalysis are prevented from being a particle source, thereby improving a quality of the film formation process. In addition, since the catalyst gas is not supplied in the supply of the BTCSM gas, an amount of use of the catalyst gas may be reduced when viewed from the entire film formation process, thereby reducing costs for film formation process.

Residual Gas Removal

Thereafter, in the same sequence as in the above-described embodiment, the supply of the BTCSM gas is stopped, and removal of the residual gas from the inside of the processing chamber 201 may be performed.

Step 2c ($O_3$ Gas+TEA Gas Supply)

When Step 1c is completed, $O_3$ gas and TEA gas flow into the processing chamber 201. In Step 2c, closing and opening control of the valves 243g and 243i is performed in the same sequence as the closing and opening control of the valves 243a and 243c in Step 2a shown in FIG. 4A.

In this instance, the flow rate of the $O_3$ gas controlled by the MFC 241g is in a range of 1,000 to 10,000 sccm. The supply rate of the TEA gas controlled by the MFC 241i is set such that a ratio of the supply rate (sccm) of the $O_3$ gas and the supply rate (sccm) of TEA gas supply is, for example, in a range of 0.01 to 100, more preferably 0.05 to 10. The supply flow rate of the $N_2$ gas controlled by the MFCs 241j to 241l is in a range of 100 to 10,000 sccm. A time required for supplying the $O_3$ gas and the TEA gas to the wafer 200, that is, a gas supply time (irradiation time), is in a range of 1 to 100 seconds, preferably 5 to 60 seconds. The temperature of the heater 207 is set in the same temperature zone as when supplying the BTCSM gas in Step 1c, for example, in a rage of room temperature or higher and 150° C. or less, preferably room temperature or higher and 100° C. or less, and more preferably 50° C. or higher and 100° C. or less. The other processing conditions are the same processing conditions as in Step 2a of the film formation sequence shown in FIG. 4A.

The $O_3$ gas supplied into the processing chamber 291 is activated by heat, and exhausted from the exhaust pipe 231. Here, the activated $O_3$ gas is supplied to the wafer 200. The gas flowing into the processing chamber 201 is the thermally activated $O_3$ gas, and the BTCSM gas does not flow in the processing chamber 201. Thus, the $O_3$ gas is supplied to the wafer 200 in a state of being activated without causing a gas phase reaction, and reacts with at least a part of the first layer (silicon-containing layer containing C and Cl) formed on the wafer 200 in Step 1c. Thus, the first layer is thermally oxidized into non-plasma to be changed to the second layer containing Si, O, and C, namely, the SiOC layer.

The TEA gas promotes decomposition of the $O_3$ gas to improve the oxidizing power of the $O_3$ gas, and acts as the catalyst gas for promoting a reaction between the $O_3$ gas and the first layer. In particular, by combining the $O_3$ gas and the TEA gas, the oxidizing power of the $O_3$ gas may be significantly improved to exceed a predicted range from normal catalysis. As described above, when the thermal decomposition of the BTCSM gas is not sufficient because the catalyst gas is not supplied in the supply of the BTCSM gas, sufficient reactivity may not be obtained even when the catalyst gas is supplied in the supply process of the oxidizing gas thereafter. However, by simultaneously supplying the $O_3$ gas and the TEA gas, the oxidizing reaction between the $O_3$ gas and the first layer may be appropriately performed even when the adsorption layer of the BTCSM gas, that is, the physical adsorption layer of the BTCSM gas, is mainly formed as the first layer by physical adsorption in which thermal decomposition in Step 1c is insufficient. That is, the oxidizing power of the $O_3$ gas may be significantly increased due to the action of the TEA GAS, whereby the oxidizing process on the physical adsorption layer of the BTCSM gas may be reliably performed. Consequently, a bond with an under layer or bonds between adjacent molecules or atoms may form a strong SiOC layer.

Residual Gas Removal

Thereafter, the valve 243g is closed and the supply of the $O_3$ gas is stopped. In addition, the valve 243i is closed and the supply of the TEA GAS is stopped. Removal of the residual gas from the inside of the processing chamber 201 may be performed in the same sequence as in the above-described embodiment.

Execution Specific Number of Times

The above-described Steps 1c and 2c are set as one cycle, and by executing this cycle at least once, namely, a specific number of times (n times), a specific composition and a SiOC film with a specific film thickness may be formed on the wafer 200. The fact that the above-described cycle is preferably repeated multiple numbers of times is the same as in the above-described embodiment.

SiOC Film Modifying Process

In the present embodiment, impurities such as water or Cl or $C_xH_y$-based impurities may be largely mixed in the SiOC film formed under the low temperature condition. Pressure adjustment, temperature adjustment, the first heat treatment, the second heat treatment, purge and return to atmospheric pressure may be performed in the same sequence and processing conditions as in the above-described embodiment to remove the impurities of the SiOC film, thereby modifying the SiOC film. Thus, the SiOC film having higher etching resistance and a lower dielectric constant may be obtained compared to the SiOC film before performing the modifying process of the SiOC film.

Thereafter, boat unload and wafer discharge may be performed in the same sequence as in the above-described embodiment to complete the film formation process of the present embodiment.

(2) Effects of the Present Embodiment

According to the present embodiment, one or a plurality of the effects which will be shown below as well as the same effects as the above-described embodiment may be obtained.

(a) The supply of the BTCSM gas is performed on the wafer 200 in a state in which the supply of the catalyst gas to the wafer 200 is stopped. Thus, the film formation process may be simplified. In addition, salts generated when supplying the catalyst gas in the supply of the BTCSM gas are not generated, and thus generation of particles is suppressed. In addition, an amount of use of the catalyst gas may be suppressed when viewed from the entire film formation process, thereby reducing manufacturing costs.

(b) The supply of the $O_3$ gas to the wafer 200 is performed on the wafer 200 in a state in which the supply of the TEA gas is performed. Thus, the oxidizing power of the $O_3$ gas may be significantly increased. By combining the $O_3$ gas and the amine-based catalyst gas, the oxidizing power of the $O_3$ gas may be significantly increased to exceed a predicted range from normal catalysis. Thus, sufficient reactivity may be obtained with respect to the first layer even when the catalyst gas is not supplied in the supply of the BTCSM gas, and the oxidizing reaction between the $O_3$ gas and the first layer may be appropriately performed. In addition, the rate of the oxidizing reaction may be improved to maintain the film formation rate of the SiOC film.

As the amine-based gas which is combined with the $O_3$ gas, the TEA gas is most preferable, a pyridine gas is the next most preferable, and a piperidine gas is the next most preferable. This is because a temperature range in which the SiOC film can be formed is widest in the case of using the TEA gas as the catalyst gas, and is also wide in the case of using the pyridine gas and the case of using the piperidine gas.

(c) According to the present embodiment, the same effect as the above-described embodiment using FIG. 4A and the like may be obtained. However, the various effects provided in the above-described embodiment may become more remarkable in the above-described embodiment than in the present embodiment. For example, an effect of reducing the dielectric constant of the SiOC film may become more remarkable in the above-described embodiment using the $H_2O$ gas and the pyridine gas than in the present embodiment using the $O_3$ gas and the TEA gas. This is because a degree of porosity of the SiOC film is increased when using the $H_2O$ gas as the oxidizing gas compared to when using the $O_3$ gas as the oxidizing gas. The SiOC film containing more water is formed when using the $H_2O$ gas as the oxidizing gas than when using the $O_3$ gas as the oxidizing gas. By performing the first heat treatment and the second heat treatment on the SiOC film containing more water, a larger number of minute pores, that is, minute spaces, are generated, and thus the SiOC film may be more porous.

(3) Modification Example of the Present Embodiment

The film formation sequence of the present embodiment is not limited to the embodiment shown in FIG. 6A, and the SiO film may be formed on the wafer 200 by changing the film formation sequence such as in the modification example shown in FIGS. 6B and 6C.

In this case, an HCDS gas or a BDEAS gas is used as the source gas rather than the BTCSM gas. In Step 1c of supplying the HCDS gas or the BDEAS gas, the opening and closing control of the valve 243e or 243f is performed in the same sequence as in the opening and closing control of the valve 243a in Step 1c. The supply flow of the HCDS gas or the BDEAS gas may be the same as the supply flow of the BTCSM gas in Step 1c of the film formation sequence shown in FIG. 6A. The other processing conditions are the same processing conditions as in Step 1c of the film formation sequence shown in FIG. 6A.

Impurities such as moisture are likely to be included in the SiO film formed under the low temperature condition in this manner. When using the HCDS gas as the source gas, impurities such as Cl are likely to be included in the SiO film. When using the BDEAS gas as the source gas, impurities such as C, H, or N are likely to be included in the SiO film. In the same sequence and processing conditions as the above-described embodiment, the first heat treatment and the second heat treatment may be performed on the SiO film to remove the impurities of the SiO film so that the SiO film may be modified, and therefore the SiO film having higher etching resistance and a lower dielectric constant may be obtained compared to the SiO film on which the process of modifying the SiO film is not performed.

Third Embodiment

Next, the third embodiment of the present invention will be described with reference to FIGS. 7A and 7B. In the present embodiment, the substrate processing apparatus shown in FIGS. 1 and 2 is used in the same manner as in the above-described embodiments. Operations of respective units constituting the substrate processing apparatus may be controlled by the controller 121.

In the film formation sequences of the present embodiment, a process of forming a laminated film of the SiO film and the SiOC film on the wafer 200 is performed by executing, a specific number of times (n times), a cycle including: in a state in which a process of supplying the HCDS gas as the source gas containing Si and Cl to the wafer 200 is performed, performing the film formation sequence in a state in which a process of supplying the pyridine gas as the catalyst gas to the wafer 200 is performed (Step 1d), and in a state in which a process of supplying the $H_2O$ gas as the oxidizing gas to the wafer 200 is performed, performing the film formation sequence in a state in which a process of supplying the pyridine gas as the catalyst gas to the wafer 200 is performed (Step 2d), a process of forming the SiO film as a first thin film containing Si and O by executing a set including these processes a specific number of times ($m_1$ times); and, in a state in which a process of supplying the BTCSM gas as the source gas containing Si, C, and Cl and having Si—C bond to the wafer 200 is performed, performing the film formation sequence in a state in which a process of supplying the pyridine gas as the catalyst gas to the wafer 200 is performed (Step 1e), performing the film formation sequence in a state in which a process of supplying the $H_2O$ as the oxidizing gas to the wafer 200 is performed (Step 2e), and a process of forming the SiOC film as a second thin film containing Si, O, and C by executing a set including these processes a specific number of times ($m_2$ times).

In addition, after forming the laminated film of the SiO film and the SiOC film, a process of modifying the laminated film may be performed in the same manner as in the above-described embodiments.

Hereinafter, differences between the process of the forming the SiO film and the SiOC film of the present embodiment and those in the above-described embodiments will be described in detail.

SiO Film Forming Process

The following two Steps 1d and 2d are sequentially performed after wafer charging, boat loading, pressure adjustment, and temperature adjustment.

Step 1d (HCDS Gas+Pyridine Gas Supply)

The HCDS gas is supplied to the wafer 200 in the same sequence as in Step 1c of the film formation sequence shown in FIG. 6B. In addition, the pyridine gas is supplied to the wafer 200 in the same sequence as in Step 1a of the film formation sequence shown in FIG. 4A. The processing conditions at this time are the same as in Step 1a of the film formation sequence shown in FIG. 6B and in Step 1a of the film formation sequence shown in FIG. 4A. With respect to the HCDS gas, the pyridine gas shows the same catalysis as the catalysis with respect to the BTCSM gas.

Thus, the silicon-containing layer containing Cl with a thickness of less than one atomic layer to several atomic layers is formed on the wafers 200 as a first layer. By simultaneously flowing the HCDS gas and the pyridine gas, the silicon-containing layer containing Cl may be formed on the wafer 200 under a relatively low temperature condition, for example, 150° C. or less.

Residual Gas Removal

Thereafter, the supply of the pyridine gas and the HCDS gas is stopped, and removal of the residual gas from the processing chamber 201 is performed in the same sequence as in the above-described embodiments.

Step 2d ($H_2O$ Gas+Pyridine Gas Supply)

After Step 1d is completed and the residual gas inside the processing chamber 201 is removed, the $H_2O$ gas and the pyridine gas are supplied to the wafer 200 in the same supply sequence as in Step 2a of the film formation sequence shown in FIG. 4A. The processing conditions at this time are the same processing conditions as in Step 2a of the film formation sequence shown in FIG. 4A. Thus, the first layer is thermally oxidized into non-plasma to be changed to the second layer containing Si and O, namely, a silicon oxidizing layer (SiO layer).

Residual Gas Removal

Thereafter, the supply of the pyridine gas and the $H_2O$ gas is stopped, and removal of the residual gas from the processing chamber 201 is performed in the same sequence as in the above-described embodiments.

Execution Specific Number of Times

By setting the above-described Steps 1d and 2d as one set and executing this set at least once, namely, a specific number of times ($m_1$ times), the SiO film having a predetermined composition and a predetermined film thickness may be formed on the wafer 200. The fact that this set is preferably repeated multiple numbers of times is the same as in the above-described embodiments.

SiOC Film Forming Process

Next, Steps 1e and 2e are sequentially performed in the same sequence as in Steps 1a and 2a of the film formation sequence shown in FIG. 4A. By setting Steps 1e and 2e as one set and executing this set at least once, namely, a specific number of times ($m_2$ times), the SiOC film having a predetermined composition and a predetermined film thickness may be formed on the SiO film. The fact that this set is preferably repeated multiple numbers of times is the same as in the above-described embodiments.

Execution Specific Number of Times

By setting the above-described SiO film forming process and SiOC film forming process as one cycle and executing this cycle at least once, namely, a specific number of times (n times), a laminated film of the SiOC film and the SiOC film may be formed on the wafer 200. In addition, any one of the SiO film forming process and the SiOC film forming process may be started first.

As shown in FIG. 7A, by executing the cycle including the SiO film forming process and the SiOC film forming process once, the laminated film (stacked film) obtained in such a manner that one SiO film and one SiOC film are alternately laminated may be formed.

Figure 7B:
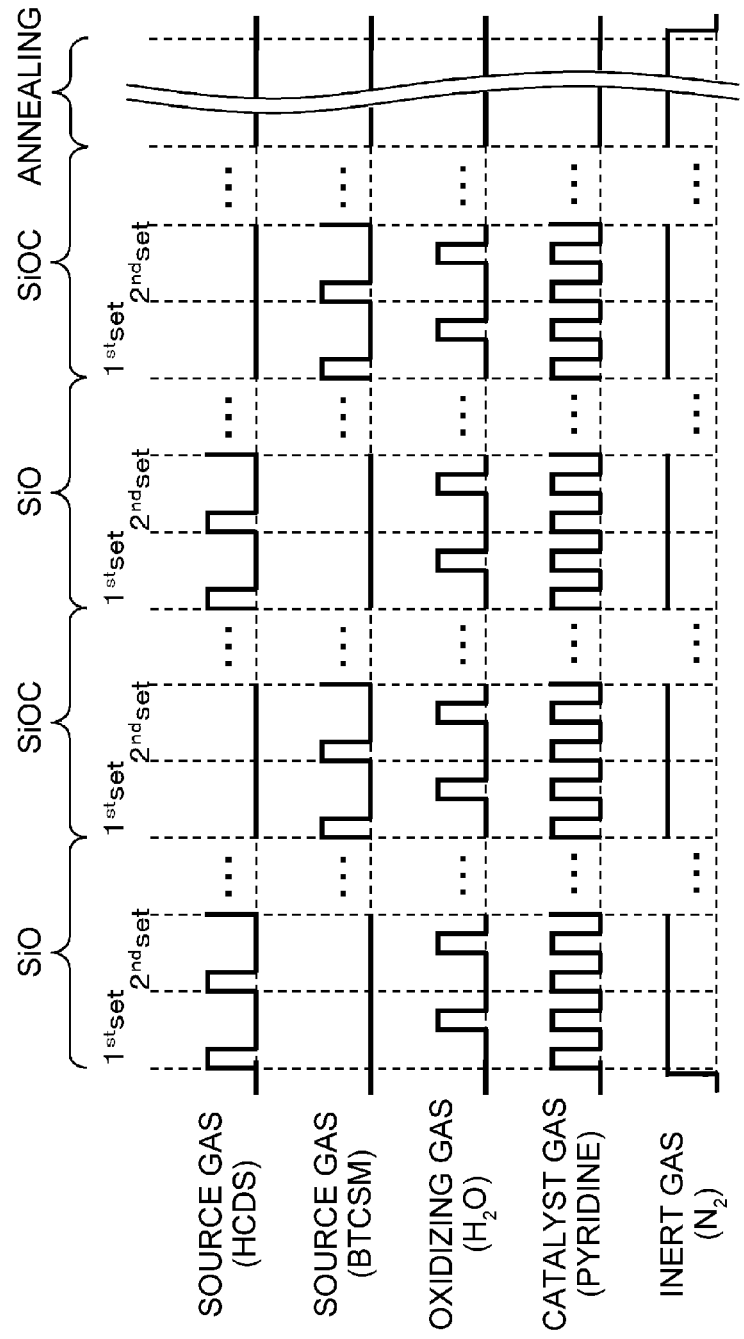

In addition, as shown in FIG. 7B, by executing the cycle including the SiO film forming process and the SiOC film forming process multiple numbers of times, a laminated film (laminated film) obtained in such a manner that a plurality of SiO films and a plurality of SiOC films are alternately laminated may be formed. FIG. 7B illustrates an example in which the cycle including the SiO film forming process and the SiOC film forming process are repeated twice.

Process of Modifying Laminated Film

In the present embodiment, impurities such as water or Cl or $C_xH_y$-based impurities may be largely mixed in the SiO film and the SiOC film formed under the low temperature condition. Pressure adjustment, temperature adjustment, the first heat treatment, the second heat treatment, purge and return to atmospheric pressure may be performed in the same sequence and processing conditions as in the above-described embodiments to remove the impurities of the laminated film, thereby modifying the laminated film. Thus, the laminated film having higher etching resistance and a lower dielectric constant may be obtained compared to the laminated film before performing the modifying process of the laminated film.

Thereafter, boat unloading and wafer discharge are performed in the same sequences as in the above-described embodiments to complete the film formation process of the present embodiment.

Also in the present embodiment, the same effects as the above-described embodiments may be obtained.

In addition, by controlling a film thickness ratio between the SiO film and the SiOC film, for example, by controlling a ratio of the number of times ($m_1$, $m_2$) of the above-described respective sets, a composition ratio of the laminated film which is ultimately formed may be precisely controlled. In addition, in the film formation sequence shown in FIG. 7B, the film thickness of each of the SiO film and the SiOC film is 5 nm or less, preferably 1 nm or less, and therefore the ultimately formed laminated film may be provided as a layer having matching characteristics in the laminated direction, namely, a nano-laminated film having inseparable characteristics throughout the film. In addition, by setting the number of times ($m_1$ times and $m_2$ times) of execution of the above-described set to about one to ten times, the film thickness of each of the SiO film and the SiOC film is 5 nm or less, preferably 1 nm or less.

(2) Modification Example of the Present Embodiment

The film formation sequence of the present invention is not limited to the embodiments shown in FIGS. 7A and 7B, and may be changed to a modification example shown in FIGS. 8A and 8B. That is, in the SiO film forming process, the supply of the catalyst gas may not be performed. In addition, in the SiO film forming process, the BDEAS gas containing Si, C, and N and having Si—N bonds may be used without using the HCDS gas as the source gas. In addition, in the SiO film forming process, the $O_2$ gas activated by plasma as the oxidizing gas, namely, the $O_2$ gas excited into a plasma state may be used.

In Step 1f of supplying the BDEAS gas, the opening and closing control of the valve 243f is performed in the same sequence as the opening and closing control of the valve 243e in Step 1d. At this time, the valves 243c and 243i are closed, and the supply of the BDEAS gas to the wafer 200 is performed in a state in which the supply of the amine-based catalyst gas such as the pyridine gas or the TEA gas is stopped. The supply flow of the BDEAS gas is the same as the supply flow of the HCDS gas in Step 1d of the film formation sequence shown in FIGS. 7A and 7B. The other processing conditions are the same as in Step 1d of the film formation sequence shown in FIGS. 7A and 7B.

By supplying the BDEAS gas to the wafer 200, the silicon-containing layer containing N and C with a thickness of less than one atomic layer to several atomic layers as the first layer is formed on the wafers 200 (an under layer of its surface). The BDEAS gas is easily adsorbed onto the wafer 200 or the like, and has high decomposition properties and reactivity. Thus, the first layer may be formed on the wafer 200 even under a relatively low temperature condition of 150° C. or less.

In Step 2f of supplying the $O_2$ gas activated by plasma, the opening and closing control of the valve 243h is performed in the same sequence as the opening and closing control of the valve 243b in Step 2d of the film formation sequence shown in FIGS. 7A and 7B. At this time, the valves 243c and 243i are closed, and the supply of the $O_2$ gas to the wafer 200 is performed in a state in which the amine-based catalyst gas such as the supply of the pyridine gas or the TEA gas is stopped. The supply flow rate of the $O_2$ gas controlled by the MFC 241h is in a range of 100 to 10,000 sccm. A high frequency power applied between the rod electrodes 269 and 270 is in a range of 50 to 1,000 W. The pressure inside the processing chamber 201 is in a range of 1 to 100 Pa. By using plasma, the $O_2$ gas may be activated even when the pressure inside the processing chamber 201 is set to a relatively low pressure zone. A time required for supplying activated species obtained by plasma-exciting the $O_2$ gas to the wafer 200, namely, a gas supply time (irradiation time), is in a range of 1 to 100 seconds, preferably 5 to 60 seconds. The other processing conditions are the same as in Step 2e of the film formation sequence shown in FIGS. 7A and 7B.

By supplying the $O_2$ gas activated by plasma to the wafer 200, an oxidizing process is performed on the first layer (silicon-containing layer containing N and C) formed on the wafer 200. The first layer may be changed to the second layer containing Si and O, namely, the SiO layer.

According to the present modification example, the same effects as in the film formation sequence shown in FIGS. 7A and 7B may be obtained.

Other Embodiments

The embodiments of the present invention have been described in detail above. However, the present invention is not limited to the above-described embodiments or modification examples, and various modifications may be made without departing from the spirit of the present invention.

Figure 14A:
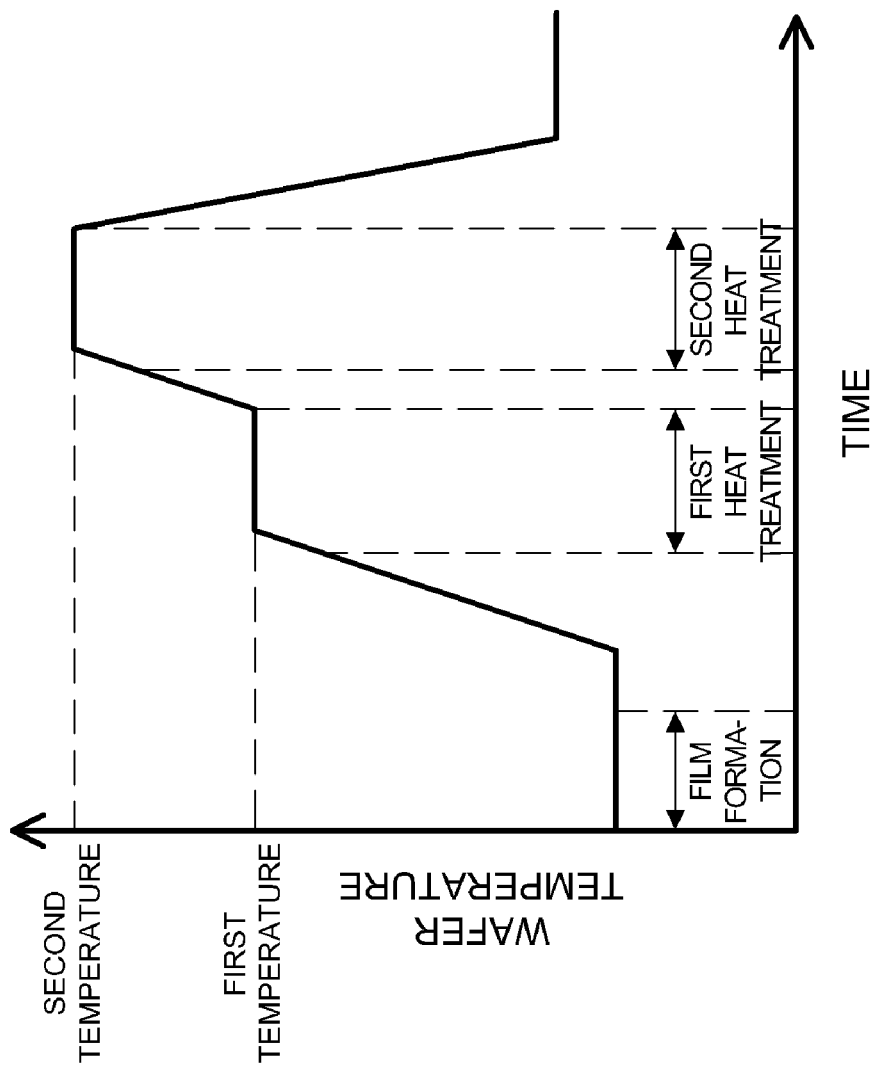
Figure 14C:
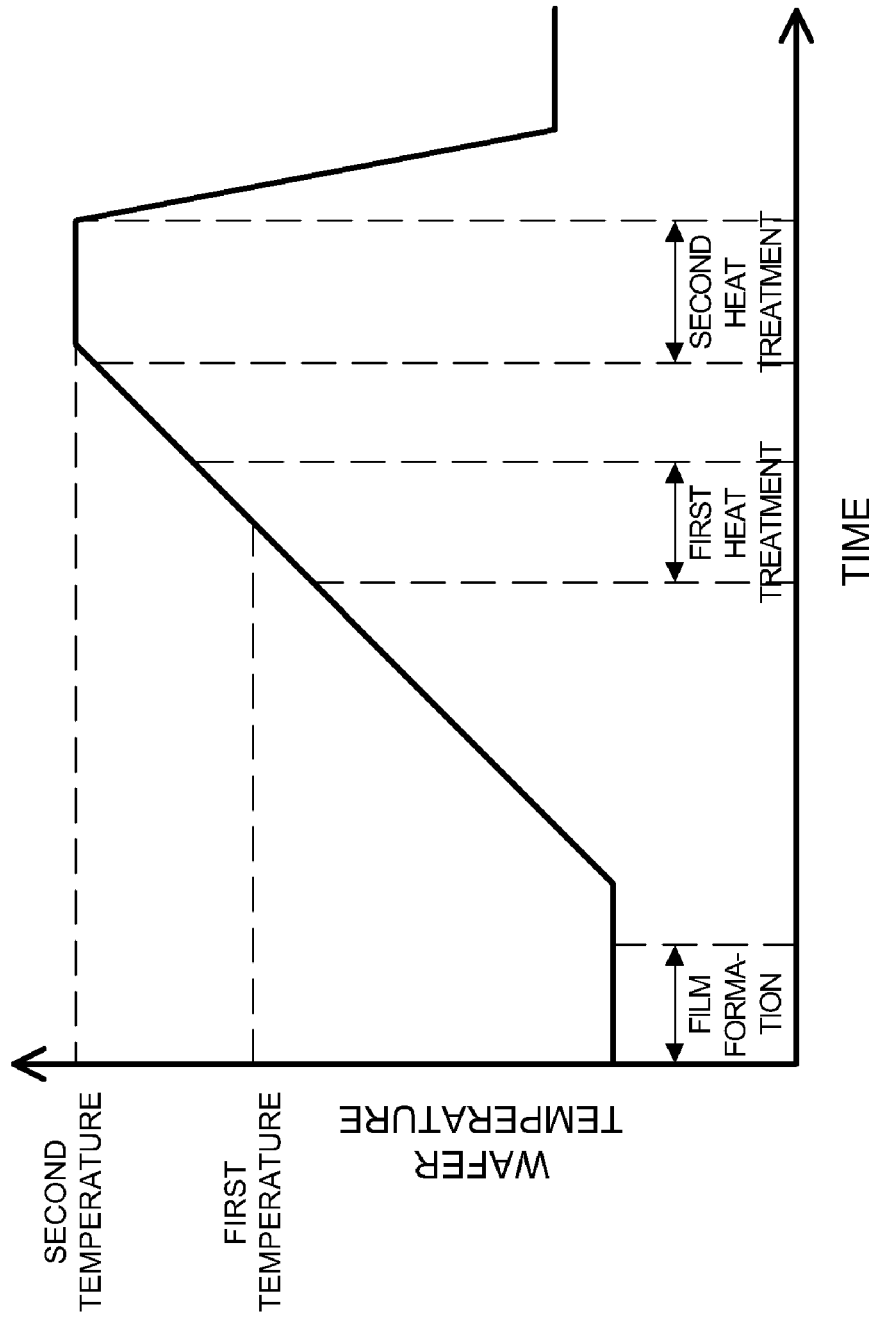
Figure 15:
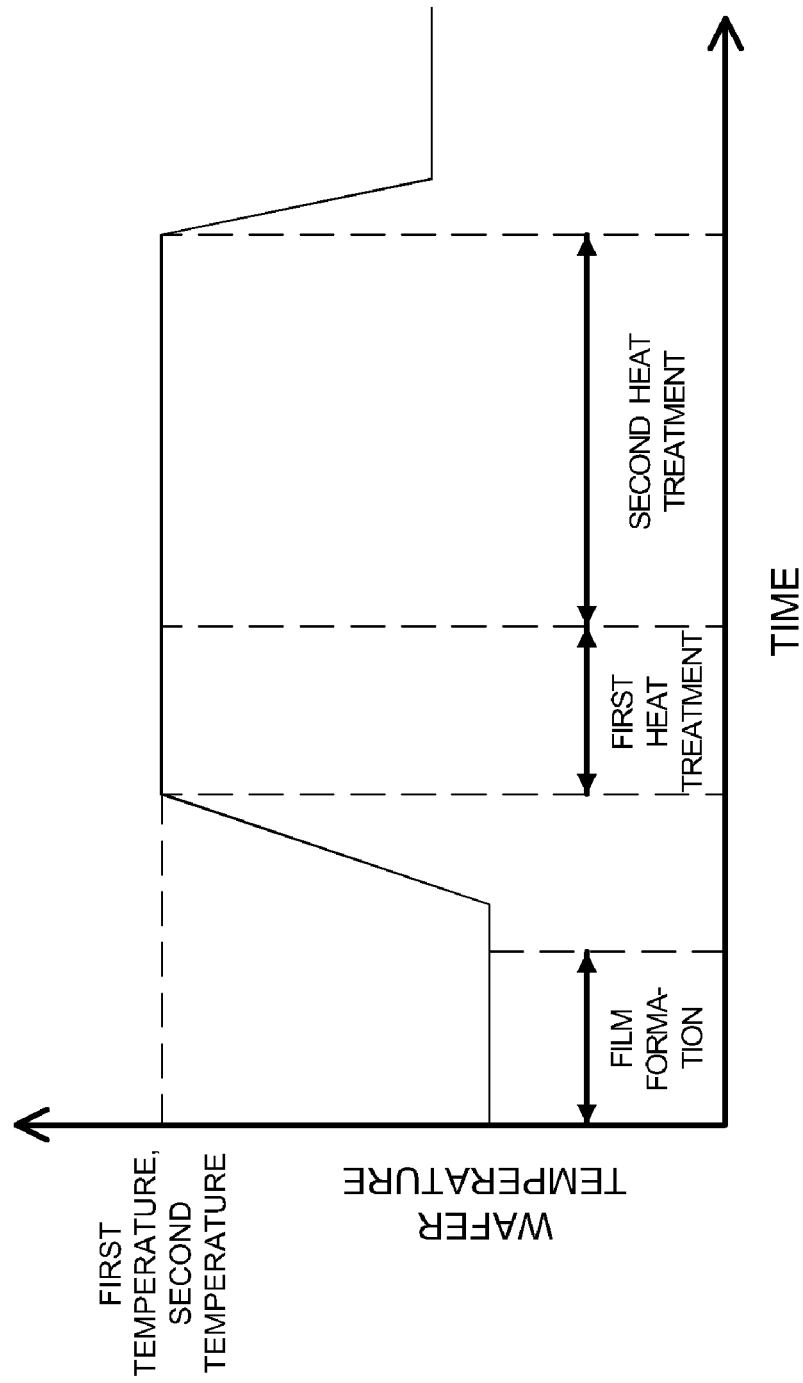
FIG. 15 is a diagram illustrating a temperature control sequence of a heat treatment process when a second temperature is equal to a first temperature.

The temperature control sequence of the heat treatment process of the present invention, that is, the annealing sequence, is not limited to the above-described embodiments, and various modifications thereof may be made as shown in FIGS. 14A through 14D and 15. FIG. 14A illustrates an annealing sequence in a case in which the second temperature is higher than the first temperature in the same manner as in the above-described embodiments. FIGS. 14B to 14D illustrate modification examples thereof. FIG. 15 illustrates an annealing sequence in a case in which the second temperature is a temperature equal to the first temperature. A horizontal axis of each of these drawings indicates an elapsed time (minutes), and a vertical axis thereof indicates a wafer temperature (° C.).

In the annealing sequence shown in FIG. 14A, by raising the temperature of the wafer 200 after film formation up to the first temperature, and by maintaining the temperature of the wafer 200 constant for a predetermined time at the first temperature, the first heat treatment is performed. Thereafter, by raising the temperature of the wafer 200 up to the second temperature higher than the first temperature, and by maintaining the temperature of the wafer 200 constant for a predetermined time at the second temperature, the second heat treatment is performed. Thereafter, the temperature of the wafer 200 is lowered to a temperature at which unloading is possible.

According to the annealing sequence, by maintaining the temperature of the wafer 200 constant for a predetermined time at the first temperature lower than the second temperature in the first heat treatment process, the above-described undesirable reaction may be reliably prevented. In addition, by sufficiently securing the time required for maintaining the temperature of the wafer 200 at the first temperature, desorption of the first impurities (water or Cl) from the SiOC film may be reliably performed.

Thereafter, by maintaining the temperature of the wafer 200 constant for a predetermined time at the second temperature higher than the first temperature in the second heat treatment, desorption of the second impurities ($C_xH_y$-based impurities) in the second heat treatment process may be rapidly performed. In addition, at this time, substances (water or Cl) that cause undesired reactions are not generated, and therefore the above-described undesirable reaction may be reliably suppressed. In addition, by sufficiently securing the time required for maintaining the temperature of the wafer 200 at the second temperature, desorption of the second impurities from the SiOC film may be reliably performed.

In the annealing sequence shown in FIG. 14B, the temperature of the wafer 200 after the film formation is raised up to the first temperature, and then the temperature of the wafer 200 is raised up to the second temperature without maintaining the temperature of the wafer 200 constant. Next, when the temperature of the wafer 200 reaches the second temperature, the temperature of the wafer 200 is lowered without maintaining the temperature of the wafer 200 constant. In the annealing sequence, the first heat treatment process is performed between periods while the temperature of the wafer 200 reaches a temperature (temperature close to the first temperature) at which desorption of the first impurities from the SiOC film is started and while the desorption of the first impurities from the SiOC film is completed. In addition, the second heat treatment process is performed within a period from when the temperature of the wafer 200 reaches a temperature (temperature close to the second temperature) at which desorption of the second impurities from the SiOC film is activated until the desorption of the second impurities from the SiOC film is completed. In addition, desorption of the first impurities from the SiOC film is completed to some extent, that is, a ratio occupied by the second impurities among the impurities desorbed from the film is dominant, and a period until desorption of the second impurities from the film is activated may be included in the second heat treatment process.

According to the annealing sequence, by appropriately adjusting a magnitude of each of a temperature raising rate or a temperature lowering rate of the wafer 200, the first heat treatment process and the second heat treatment process are appropriately performed in the stated order.

By lowering a magnitude of at least any one of a temperature raising rate until the temperature of the wafer 200 reaches the first temperature and a temperature raising rate until the temperature of the wafer 200 reaches the second temperature exceeding the first temperature, the above-described undesirable reaction may be reliably prevented in the first heat treatment process. Thus, desorption of the first impurities from the SiOC film may be reliably performed. By making one of the temperature raising rate until the temperature of the wafer 200 reaches the first temperature and the temperature raising rate until the temperature of the wafer 200 reaches the second temperature exceeding the first temperature smaller than the other one, an execution time of the first heat treatment process may be sufficiently secured, whereby desorption of the first impurities from the SiOC film may be reliably performed.

In addition, by lowering a magnitude of at least one of a temperature raising rate until the temperature of the wafer 200 reaches the second temperature exceeding the first temperature and a temperature raising rate after the temperature of the wafer 200 reaches the second temperature, an execution time of the second heat treatment process may be sufficiently secured, whereby desorption of the second impurities from the SiOC film may be reliably performed. In addition, since the substances that cause undesirable reactions are not generated, the above-described undesirable reactions may be reliably prevented. For example, by making one of the temperature raising rate until the temperature of the wafer 200 reaches the second temperature exceeding the first temperature and the temperature raising rate after the temperature of the wafer 200 reaches the second temperature smaller than the other one, an execution time of the second heat treatment process may be sufficiently secured, whereby desorption of the second impurities from the SiOC film may be reliably performed. In addition, a total required time may be shortened.

According to the annealing sequence, since control of maintaining the temperature of the wafer 200 constant is not performed, the temperature control may be simplified. For example, when the temperature of the wafer 200 immediately after the film formation is raised up to the second temperature, the temperature raising rate should be sufficiently lowered, and therefore the first heat treatment process and the second heat treatment process are appropriately performed in the stated order.

The annealing sequence shown in FIGS. 14C and 14D is obtained by combining the annealing sequences shown in FIGS. 14A and 14B. In the annealing sequence shown in FIG. 14C, the temperature of the wafer 200 is continuously raised until reaching the second temperature, and when the temperature of the wafer 200 reaches the second temperature, the temperature is maintained constant for a predetermined time and then lowered. In addition, in the annealing sequence shown in FIG. 14D, when the temperature of the wafer 200 reaches the first temperature, the temperature is maintained constant for a predetermined time and then is raised up to the second temperature. Next, when the temperature of the wafer 200 reaches the second temperature, the temperature may be lowered without being maintained constant. These annealing sequences also have the same effects as the annealing sequences shown in FIGS. 14A and 14B. In addition, an appropriate combination of the annealing sequences shown in FIGS. 14A through 14D may be used.

The annealing sequence shown in FIG. 15 is an example in which the second temperature is set to be equal to the first temperature. In this annealing sequence, the temperature of the wafer 200 after film formation is raised up to the first temperature, and then the raised temperature is maintained constant for a predetermined time before being lowered.

When the temperature of the wafer 200 is raised up to the first temperature as described above, desorption of the first and second impurities from the SiOC film is started. At this time, desorption of the first impurities is completed earlier than desorption of the second impurities. In this annealing sequence, the first heat treatment process is performed within a period from when the temperature of the wafer 200 reaches a temperature (temperature close to the first temperature) at which desorption of impurities from the SiOC film is started until desorption of the first impurities from the SiOC film is completed. In addition, desorption of the first impurities from the SiOC film is completed to some extent, that is, a ratio occupied by the second impurities among the impurities desorbed from the film is dominant, and the second heat treatment process is performed during a period until desorption of the second impurities from the film is completed. In addition, the period from when desorption of the second impurities from the SiOC film is started until desorption of the first impurities from the SiOC film is completed may be included in the second heat treatment process. That is, the first and second heat treatment processes are simultaneously started, so that the first heat treatment process may be first completed, and then the second heat treatment process may be completed. Since the first temperature does not include the temperature zone in which the above-described undesirable reaction occurs even when the first and second heat treatment processes are simultaneously started, the above-described undesirable reaction may not occur when the first and second heat treatment processes are simultaneously performed.

According to this annealing sequence, by sufficiently securing the time required for maintaining the temperature of the wafer 200 at the first temperature, the first and second heat treatment processes may be appropriately performed. That is, by sufficiently securing the time required for maintaining the temperature of the wafer 200 at the first temperature after the first heat treatment process is completed, the second heat treatment process may be reliably performed without further raising the temperature of the wafer 200.

In addition, according to this annealing sequence, since the second temperature is set to be equal to the first temperature, that is, since the temperature of the wafer 200 is not raised up to a temperature exceeding the first temperature, control of a thermal history which the wafer 200 receives may be satisfactorily performed. In addition, according to this annealing sequence, there is no need to raise the temperature of the wafer 200 up to the temperature exceeding the first temperature, and therefore the heater 207 having a relatively small output may be used, thereby reducing manufacturing costs of the substrate processing apparatus.

In addition, according to this annealing sequence, control of raising the temperature of the wafer 200 to a second stage is not performed, and therefore the temperature control may be simplified. For example, by making sure that the temperature of the wafer 200 immediately after film formation is raised up to the first temperature and then the time required for maintaining the temperature constant is sufficiently secured, each of the first and second heat treatment processes may be appropriately performed.

In the above-described embodiments, an example in which the inert gas, the purge gas, and the oxygen-free gas are all supplied from the same gas supply system has been described. The present invention is not limited thereto, and a part or all of an inert gas supply system, a purge gas supply system, and an oxygen-free gas supply system may be installed as a separate gas supply system. However, when the oxygen-free atmosphere is generated in the processing chamber 201 only by the exhaust system, the oxygen-free gas supply system need not be installed.

In addition, in the above-described embodiments, when changing the silicon-containing layer to the SiOC layer or the SiO layer, an example of using the oxidizing gas activated by heat together with the catalyst gas, that is, an example of supplying the catalyst gas and the oxidizing gas under a plasma atmosphere (under the condition) has been described. The present invention is not limited thereto, and the oxidizing gas excited by plasma together with the catalyst gas may be used. That is, the catalyst gas and the oxidizing gas may be supplied under the atmosphere (under the condition) of plasma. The processing conditions at this time may be the same processing conditions in the above-described embodiments or modification examples.

In addition, in the above-described embodiments, an example in which the Si-based thin film such as the SiOC film or the SiO film is formed using the oxidizing gas such as the $H_2O$ gas has been described. The present invention is not limited thereto, and the Si-based thin film such as the SiCN film may be formed by nitriding the silicon-containing layer containing C and Cl using a nitriding gas instead of the oxidizing gas. Alternatively, the Si-based thin film such as a SiON film or a SiOCN film may be formed by appropriately combining the oxidizing gas or the nitriding gas. As the nitriding gas, ammonia ($NH_3$) gas, diazene ($N_2H_2$) gas, hydrazine ($N_2H_4$) gas, $N_3H_8$ gas, a gas containing compounds of these, and the like may be used. At this time, the processing conditions may be the same processing conditions as in the above-described embodiments.

In addition, in the above-described embodiments, an example of using the chlorosilane source gas as the source gas used in the film formation of the SiOC film or the SiO film has been described. The present invention is not limited thereto, and a halosilane source gas, for example, a fluorosilane source gas or a bromosilane source gas may be used instead of the chlorosilane source gas. At this time, the processing conditions may be the same processing conditions as in the above-described embodiments.

With the miniaturization of the transistor, there are demands for a low film formation temperature, an improvement in resistance against hydrogen fluoride (HF), and a reduction in the dielectric constant of a thin film constituting a sidewall spacer (SWS) of a gate electrode or the like. In addition, a protective film for a ReRAM developed as a next generation memory requires low temperature film formation of 350° C. or less, and a protective film for an MRAM requires low temperature film formation of 250° C. or less. In response to these requirements, the present invention is preferably applied to a case in which a thin film such as the Si-based thin film (SiOC film, SiOCN film, SiCN film) and the like is formed using the source gas containing Si, C, and a halogen element and having the Si—C bonds, the oxidizing gas, and the like.

By using the Si-based thin film formed by the above-described embodiments and modification examples as the SWS, device forming technologies in which leak current is low and processability is excellent may be provided. In addition, by using the Si-based thin film formed by the above-described embodiments and modification examples as an etch stopper, the device forming technologies having excellent processability may be provided. In addition, according to the above-described embodiments and partial modification examples, the Si-based thin film having an ideal stoichiometric ratio may be formed without using plasma even in a low temperature region. Since the Si-based thin film is formed without using the plasma, it is possible to apply it to processes in which plasma damage is a concern such as in a SADP film of DPT.

In the above-described embodiments, an example of forming a silicon-based thin film (SiO film, SiOC film, SiCN film, SiON film, and SiOCN film) containing Si as a semiconductor element has been described, but the present invention is not limited thereto. For example, the present invention may be applied to a case of forming a metallic thin film containing a metal element such as titanium (Ti), zirconium (Zr), hafnium (Hf), tantalum (Ta), aluminum (Al), molybdenum (Mo), or the like.

For example, the present invention is preferably applied to a case of forming metal oxide films such as a titanium oxide film (TiO film), a zirconium oxide film (ZrO film), a hafnium oxide film (HfO film), a tantalum oxide film (TaO film), an aluminum oxide film (AlO film), a molybdenum oxide film (MoO film), and the like.

In addition, the present invention is preferably applied to a case of forming metal oxycarbide films such as a titanium oxycarbide film (TiOC film), a zirconium oxycarbide film (ZrOC film), a hafnium oxycarbide film (HfOC film), a tantalum oxycarbide film (TaOC film), an aluminum oxycarbide film, a molybdenum oxycarbide film (MoOC film), and the like.

In addition, the present invention is preferably applied to a case of forming metal carbonitride films such as a titanium carbonitride film (TiCN film), a zirconium carbon nitride film (ZrCN film), a hafnium carbonitride film (HfCN film), a tantalum carbonitride film (TaCN film), an aluminum carbonitride film, a molybdenum carbonitride film (MoCN film), and the like.

In addition, the present invention is preferably applied to a case of forming metal oxynitride films such as a titanium oxynitride film (TiON film), a zirconium oxynitride film (ZrON film), a hafnium oxynitride film (HfON film), a tantalum oxynitride film (TaON film), an aluminum oxynitride film, a molybdenum oxynitride film (MoON film), and the like.

In addition, the present invention is preferably applied to a case of forming metal carbonitride oxide films such as a titanium carbonitride oxide film (TiOCN film), a zirconium carbonitride oxide film (ZrOCN film), a hafnium carbonitride oxide film (HfOCN film), a tantalum carbonitride oxide film (TaOCN film), a molybdenum carbonitride oxide film (MoOCN film), and the like.

In this case, as a source gas, instead of the source gas containing Si in the embodiment described above, a source gas containing a metal element is used to perform film formation according to the same sequence as in the embodiment described above.

For example, when a metal-based thin film containing Ti (a TiO film, TiOC film, TiCN film, TiON film, or TiOCN film) is formed, as a source gas containing Ti, a source gas which contains Ti, C, and a halogen and has Ti—C bonds or a source gas which contains Ti and a halogen may be used. As the source gas which contains Ti and a halogen, for example, a source gas which contains Ti and a chloro group such as titanium tetrachloride ($TiCl_4$) or a source gas which contains Ti and a fluoro group such as titanium tetrafluoride ($TiF_4$) may be used. As an oxidation gas, a nitriding gas, an amine-based catalyst gas, and an oxygen-free gas, the same gases as in the embodiment described above may be used. Processing conditions at this time may be the same, for example, as in the embodiment described above.

Also, for example, when a metal-based thin film containing Zr (a ZrO film, ZrOC film, ZrCN film, ZrON film, or ZrOCN film) is formed, as a source gas containing Zr, a source gas which contains Zr, C, and a halogen and has Zr—C bonds or a source gas which contains Zr and a halogen may be used. As the source gas which contains Zr and a halogen, for example, a source gas which contains Zr and a chloro group such as zirconium tetrachloride ($ZrCl_4$) or a source gas which contains Zr and a fluoro group such as zirconium tetrafluoride may be used. As an oxidation gas, a nitriding gas, an amine-based catalyst gas, and an oxygen-free gas, the same gases as in the embodiment described above may be used. Processing conditions at this time may be the same, for example, as in the embodiment described above.

Also, for example, when a metal-based thin film containing Hf (a HfO film, HfOC film, HfCN film, HfON film, or HfOCN film) is formed, as a source gas containing Hf, a source gas which contains Hf, C, and a halogen and has Hf—C bonds or a source gas which contains Hf and a halogen may be used. As the source gas which contains Hf and a halogen, for example, a source gas which contains Hf and a chloro group such as hafnium tetrachloride ($HfCl_4$) or a source gas which contains Hf and a fluoro group such as hafnium tetrafluoride ($HfF_4$) may be used. As an oxidation gas, a nitriding gas, an amine-based catalyst gas, and an oxygen-free gas, the same gases as in the embodiment described above may be used. Processing conditions at this time may be the same, for example, as in the embodiment described above.

Also, for example, when a metal-based thin film containing Ta (a TaO film, TaOC film, TaCN film, TaON film, or TaOCN film) is formed, as a source gas containing Ta, a source gas which contains Ta, C, and a halogen and has Ta—C bonds or a source gas which contains Ta and a halogen may be used. As the source gas which contains Ta and a halogen, for example, a source gas which contains Ta and a chloro group such as tantalum pentachloride ($TaCl_5$) or a source gas which contains Ta and a fluoro group such as tantalum pentafluoride ($TaF_5$) may be used. As an oxidation gas, a nitriding gas, an amine-based catalyst gas, and an oxygen-free gas, the same gases as in the embodiment described above may be used. Processing conditions at this time may be the same, for example, as in the embodiment described above.

Also, for example, when a metal-based thin film containing Al (an AlO film, AlOC film, AlCN film, AlON film, or AlOCN film) is formed, as a source gas containing Al, a source gas which contains Al, C, and a halogen and has Al—C bonds or a source gas which contains Al and a halogen may be used. As the source gas which contains Al and a halogen, for example, a source gas which contains Al and a chloro group such as aluminum trichloride ($AlCl_3$) or a source gas which contains Al and a fluoro group such as aluminum trifluoride ($AlF_3$) may be used. As an oxidation gas, a nitriding gas, an amine-based catalyst gas, and an oxygen-free gas, the same gases as in the embodiment described above may be used. Processing conditions at this time may be the same, for example, as in the embodiment described above.

Also, for example, when a metal-based thin film containing Mo (a MoO film, MoOC film, MoON film, or MoOCN film) is formed, as a source gas containing Mo, a source gas which contains Mo, C, and a halogen and has Mo—C bonds or a source gas which contains Mo and a halogen may be used. As the source gas which contains Mo and a halogen, for example, a source gas which contains Mo and a chloro group such as molybdenum pentachloride ($MoCl_5$) or a source gas which contains Mo and a fluoro group such as molybdenum pentafluoride ($MoF_5$) may be used. As an oxidation gas, a nitriding gas, an amine-based catalyst gas, and an oxygen-free gas, the same gases as in the embodiment described above may be used. Processing conditions at this time may be the same, for example, as in the embodiment described above.

That is, the present invention may be preferably applied when a thin film containing a predetermined element such as a semiconductor element or a metal element is formed. In addition, if a thin film includes water ($H_2O$) and chlorine (Cl) as the first impurities and includes a hydrocarbon compound ($C_xH_y$-based impurities) as the second impurities, the modifying process of the present invention may be broadly applied without being limited to the film formation method or the film type described above.

It is preferable that a process recipe (a program storing processing procedures or processing conditions) used for film formation of these various thin films be individually prepared (a plurality of recipes are prepared) according to content (such as a film type of a thin film to be formed, a composition ratio, a film quality, a film thickness, a source gas, an oxidation gas, a catalyst gas, and a kind of oxygen-free gas) of substrate processing. Then, when the substrate processing starts, it is preferable that an appropriate process recipe be appropriately selected from among the plurality of process recipes according to the content of substrate processing. Specifically, it is preferable that the plurality of process recipes individually prepared according to the content of substrate processing be pre-stored (installed) in the memory device 121c included in the substrate processing apparatus through electrical communication lines or a non-transitory computer-readable recording medium (the external memory device 123) recording the process recipe. Then, when the substrate processing starts, it is preferable that the CPU 121a included in the substrate processing apparatus appropriately select an appropriate process recipe according to the content of substrate processing from among the plurality of process recipes stored in the memory device 121c. In such a configuration, using a single substrate processing apparatus, it is possible to generally form thin films having various film types, composition ratios, film qualities, and film thicknesses in good reproducibility. Also, it is possible to reduce a burden of manipulation (such as a burden of inputting processing procedures or processing conditions) on an operator. Accordingly, it is possible to rapidly start the substrate processing while preventing manipulation errors.

The process recipe described above is not limited to a newly created recipe, but may be prepared by, for example, modifying an existing process recipe already installed in the substrate processing apparatus. When the process recipe is modified, the modified process recipe may be installed in the substrate processing apparatus through the electrical communication lines or the non-transitory computer-readable recording medium recording the process recipe. Also, the existing process recipe already installed in the substrate processing apparatus may be directly modified by manipulating the input/output device 122 included in the existing substrate processing apparatus.

Also, in the film formation sequence in the embodiment described above and the like, the example in which the SiOC film, the SiO film, the stacked film, and the like are formed at a room temperature has also been described. In this case, there is no need to heat the inside of the processing chamber 201 using the heater 207 and the heater 207 need not be installed in the substrate processing apparatus. Thereby, it is possible to simplify a configuration of the heating system of the substrate processing apparatus and it is possible to build a simple and less expensive substrate processing apparatus. In this case, the modifying process of the SiOC film, the SiO film, the stacked film, and the like may be performed in a processing chamber that is different from the processing chamber performing the process of forming the SiOC film, the SiO film, the stacked film, and the like, ex situ.

In the embodiment described above and the like, the example in which the modifying process (annealing process) of the SiOC film, the SiO film, the stacked film, and the like is performed by heating of the resistance heating-type heater 207 has been described. The present invention is not limited thereto. For example, the above-described modifying process may be performed by radiating plasma, ultraviolet light, microwaves, and the like. That is, the above-described modifying process may be performed using heat transmission from the heater 207 and may also be performed using an activating device using plasma, electromagnetic waves, and the like rather than heat. In this case, the same effects as in the embodiment described above and the like may also be obtained.

When the above-described modifying process is performed by radiating the plasma, for example, a capacitively coupled plasma generator, an inductively coupled plasma generator, an electron cyclotron resonator, a surface wave plasma generator, a helicon wave plasma generator, and the like may be used as the activating device instead of the heater 207. Also, these devices may be used in combination with the heater 207. Using these devices, in the buffer chamber in the processing chamber 201 or outside the processing chamber 201, plasma obtained by converting gases such as He, Ar, and $N_2$ into plasma, that is, quasi-neutral gases is composed of charged particles and neutral particles that behave collectively, is radiated onto the wafer 200 in the processing chamber 201, and thereby the above-described modifying process may be performed.

When the above-described modifying process is performed by radiating the ultraviolet light, for example, a deuterium lamp, a helium lamp, a carbon-arc lamp, a BRV light source, an excimer lamp, a mercury lamp, and the like may be used as the activating device instead of the heater 207. Also, these devices may be used in combination with the heater 207. From these light sources, for example, vacuum ultraviolet light having a wavelength of 10 nm to 200 nm is radiated onto the wafer 200 in the processing chamber 201, and thereby the above-described modifying process may be performed.

When the above-described modifying process is performed by radiating the microwaves, for example, a microwave generator generating electromagnetic waves having a wavelength of 100 μm to 1 m and a frequency of 3 THz to 300 MHz may be used as the activating device instead of the heater 207. Also, these devices may be used in combination with the heater 207. The microwaves having the wavelength described above are radiated onto the wafer 200 in the processing chamber 201, act in the SiOC film, the SiO film, the stacked film, and the like, that is, act on electronic polarization or ionic polarization in a dielectric material, and generate induction heating, thereby performing the above-described modifying process.

In this case, the processing conditions may also be the same, for example, as in the embodiment or modification example described above.

In the embodiment described above and the like, the example in which the batch-type substrate processing apparatus that processes a plurality of substrates at once is used for film formation of the thin film has been described. The present invention is not limited thereto but may be preferably applied when a single-wafer substrate processing apparatus that processes a single substrate or several substrates at one time is used to form the thin film. Also, in the embodiment described above, the example in which the substrate processing apparatus including a hot wall-type processing furnace is used to form the thin film has been described. The present invention is not limited thereto but may also be preferably applied when a substrate processing apparatus including a cold wall-type processing furnace is used to form the thin film. Processing conditions at this time may be the same, for example, as in the embodiment described above.

The embodiments and modification examples described above may be appropriately combined and used. Also, the processing conditions at this time may be the same, for example, as in the embodiment described above.

Examples

First Example

As an example of the present invention, a SiOC film was formed on a wafer using the substrate processing apparatus according to the above-described embodiment and according to the film forming sequence of FIG. 4A according to the previous embodiment, and various characteristics of the SiOC film were evaluated by performing a modification process on the SiOC film. The forming of the SiOC film and the modification process were performed in different processing chambers, i.e., ex situ. In the modification process, a first thermal treatment was not performed and only a second thermal treatment was performed. BTCSM gas was used as a source gas, $H_2O$ gas was used as an oxidizing gas, a pyridine gas was used as a catalyst gas, and $N_2$ gas was used as a heat treatment gas during the modification process. Process conditions were the same as those in the previous embodiments.

Figure 11A:
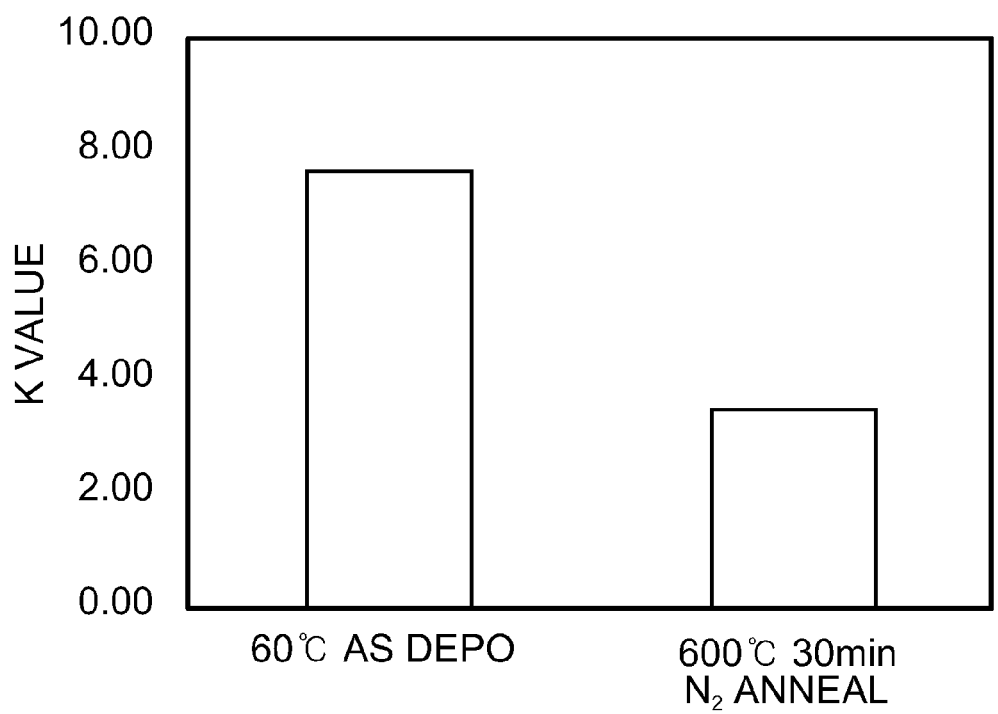
Figure 11B:
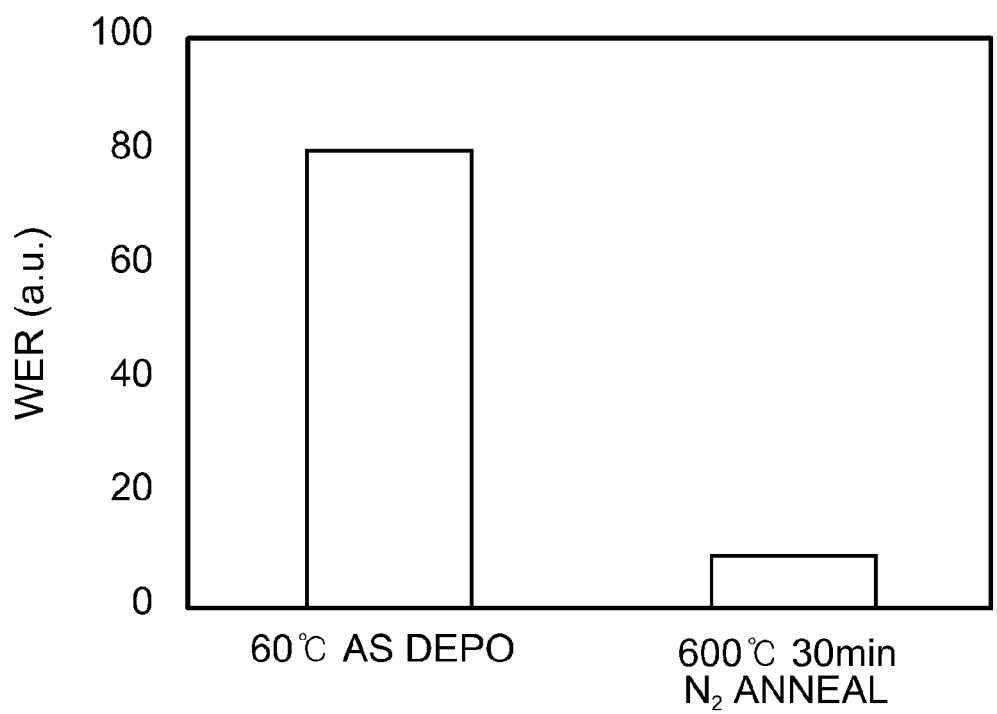
Figure 11C:
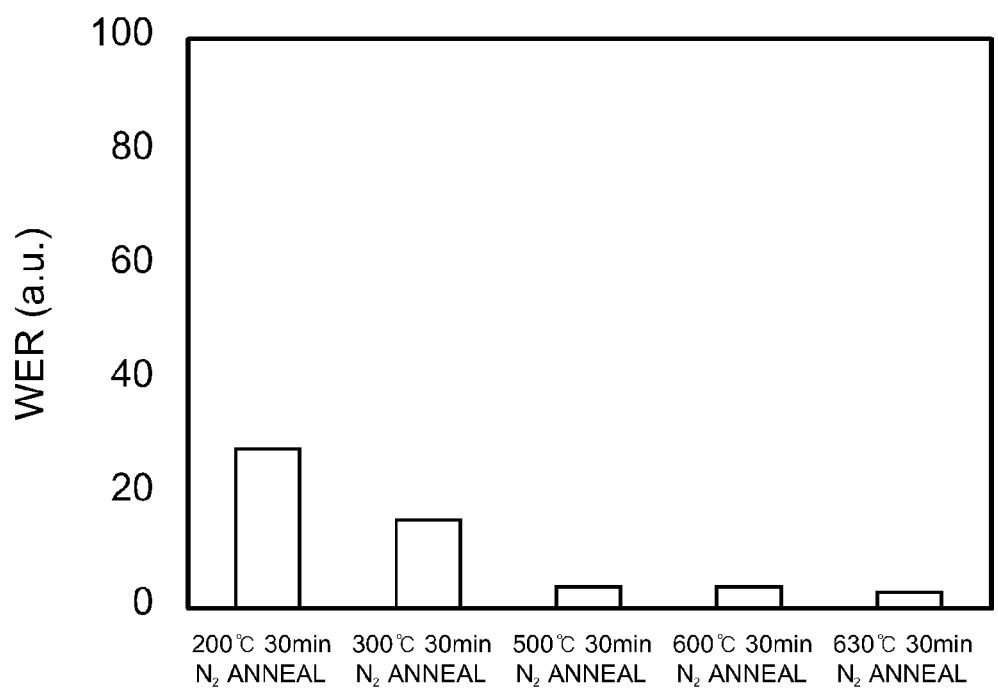

FIGS. 11A through 11C are graphs showing results of evaluating the present example. In detail, FIG. 11A is a graph illustrating relative dielectric constants of the SiOC film before and after a heat treatment was performed. FIG. 11B is a graph showing wet etching rates (WERs) of the SiOC film before and after the heat treatment was performed. FIG. 11C is a graph showing temperature dependence of heat treatment of the wet etching rate of the SiOC film.

In FIG. 11A, the vertical axis of the graph denotes processed states of the SiOC film, in which an example of a SiOC film that was formed by setting the temperature of a wafer to 60° C. and was not thermally treated (60° C. as depo) and an example of a SiOC film that was formed by setting the temperature of the wafer to 60° C. and was thermally treated under a $N_2$ gas atmosphere for thirty minutes by setting the temperature of the wafer to 600° C. (600° C., 30 min, $N_2$ annealing) are shown sequentially from the left. Also, the vertical axis of the graph denotes a variation in a relative dielectric constant (k value) of the SiOC film. The relative dielectric constant of the SiOC film is the ratio of the dielectric constant $\in$ of the SiOC film to the dielectric constant $\in_0$ of vacuum, i.e., $\in r=\in/\in_0$.

Referring to FIG. 11A, in the present example, the relative dielectric constant of the SiOC film that had yet to be thermally treated was 7.76. Also, another evaluation conducted by the inventors of the present application showed that a SiOC film formed at a relatively high temperature had a relative dielectric constant of about 4.5. The relative dielectric constant of the SiOC film that had yet to be thermally treated according to the present example was higher than that of the SiOC film that was thermally treated. Specifically, in the present example, the relative dielectric constant of the SiOC film that was thermally treated was 3.58 and was thus much lower than the relative dielectric constant of about 4.5 of the SiOC film formed at the relatively high temperature described above or the relative dielectric constant of about 3.9 of a general thermal oxide film. This is considered to be mainly due to the fact that materials that increase the dielectric constant of the SiOC film e.g., impurities such as moisture or chlorine (Cl), in the SiOC film formed under low-temperature conditions were removed from the SiOC film when the SiOC film was thermally treated, and the SiOC film was formed in a porous state.

In FIG. 11B, the horizontal axis of the graph is the same as that of FIG. 11A, in which an example of a SiOC film (60° C., as depo) and an example of a SiOC film (600° C., 30 min, $N_2$, annealing) are sequentially shown from the left. Also, the vertical axis of the graph denotes the WER (expressed in a.u.) of the SiOC film when a solution containing 1% hydrofluoric acid (1% HF aqueous solution) was used. Here, 'WER' denotes an etched depth per unit hour. The lower the WER, the higher the tolerance to HF (i.e., etching resistance).

Referring to FIG. 11B, the WER of the SiOC film that had yet to be thermally treated shows that the SiOC film has a relatively high etching resistance. In another evaluation, the inventors of the present application found that the WER of the SiOC film was lower than that of a SiO film formed under low-temperature conditions. Also, referring to FIG. 11B, the WER of the SiOC film that was thermally treated was ⅛ of the WER of the SiOC film that had yet to be thermally treated, and was lower than the WER of a general thermal oxide film. That is, the etching resistance of the SiOC film can be improved by reducing the amount of impurities in the SiOC film by thermally treating the SiOC film.

In FIG. 11C, the horizontal axis of the graph denotes temperature conditions of a thermal treatment of a SiOC film that was formed by setting the temperature of the wafer to 60° C. and then thermally treated under a $N_2$ gas atmosphere for thirty minutes, in which cases in which the SiOC film was thermally treated at 200° C., 300° C., 500° C., 600° C., and 630° C. are sequentially shown from the left. The vertical axis of the graph denotes the WER (expressed in a.u.) of the SiOC film when a 1% HF aqueous solution was used, similar to FIG. 11B.

Referring to FIG. 11C, the WER of the SiOC film when the SiOC film was thermally treated at 200° C. caused a desired effect to be achieved when a modification process was performed. Also, referring to FIG. 11C, the WER of the SiOC film when the SiOC film was thermally treated at 300° C. was about half the WER of the SiOC film when the SiOC film was thermally treated at 200° C., and a desired effect was also achieved. Also, the WER of the SiOC film was greatly lowered when the SiOC film was thermally treated at 500° C., and a more desired effect was achieved than when the SiOC film was thermally treated at a temperature higher than 500° C., e.g., 600° C. or 630° C. All of the WERs of the SiOC film when the SiOC film was thermally treated at 500° C., 600° C., and 630° C. were about ¹⁄₁₀ or less of the WER of the SiOC film when the SiOC film was thermally treated at 200° C. Accordingly, the etching resistance of the SiOC film when the SiOC film is thermally treated at at least 500° C. or more can be improved. Also, a reduction in the WER of the SiOC film was slowed at 500° C. or more but the WER of the SiOC film was greatly lowered at 630° C. The WER of the SiOC film at 630° C. was about 70% of the WER of the SiOC film at 500° C. Thus, the etching resistance of the SiOC film is expected to be greatly increased when a temperature at which the SiOC film is to be thermally treated is set to 630° C. or more. Accordingly, an effect of reducing the WER of SiOC film can be greatly increased by increasing a temperature at which the SiOC film is to be thermally treated.

Second Example

As another example of the present invention, a SiOC film was formed on a wafer using the substrate processing apparatus according to the previous embodiment and according to the film forming sequence of FIG. 4A according to the previous embodiment, and a modification process was then performed on the SiOC film. The forming of the SiOC film and the modification process were performed in different processing chambers, i.e., ex situ.

Here, in an annealing sequence of FIG. 14A, a sample (Sample 1) on which both a first thermal treatment and a second thermal treatment were performed as a modification process and a sample (Sample 2) on which the first thermal treatment was not performed and only the second thermal treatment was performed were prepared. Then various characteristics of the SiOC film in Samples 1 and 2 were evaluated.

When Samples 1 and 2 were prepared, BTCSM gas was used as a source gas, $H_2O$ gas was used as an oxidizing gas, a pyridine gas was used as a catalyst gas, and $N_2$ gas was used as a heat treatment gas during the modification process. Process conditions were the same as those in the previous embodiments. The temperature (first temperature) of the wafer was set to 450° C. when the first thermal treatment was performed on Sample 1, and the temperature (second temperature) of the wafer was set to 600° C. when the second thermal treatment was performed on Samples 1 and 2. The other process conditions were the same as those in the previous embodiments.

FIG. 13 is a table showing a result of evaluating the second example, in which various characteristics, e.g., WERs, shrinking rates (contraction percentages), k values (relative dielectric constants), etc. of the SiOC film of Sample 1 and the SiOC film of Sample 2 are compared.

Referring to FIG. 13, the WER of the SiOC film of Sample 1 is ¹⁄₁₇ of the WER of the SiOC film of Sample 2 or more. That is, the WER of the SiOC film of Sample 1 is far lower than the WER of the SiOC film of Sample 2. Also, the WER of the SiOC film of Sample 2 is relatively low and thus the SiOC film of Sample 2 has a relatively high etching resistance. That is, the WER of the SiOC film of Sample 1 is much lower than a low WER (the WER of the SiOC film of Sample 2), and thus the SiOC film of Sample 1 has a high etching resistance that is much higher than a high etching resistance (the etching resistance of the SiOC film of Sample 2). This is considered to be due to the fact that impurities such as moisture or chlorine (Cl) were removed from the SiOC film of Sample 2 when the second thermal treatment was performed thereon, and not only impurities such as moisture or chlorine (Cl) but also $C_xH_y$-based impurities were sufficiently removed from the SiOC film of Sample 1 when the first and second thermal treatments were sequentially performed thereon.

Also, referring to FIG. 13, the shrinking rate of the SiOC film of Sample 1 is about 9/10 of that of the SiOC film of Sample 2, i.e., the shrinking rate of the SiOC film of Sample 1 is lower than that of the SiOC film of Sample 2. Here, the shrinking rate means the ratio of the contraction percentage of the SiOC film that was modified to the contraction percentage of the SiOC film that had yet to be modified, i.e., a contraction rate of the SiOC film when the modification process was performed thereon. That is, the SiOC film of Sample 1 contracted less when the modification process was performed thereon than the SiOC film of Sample 2 when the modification process was performed thereon. In other words, the SiOC film of Sample 2 contracted when a modification process was performed thereon more than the SiOC film of Sample 1 when the modification process was performed thereon.

The shrinking rate of the SiOC film of Sample 1 was considered to be low because the first and second thermal treatments were sequentially performed on the SiOC film of Sample 1, i.e., a two-step thermal treatment was performed at different temperatures, and the SiOC film could be suppressed from being oxidized due to moisture or chlorine (Cl) separated from the SiOC film, thereby suppressing a reduction in the contraction rate of the SiOC film. Also, the shrinking rate of the SiOC film of Sample 2 was considered to be high because only the second thermal treatment was performed on the SiOC film of Sample 2 without performing the first thermal treatment, i.e., a one-step thermal treatment was performed at a relatively high temperature, and the SiOC film was oxidized due to moisture or chlorine (Cl) separated from the SiOC film, thereby causing the SiOC film to easily contract.

Also, referring to FIG. 13, the relative dielectric constant of 2.68 of the SiOC film of Sample 1 is lower than the relative dielectric constant of 3.58 of the SiOC film of Sample 2. Also, the relative dielectric constant of 3.58 of the SiOC film of Sample 2 is much lower than the relative dielectric constant of about 3.9 of a general thermal oxide film, but the relative dielectric constant of 2.68 of the SiOC film of Sample 1 is still much lower than the relative dielectric constant of about 3.9 of the general thermal oxide film.

The relative dielectric constant of the SiOC film of Sample 2 is considered to be much lower than that of the general thermal oxide film because materials that increase the dielectric constant of the SiOC film, e.g., impurities such as moisture or chlorine (Cl), in the SiOC film were removed from the SiOC film when the second thermal treatment was performed on the SiOC film, and the SiOC film was formed in a porous state. The relative dielectric constant of the SiOC film of Sample 1 is considered to be even lower than that of the general thermal oxide film or that of the SiOC film of Sample 2 mainly due to the fact that not only materials that increase the dielectric constant of the SiOC film, e.g., impurities such as moisture or chlorine (Cl), but also $C_xH_y$-based impurities were sufficiently removed from the SiOC film when the first and second thermal treatments, i.e., a two-step thermal treatment performed at different temperatures, were performed on the SiOC film, and the porous state of the SiOC film was intensified.

Third Embodiment

As another example of the present invention, a SiOC film was formed on a wafer using the substrate processing apparatus according to the previous embodiment and according to the film forming sequence of FIG. 4A according to the previous embodiment and a modification process was then performed on the SiOC film. The forming of the SiOC film and the modification process were performed in different processing chambers, i.e., ex situ.

Here, a sample (Sample 1) was prepared by forming a film by setting the temperature of a wafer to 60° C. and thermally treating the film under a $N_2$ gas atmosphere by setting the temperature of the wafer to 100° C. A sample (Sample 2) was prepared by forming a film by setting the temperature of the wafer to 60° C. and thermally treating the film under the $N_2$ gas atmosphere as the modification process by setting the temperature of the wafer to 200° C. A sample (Sample 3) was prepared by forming a film by setting the temperature of the wafer to 60° C. and performing a first thermal treatment and a second thermal treatment as a modification process on the film in an annealing sequence of FIG. 15. Samples (Samples 4 to 6) were each prepared by forming a film by setting the temperature of the wafer to 60° C. and performing the first and second thermal treatments as a modification process on the film in the annealing sequence of FIG. 14. Then, the WER of a SiOC film of each of the samples was evaluated.

When Samples 1 to 6 were prepared, BTCSM gas was used as a source gas, $H_2O$ gas was used as an oxidizing gas, a pyridine gas was used as a catalyst gas, and $N_2$ gas was used as a heat treatment gas when the modification process was performed on the SiOC film. Process conditions were the same as those in the previous embodiments. The temperatures (first and second temperatures) of the wafer were set to 300° C. when the first and second thermal treatments were performed on Sample 3. The temperatures (first temperature) of the wafer were set to 450° C. when the first thermal treatment was performed on Samples 4 to 6. The temperatures (second temperature) of the wafer were set to 500° C., 600° C., and 630° C. when the second thermal treatment was performed on Samples 4 to 6, respectively. Other conditions, e.g., durations for which the first temperature and the second temperature were maintained, a time required to increase or decrease a temperature, etc., are as shown in the table of FIG. 16B. The other process conditions were the same as those in the previous embodiments.

Figure 16A:
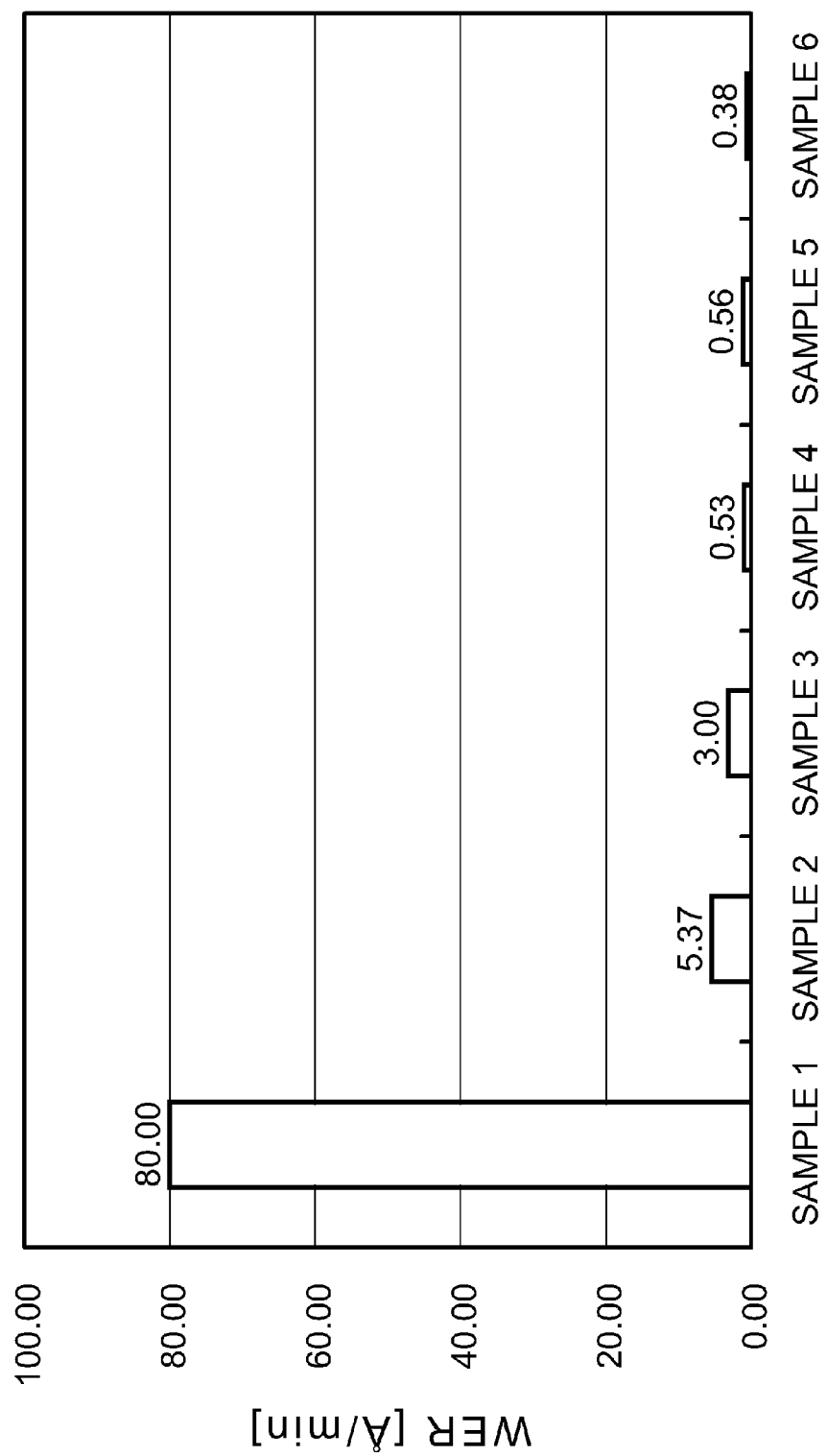

FIG. 16A is a graph showing the WERs of Samples 1 to 6. FIG. 16B is a table comparing the conditions of thermal treatments performed on Samples 1 to 6. In FIG. 16A, the horizontal axis denotes Samples 1 to 6, and the vertical axis denotes the WER (expressed in A/min) of a SiOC film when a 1% HF aqueous solution was used.

Referring to FIG. 16A, the SiOC films of Samples 2 to 6 have WERs that are much lower than that of the SiOC film of Sample 1, i.e., they have much higher etching resistances than the SiOC film of Sample 1. Particularly, in the case of Samples 3 to 6 for which first and second temperatures were set to be in the temperature range of the previous embodiment, the WERs are very low and the etching resistances are very high. Also, when Samples 4 to 6 for which a second temperature was set to be higher than a first temperature are compared with of Sample 3 for which a second temperature was substantially the same as a first temperature, the WERs of Samples 4 to 6 are lower than that of Sample 3 and the etching resistances of Samples 4 to 6 are higher than that of Sample 3. This is considered to be mainly due to the fact that the first thermal treatment and the second thermal treatment were performed within the range of the conditions in the previous embodiments to sufficiently remove not only first impurities such as moisture or chlorine (Cl) but also $C_xH_y$-based second impurities from the SiOC film.

Fourth Embodiment

As another example of the present invention, a SiOC film was formed on a wafer using the substrate processing apparatus according to the previous embodiment and according to the film forming sequence of FIG. 4A according to the previous embodiment and a modification process was then performed on the SiOC film. The forming of the SiOC film and the modification process were performed in different processing chambers, i.e., ex situ.

Here, a sample (Sample 1) was prepared by forming a SiOC film by setting the temperature of a wafer to 60° C. Samples (Samples 2 to 4) were prepared by forming a SiOC film by setting the temperature of a wafer to 60° C. and a first thermal treatment and a second thermal treatment were performed in the annealing sequence of FIG. 15. Samples (Samples 5 to 8) were prepared by forming a SiOC film by setting the temperature of a wafer to 60° C. and the first thermal treatment and the second thermal treatment were performed in the annealing sequence of FIG. 14A. Then, the relative dielectric constants of the SiOC films of Samples 1 to 8 were evaluated.

When Samples 1 to 8 were prepared, BTCSM gas was used as a source gas, $H_2O$ gas was used as an oxidizing gas, a pyridine gas was used as a catalyst gas, and $N_2$ gas was used as a heat treatment gas when the modification process was performed on the SiOC films. The temperatures (=first temperatures=second temperatures) of the wafer when the first and second thermal treatments were performed on Samples 2 to 4 were set to 300° C., 400° C., and 600° C., respectively. The temperature (first temperature) of the wafer was set to 60° C. when the first thermal treatment was performed on Sample 5, and the temperature (second temperature) of the wafer was set to 200° C. when the second thermal treatment was performed on Sample 5. The temperatures (first temperatures) of the wafer were set to 450° C. when the first thermal treatment was performed on Samples 6 to 8, and the temperatures (second temperatures) of the wafer were set to 500° C., 630° C., and 700° C., respectively, when the second thermal treatment was performed on Samples 6 to 8. The other process conditions were the same as those in the previous embodiments.

Also, as a reference example, a SiO film was formed on a wafer according to a film forming sequence of alternately performing, a predetermined number of times, supplying a source gas and a catalyst gas and supplying an oxidizing gas and a catalyst gas, and then a modification process was performed on the SiO film. The forming of the SiO film and the modification process were performed in different processing chambers, i.e., ex situ.

Here, a sample (Sample 9) was prepared by forming a SiO film by setting the temperature of the wafer to 60° C., and a sample (Sample 10) was prepared by forming a SiO film by setting the temperature of the wafer to 60° C. and performing only the second thermal treatment as the modification process on the SiO film without performing the first thermal treatment. Then, the relative dielectric constants of the SiO films of Samples 9 and 10 were evaluated.

When Samples 9 and 10 were prepared, HCDS gas was used as a source gas, $H_2O$ gas was used as an oxidizing gas, a pyridine gas was used as a catalyst gas, and $N_2$ gas was used as a heat treatment gas when the modification process is performed. The temperature (second temperature) of the wafer was set to 600° C. when the second thermal treatment was performed on Sample 10. The other conditions were the same as those in the previous embodiments.

Figure 17:
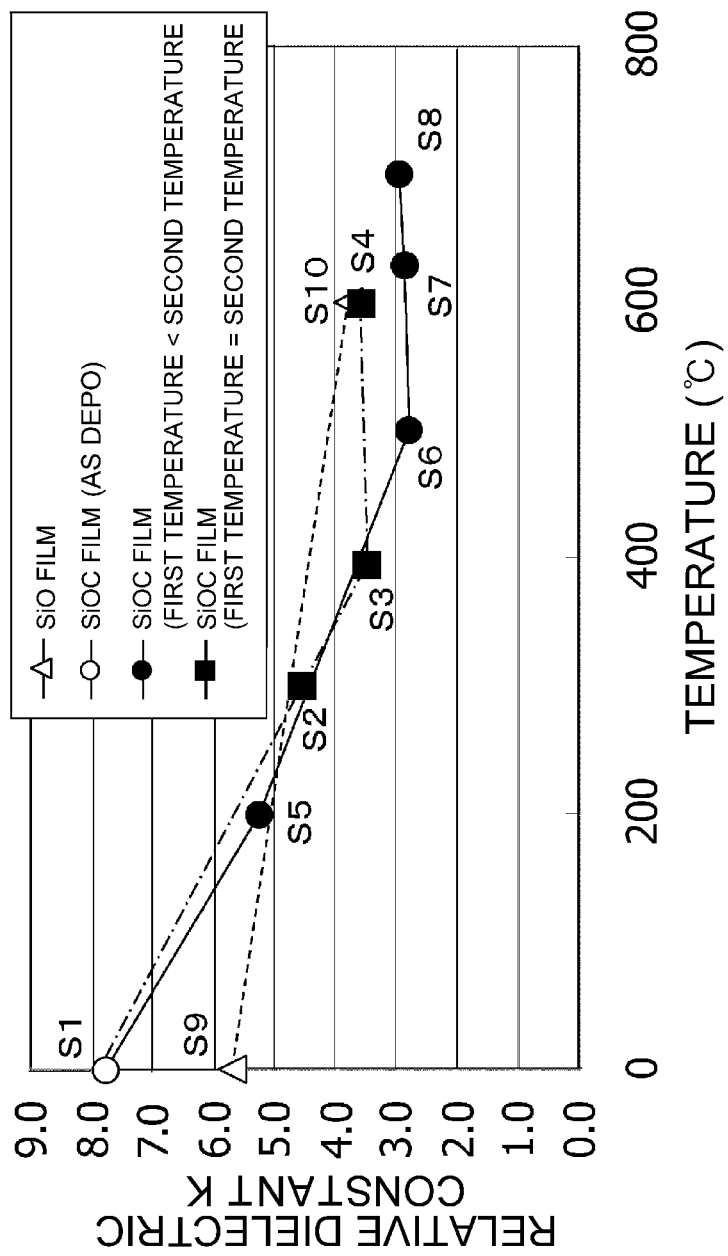
FIG. 17 is a diagram illustrating an evaluation result according to an embodiment of the present invention and a graph illustrating a relative dielectric constant of a SiOC film of Samples 1 to 8 and of a SiOC film of Samples 9 and 10.

FIG. 17 is a graph showing the relative dielectric constants (k values) of Samples 1 to 10. In the graph of FIG. 17, the horizontal axis denotes the temperature (expressed in ° C.) of a wafer when the second thermal treatment was performed and the vertical axis denotes the relative dielectric constants of Samples 1 to 10. In FIG. 17, for convenience of explanation, Samples 1 to 10 are illustrated as S1 to S10, respectively.

Referring to FIG. 17, the relative dielectric constants of the SiOC films of Samples 2 to 8 are lower than that of the SiOC film of Sample 1 or that of the SiO film of Sample 9. In particular, the relative dielectric constants of Samples 3, 4, and 6 to 8 for which first and second temperatures were set to be in the ranges of the temperatures in the previous embodiments are still much lower. Also, the relative dielectric constants of the SiOC films of Samples 3 4 and 6 to 8 are lower than that of the SiO film of Sample 10. Also, the relative dielectric constants of the SiOC films of Samples 6 to 8 are lower than '3.' This is considered to be mainly due to the fact that the first thermal treatment and the second thermal treatment were performed within the range of the conditions in the previous embodiments to sufficiently remove not only impurities such as moisture or chlorine (Cl) but also $C_xH_y$-based impurities, which are materials that increase the dielectric constant of the SiOC film, from the SiOC film formed under low-temperature conditions and that the SiOC film was formed in a porous state.

According to the one or more embodiments of the invention set forth here, a thin film of a low dielectric constant having excellent etching resistance can be formed.

Preferred Embodiments of the Present Invention

The following supplementary notes are added herein as exemplary embodiments of the present invention.

Supplementary Note 1

According to one aspect of the present invention, there are provided a method of manufacturing a semiconductor device, including: (a) forming a thin film on a substrate; (b) removing first impurities containing water ($H_2O$) and chlorine (Cl) from the thin film by heating the thin film at a first temperature higher than a temperature of the substrate in the step (a); and (c) removing second impurities ($C_xH_y$-based impurities) containing a hydrocarbon compound from the thin film by heating the thin film at a second temperature equal to or higher than the first temperature after performing the step (b).

Supplementary Note 2

In the method described in supplementary note 1, it is preferable that the step (b) includes at least a part of a period of raising the temperature of the substrate to the first temperature.

Supplementary Note 3

In the method described in supplementary note 1 or 2, it is preferable that the step (b) includes a period of maintaining the temperature of the substrate at the first temperature.

Supplementary Note 4

In the method described in any one of supplementary notes 1 to 3, it is preferable that the second temperature is higher than the first temperature. In addition, the step (c) preferably includes at least a part of a period of raising the temperature of the substrate to the second temperature.

Supplementary Note 5

In the method described in any one of supplementary notes 1 to 4, it is preferable that the step (c) includes a period of maintaining the temperature of the substrate at the second temperature.

Supplementary Note 6

In the method described in any one of supplementary notes 1 to 5, it is preferable that the step (c) includes at least a part of a period of lowering the temperature of the substrate from the second temperature.

Supplementary Note 7

In the method described in any one of supplementary notes 1 to 3, it is preferable that the second temperature is substantially equal to (is equal to) the first temperature. In addition, the step (c) preferably includes a period of maintaining the temperature of the substrate at the first temperature.

Supplementary Note 8

In the method described in any one of supplementary notes 1 to 7, it is preferable that the first impurities are removed from the thin film at the first temperature without oxidizing the thin film. In addition, it is preferable that the first impurities are removed from the thin film at the first temperature without reacting with impurities different from the first impurities and contained in the thin film. Further, it is preferable that the first impurities are removed from the thin film at the first temperature without reacting with the second impurities contained in the thin film.

Supplementary Note 9

In the method described in any one of supplementary notes 1 to 8, the first temperature ranges preferably from 300° C. to 450° C., more preferably from 300° C. to 400° C., and still more preferably from 300° C. to 350° C.

Supplementary Note 10

In the method described in any one of supplementary notes 1 to 9, the second temperature ranges preferably from 300° C. to 900° C., more preferably from 350° C. to 700° C., more preferably 400° C. to 700° C., and still more preferably from 450° C. to 600° C.

Supplementary Note 11

In the method described in any one of supplementary notes 1 to 10, it is preferable that the thin film contains a predetermined element, oxygen and carbon.

Supplementary Note 12

In the method described in supplementary note 11, it is preferable that the step (a) includes performing a cycle a predetermined number of times, the cycle including: (a-1) supplying a source gas containing the predetermined element, carbon and halogen element and having a chemical bond between the predetermined element and the carbon to the substrate, (a-2) supplying an oxidizing gas to the substrate, and (a-3) supplying a catalyst gas to the substrate.

Supplementary Note 13

In the method described in supplementary note 12, the temperature of the substrate in the step (a) ranges preferably from a room temperature to 150° C., more preferably from a room temperature to 100° C., and still more preferably from 50° C. to 100° C.

Supplementary Note 14

In the method described in supplementary note 12 or 13, it is preferable that the predetermined element includes silicon (Si), and the source gas includes at least one selected from a group consisting of a Si—C bond, a Si—C—Si bond and a Si—C—C—Si bond.

Supplementary Note 15

In the method described in any one of supplementary notes 1 to 14, it is preferable that each of the steps (b) and (c) is performed in an oxygen-free atmosphere by supplying an oxygen-free gas to the substrate. In addition, it is preferable that the thin film is heated in an inert gas atmosphere by supplying an inert gas to the substrate in the steps (a) and (b).

Supplementary Note 16

In the method described in any one of supplementary notes 1 to 15, it is preferable that the step (a) and the film-heating steps (i.e., the steps (b) and (c)) are performed in a same processing chamber or in different processing chambers.

Supplementary Note 17

According to another aspect of the present invention, there is provided a substrate processing apparatus including: a processing chamber configured to accommodate a substrate; a processing gas supply system configured to supply a processing gas into the processing chamber to form a thin film on the substrate; a heater configured to heat the substrate in the processing chamber; and a control unit configured to control the processing gas supply system and the heater to perform (a) forming the thin film on the substrate by supplying the processing gas to the substrate in the processing chamber, (b) removing first impurities containing water ($H_2O$) and chlorine (Cl) from the thin film by heating the thin film at a first temperature higher than a temperature of the substrate in the step (a), and (c) removing second impurities ($C_xH_y$-based impurities) containing a hydrocarbon compound from the thin film by heating the thin film at a second temperature equal to or higher than the first temperature after performing the step (b).

Supplementary Note 18

According to still another aspect of the present invention, there is provided a substrate processing system including: a first substrate processing unit configured to form a thin film on a substrate; and a second substrate processing unit configured to perform heat treatment on the thin film, wherein the first substrate processing unit includes: a first processing chamber configured to accommodate a substrate; a processing gas supply system configured to supply a processing gas into the first processing chamber; and a first control unit configured to control the processing gas supply system to form the thin film on the substrate by supplying the processing gas to the substrate in the first processing chamber; and wherein the second substrate processing unit includes: a second processing chamber configured to accommodate the substrate; a heater configured to heat the substrate in the second processing chamber; and a second control unit configured to control the heater to perform (a) removing first impurities containing water ($H_2O$) and chlorine (Cl) from the thin film by heating the thin film at a first temperature higher than a temperature of the substrate in a process of forming the thin film in a state in which the second processing chamber accommodates the substrate on which the thin film is formed, and (b) removing second impurities ($C_xH_y$-based impurities) containing a hydrocarbon compound from the thin film by heating the thin film at a second temperature equal to or higher than the first temperature after performing the step (a).

Supplementary Note 19

According to yet another aspect of the present invention, there is provided a non-transitory computer-readable recording medium storing a program that causes a computer to execute: (a) forming a thin film on a substrate in a processing chamber; (b) removing first impurities containing water ($H_2O$) and chlorine (Cl) from the thin film by heating the thin film at a first temperature higher than a temperature of the substrate in the sequence (a); and (c) removing second impurities ($C_xH_y$-based impurities) containing a hydrocarbon compound from the thin film by heating the thin film at a second temperature equal to or higher than the first temperature after performing the sequence (b).

What is claimed is:

1. A method of manufacturing a semiconductor device, comprising:
   (a) forming a thin film on a substrate;
   (b) removing first impurities containing $H_2O$ and Cl from the thin film by heating the thin film at a first temperature higher than a temperature of the substrate in (a); and
   (c) removing second impurities containing a hydrocarbon compound from the thin film by heating the thin film at a second temperature equal to or higher than the first temperature after performing (b).

2. The method of claim 1, wherein (b) includes at least a part of a period of raising the temperature of the substrate to the first temperature.

3. The method of claim 1, wherein (b) includes a period of maintaining the temperature of the substrate at the first temperature.

4. The method of claim 1, wherein the second temperature is higher than the first temperature.

5. The method of claim 1, wherein (c) includes at least a part of a period of raising the temperature of the substrate to the second temperature.

6. The method of claim 1, wherein (c) includes a period of maintaining the temperature of the substrate at the second temperature.

7. The method of claim 1, wherein (c) includes at least a part of a period of lowering the temperature of the substrate from the second temperature.

8. The method of claim 1, wherein the second temperature is substantially equal to the first temperature.

9. The method of claim 1, wherein (c) includes a period of maintaining the temperature of the substrate at the first temperature.

10. The method of claim 1, wherein the first impurities are removed from the thin film at the first temperature without oxidizing the thin film.

11. The method of claim 1, wherein the first impurities are removed from the thin film at the first temperature without reacting with impurities different from the first impurities and contained in the thin film.

12. The method of claim 1, wherein the first impurities are removed from the thin film at the first temperature without reacting with the second impurities contained in the thin film.

13. The method of claim 1, wherein the first temperature ranges from 300° C. to 450° C.

14. The method of claim 1, wherein the second temperature ranges from 300° C. to 900° C.

15. The method of claim 1, wherein the thin film contains a predetermined element, oxygen and carbon.

16. The method of claim 15, wherein (a) includes performing a cycle a predetermined number of times, the cycle including:
   supplying a source gas containing the predetermined element, carbon and halogen element and having a chemical bond between the predetermined element and the carbon to the substrate;
   supplying an oxidizing gas to the substrate; and
   supplying a catalyst gas to the substrate.

17. The method of claim 1, wherein each of (b) and (c) is performed in an oxygen-free atmosphere by supplying an oxygen-free gas to the substrate.

18. A non-transitory computer-readable recording medium storing a program that causes a computer to execute:
   (a) forming a thin film on a substrate in a processing chamber;
   (b) removing first impurities containing $H_2O$ and Cl from the thin film by heating the thin film at a first temperature higher than a temperature of the substrate in the sequence (a); and
   (c) removing second impurities containing a hydrocarbon compound from the thin film by heating the thin film at a second temperature equal to or higher than the first temperature after performing the sequence (b).

* * * * *